(12) United States Patent
Tanizaki et al.

(10) Patent No.: US 6,384,674 B2
(45) Date of Patent: *May 7, 2002

(54) SEMICONDUCTOR DEVICE HAVING HIERARCHICAL POWER SUPPLY LINE STRUCTURE IMPROVED IN OPERATING SPEED

(75) Inventors: Hiroaki Tanizaki; Tsukasa Ooishi; Shigeki Tomishima; Masatoshi Ishikawa; Hideto Hidaka; Takaharu Tsuji, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/353,349

(22) Filed: Jul. 15, 1999

(30) Foreign Application Priority Data

Jan. 4, 1999 (JP) ............................................. 11-000225

(51) Int. Cl.[7] .............................. G05F 1/10; G05F 3/02
(52) U.S. Cl. ......................... 327/544; 327/546; 365/226
(58) Field of Search ........................... 365/226; 327/544, 327/530, 538, 540, 541, 543, 545, 546, 215, 217

(56) References Cited

U.S. PATENT DOCUMENTS

| | | | | |
|---|---|---|---|---|
| 5,781,062 A | * | 7/1998 | Mashiko et al. | ............. 327/544 |
| 6,049,245 A | * | 4/2000 | Son et al. | .................... 327/374 |
| 6,091,656 A | * | 7/2000 | Ooishi | ........................ 365/226 |

OTHER PUBLICATIONS

"Ultra LSI Memory", K. Ito, Advanced Electronics Series, I–9, Baifukan, Nov. 5, 1994, pp. 356–371.

* cited by examiner

*Primary Examiner*—Toan Tran
*Assistant Examiner*—Quan Tra
(74) *Attorney, Agent, or Firm*—McDermott, Will & Emery

(57) ABSTRACT

Provided is a power supply-to-power supply capacitance cell including a first capacitor connected between a sub power supply line and a sub ground line, a second capacitor connected between a main power supply line and the sub ground line, and a third capacitor connected between the sub power supply line and a main ground line. Thus, a voltage drop of the sub power supply line can be reduced in current consumption of an internal circuit, so that an operation of the internal circuit is stabilized and the operating speed thereof is improved.

18 Claims, 40 Drawing Sheets

|  | ACTIVATION TIME (Ta) | DELAY TIME (Td) |
|---|---|---|
| SleepTr. INCREASED | REDUCED | REDUCED |
| CAPACITANCE CELL INCREASED | INCREASED | REDUCED |

| CONNECTION STATE | SHAPE OF MASK PATTERN |
|---|---|
|  |  |
|  |  |

FIG.19

| CONNECTION STATE | STATE OF FUSE |
|---|---|
| A—○ ╲ ○—Y  B—○ ╱ | HIGH RESISTANCE  A—/\/\/\—R1—Y  B——⊗——  H1  FUSE |
| A—○ ╲ ○—Y  B—○ | HIGH RESISTANCE  A—/\/\/\—R1—Y  B——✴——H1  FUSE (CUT WITH LASER BEAM) |

TRANSISTOR FOR
HIGH Vt

TRANSISTOR FOR
LOW Vt

SEMICONDUCTOR DEVICE HAVING HIERARCHICAL POWER SUPPLY LINE STRUCTURE IMPROVED IN OPERATING SPEED

BACKGROUND OF THE INVENTION

1. Field of the Invention

The present invention relates to a semiconductor device, and more specifically, it relates to a semiconductor device having a hierarchical power supply line structure.

2. Description of the Prior Art

The withstand voltage of a transistor is reduced as the transistor is refined, and hence the operating voltage must inevitably be lowered. For battery driving which is prerequisite for a portable device, an operation under a low voltage and low power is essential.

When the operating voltage is lowered, however, the operating speed is reduced in general. In order to implement a low-voltage operation without reducing the operating speed, therefore, the threshold voltage of a MOS transistor must be lowered. If the threshold voltage is excessively lowered, however, the transistor cannot be sufficiently cut off but an unnegligible subthreshold current flows also when the transistor is in an OFF state. Thus, low power consumption, which is the maximum feature of a conventional CMOS circuit, is lost.

FIG. 44 is a circuit diagram showing the structure of an invertor 1500 in a conventional semiconductor device.

Referring to FIG. 44, the invertor 1500 includes a P-channel MOS transistor 1501 having a gate receiving an input signal IN and a source coupled to a power supply potential Vdd, and an N-channel MOS transistor 1502 having a gate receiving the input signal IN, a source coupled to a ground potential Vss and a drain connected to that of the P-channel MOS transistor 1501.

The drain of the N-channel MOS transistor 1502 outputs an output signal OUT. Assuming that Vt represents the threshold voltage of the N-channel MOS transistor 1502, the operating speed of the transistor 1502 is substantially in inverse proportion to Vdd−Vt. In order to suppress reduction of the operating speed, therefore, the threshold voltage Vt must be reduced in response to reduction of the power supply potential Vdd.

If the threshold value Vt is excessively lowered, however, an unnegligible subthreshold current IL flows in the N-channel MOS transistor 1502 also when a potential 0 V is supplied as the input signal IN.

FIG. 45 illustrates the relation between a gate-to-source voltage VGS and a drain current IDS of the N-channel MOS transistor 1502.

This figure shows change of the drain current IDS following change of the gate-to-source voltage VGS around the threshold voltage Vt. The drain current IDS is logarithmically plotted on the vertical line.

Referring to FIG. 45, it is assumed that the gate-to-source voltage VGS reaches the threshold voltage Vt when a constant current 10 flows in the transistor 1502 in a line 1504. Consider the case of employing an N-channel MOS transistor having a lower threshold voltage Vt2 in place of the threshold voltage Vt, to be usable under a low power supply voltage.

A line 1506 shows the relation between the drain current IDS and the gate-to-source voltage VGS of this N-channel MOS transistor. Comparing the values of the drain currents IDS on the lines 1504 and 1506 when the gate-to-source voltages VGS are zero, the value of the drain current IDS rises from IL to IL2. Therefore, the subthreshold current cannot be neglected following high integration and reduction of the power supply voltage, and increase of a standby current causes a critical problem in a portable device driven by a battery.

FIG. 46 is a circuit diagram showing an invertor 1510 reducing a subthreshold current by switching a source voltage proposed in general.

Referring to FIG. 46, the invertor 1510 includes an invertor 1511 having a power supply node coupled with a power supply potential Vdd and a ground node connected to a node N100 for receiving an input signal IN and outputting an output signal OUT, and an N-channel MOS transistor 1516 having a gate receiving a control signal SCRC, a drain connected to the node N100 and a source coupled to a ground potential Vss.

The invertor 1511 includes a P-channel MOS transistor 1512 having a gate receiving the input signal IN, a source connected to the power supply node and a drain connected to an output node, and an N-channel MOS transistor 1514 having a gate receiving the input signal IN, a source connected to the node N100 and a drain connected to the output node.

FIGS. 47A and 47B are diagrams for illustrating types of transistors. FIG. 47A is a diagram for illustrating the symbol of a transistor 1518 having a high threshold voltage, and FIG. 47B is a diagram for illustrating the symbol of a transistor 1520 having a low threshold voltage.

Referring to FIGS. 47A and 47B, it is assumed that the symbol of the transistor 1518 shown in FIG. 47A stands for a transistor having a high threshold voltage, and the symbol of the transistor 1520 shown in FIG. 47B stands for a transistor having a low threshold voltage.

Referring again to FIG. 46, this circuit renders the N-channel MOS transistor 1516 conductive, sets the potential VN of the node N100 at the ground potential Vss and lets the invertor 1511 perform an ordinary logic operation with the control signal SCRC in ordinary operation.

When the potential supplied by the input signal IN is at a low level, the P-channel MOS transistor 1512 is rendered conductive while the N-channel MOS transistor 1514 is rendered non-conductive, and the output potential of the output signal OUT goes high. In this case, a subthreshold current flows in the non-conductive N-channel MOS transistor 1514 and a current resulting from the subthreshold current flows from the power supply node supplied with the power supply potential Vdd to the ground node supplied with the ground potential Vss.

When the input level of the input signal IN is high, on the other hand, the P-channel MOS transistor 1512 is rendered non-conductive while the N-channel MOS transistor 1514 is rendered conductive, and the level of the output signal OUT goes low. In this case, a subthreshold current flows in the non-conductive P-channel MOS transistor 1512, to flow from the power supply node to the ground node. Thus, power is unavoidably consumed by the subthreshold current in an ordinary operating state.

When employing this circuit during a period when it is recognized that input logic is previously fixed, e.g., during a standby period when the chip is in a standby state, power consumption by the subthreshold current can be reduced.

Assuming that the input signal IN for this circuit goes low in the standby state, the P-channel MOS transistor 1512 is rendered conductive while the N-channel MOS transistor 1514 is rendered non-conductive. At this time, the output signal OUT is at a high level.

When switching the control signal SCRC from a high level to a low level for switching control from an operating state to the standby state, the N-channel MOS transistor 1516 is rendered non-conductive. The absolute value of the threshold voltage of the N-channel MOS transistor 1516 is greater than that of the N-channel MOS transistor 1514, and hence a subthreshold current flowing through the N-channel MOS transistor 1516 is remarkably smaller than that flowing in the N-channel MOS transistor 1514.

Thus, a leakage current flowing from the power supply node to the ground node depends on the subthreshold current of the N-channel MOS transistor 1516, and hence power consumption by the subthreshold current can be reduced in the standby state.

Despite the high threshold voltage of the N-channel MOS transistor 1516, the operating speed of the invertor 1511 is not influenced when the N-channel MOS transistor 1516 is in a conductive state. Further, the speed for switching from the operating state to the standby state may not be so high as the operating speed of the invertor 1511, and hence no problem arises even if the N-channel MOS transistor 1516 has a high threshold voltage and a slightly low operating speed.

When the input signal IN is at a low level, as hereinabove described, the circuit can be set in the standby state through the control signal SCRC while statistically holding the output potential of the output signal OUT.

FIG. 48 is a waveform diagram for illustrating change of the sub ground potential VN of the node N100 around switching of the control signal SCRC.

Referring to FIGS. 46 and 48, the N-channel MOS transistor 1516 is rendered non-conductive when the level of the control signal SCRC changes from the power supply potential Vss to 0 V. Then, the subthreshold current flows in the N-channel MOS transistor 1516, and a current of the same magnitude also flows in the N-channel MOS transistor 1514.

Slightly after switching the control signal SCRC, therefore, the potential of the node N100 reaches 0 V+Vvn slightly above 0 V.

FIG. 49 is a graph for illustrating the relation between a drain current IDS flowing in the N-channel MOS transistor 1514 in the standby state and a gate-to-source voltage VGS.

Referring to FIGS. 46 and 49, the potential VN of the node N100 reaches Vvn in the standby state, and the level of the input signal IN is 0 V at this time. In the N-channel MOS transistor 1514, therefore, the gate-to-source voltage VGS reaches a negative level −Vvn. It is understood from the graph shown in FIG. 49 that the subthreshold current flowing in the N-channel MOS transistor 1514 is reduced from IL to IL1 due to the provision of the N-channel MOS transistor 1516. This current IL1 is also the subthreshold current of the N-channel MOS transistor 1516.

If the input signal IN goes high in the standby state, a similar effect can be attained by inserting a P-channel MOS transistor having a high threshold voltage on the power supply node side of the invertor 1511.

FIG. 50 is a circuit diagram for illustrating the structure of a circuit 1530 employing serially connected invertors of FIG. 46 and the state of each node in a standby state.

Referring to FIG. 50, the circuit 1530 includes an invertor 1536 receiving an input signal IN, inverting the same and outputting the inverted signal to a node N106, an invertor 1538 receiving the potential of the node N106, inverting the same and outputting the inverted potential to a node N108, an invertor 1540 receiving the potential of the node N108, inverting the same and outputting the inverted potential to a node N110, and an invertor 1542 receiving the potential of the node N10, inverting the same and outputting an output signal OUT.

The circuit 1530 further includes a P-channel MOS transistor 1532 having a gate receiving a control signal /SCRC, a source coupled to a power supply potential Vdd and a drain connected to a node N102 (sub power supply line), and an N-channel MOS transistor 1534 having a gate receiving a control signal SCRC, a source coupled to a ground potential Vss and a drain connected to a node N104 (sub ground line).

Power supply nodes of the invertors 1536 and 1540 are coupled to the power supply potential Vdd. Power supply nodes of the invertors 1538 and 1542 are connected to the node N102. Ground nodes of the invertors 1536 and 1540 are connected to the node N104. Ground nodes of the invertors 1538 and 1542 are coupled to the ground potential Vss.

The P-channel MOS transistor 1532 has a threshold voltage whose absolute value is greater than the threshold voltages of P-channel MOS transistors included in the invertors 1536 to 1542. The N-channel MOS transistor 1534 has a threshold voltage whose absolute value is greater than the threshold voltages of N-channel MOS transistors included in the invertors 1536 to 1542.

The invertors 1536 to 1542 are similar in structure to the invertor 1511 shown in FIG. 46, and hence redundant description is omitted.

A standby state of the circuit 1530 is now described.

In the standby state, the control signal /SCRC is set high and the node N102 is cut off from the power supply nodes. The control signal SCRC is set low and the node N104 is cut off from the ground nodes. In the standby state, the input signal IN is at a low level, the nodes N106 and N110 go high, and the node N108 and the output signal OUT go low. The potential VN of the node N104 is slightly higher than the ground potential Vss, and subthreshold currents of the N-channel MOS transistors included in the invertors 1536 and 1540 are reduced. The potential VP of the node N102 is slightly lower than the power supply potential Vdd, and subthreshold currents of the P-channel MOS transistors included in the invertors 1538 and 1542 are reduced.

FIG. 51 is a circuit diagram for illustrating the state of each node in an ordinary operating state of the circuit 1530.

In the ordinary operating state, a low level is supplied as the control signal /SCRC, and the potential VP of the node N102 reaches the power supply potential Vdd. Further, a high level is supplied as the control signal SCRC, and the potential VN of the node N104 reaches the ground potential Vss. In this state, the input signal IN is properly switched to a high or low level, to perform a logic operation.

FIG. 51 shows the state of each node when a high level is supplied as the input signal IN. When the input signal IN is high, the nodes N106 and N110 go low while the node N108 and the output signal OUT go high.

When a low level is supplied as the input signal IN, the nodes N106, N110 and N108 and the output signal OUT are in states similar to those shown in FIG. 50, and hence redundant description is omitted.

When employing a hierarchical power supply line structure for reducing subthreshold currents as described above, a P-channel MOS transistor QHP and an N-channel MOS transistor QHN for controlling a sub power supply potential VP and a sub ground potential VN must be controlled. These transistors QHP and QNP must be adjusted in size in response to current consumption of a circuit connected to a sub power supply line.

If the transistor size is smaller than that corresponding to the consumed current in this case, a potential drop is caused on the sub power supply line due to current consumption of the circuit, to increase noise of the sub power supply line and exert a bad influence on the circuit operating speed.

When employing the hierarchical power supply structure, the size of the transistor for driving the sub power supply line must be adjusted to an optimum state, while this adjustment is hard to attain.

FIG. 52 is a waveform diagram for illustrating the potential VP of the sub power supply line and the potential VN of the sub ground line when the circuit 1530 described with reference to FIGS. 50 and 51 repeats a standby state and an operating state.

Referring to FIGS. 51 and 52, the power supply potential Vdd rises before a time t1. At the time t1, the control signals SCRC and ISCRC are set to inactivate the sub power supply line and the sub ground line. In other words, the circuit 1530 is set in the standby state.

The potential difference ΔVd0 between the power supply potential Vdd and the potential VP of the sub power supply line depends on the threshold voltage Vtph and the gate width of the P-channel MOS transistor 1532. The potential difference ΔVg0 between the ground potential Vss and the potential VN of the sub ground line depends on the threshold voltage Vtnh and the gate width of the N-channel MOS transistor 1534. Considering the worst state, ΔVd0=Vtph and ΔVg0=Vtnh when taking the maximum values.

At a time t2, the control signals SCRC and /SCRC change to activate the sub power supply line and the sub ground line, and the circuit enters an active state. At this time, fluctuation of the potential levels is approximately 1 V in total.

When the potentials VP and VN of the sub power supply line and the sub ground line remarkably fluctuate, considerable time is required for activating the circuit. Therefore, it is important when to switch the control signals SCRC and /SCRC for the timing of the circuit operation. The operating speed of the circuit is reduced if the switching timing for the control signals SCRC and /SCRC is late, while the sub-threshold currents are increased to increase power consumption if the switching timing is too early. Thus, it is hard to decide the timing.

Further, the remarkable potential difference around starting itself causes increase of the starting time for activating the sub power supply line and the sub ground line. If the potential difference is excessively small, however, the sub-threshold currents cannot be suppressed. It is difficult to set the potential difference at an optimum value due to fluctuation of the threshold voltages etc. resulting from dispersion of process parameters in fabrication.

SUMMARY OF THE INVENTION

An object of the present invention is to provide a semiconductor device having a hierarchical power supply structure, which can reduce noise caused on a sub power supply line and a sub ground line for increasing the speed of a circuit operation.

Another object of the present invention is to provide a semiconductor device, which can adjust a timing for activating a sub power supply line and a sub ground line with respect to an operation timing of an internal circuit.

Still another object of the present invention is to provide a semiconductor device, which can check and adjust optimum potentials of a sub power supply line and a sub ground line in a standby state.

Briefly stated, the present invention is directed to a semiconductor device comprising a first main power supply line, a second main power supply line, a first sub power supply line, a second sub power supply line, a first internal circuit, a first connection circuit, a second connection circuit, and a power supply noise reduction circuit.

The first main power supply line is supplied with a first power supply potential. The second main power supply line is supplied with a second power supply potential lower than the first power supply potential. The first sub power supply line is provided in correspondence to the first main power supply line. The second sub power supply line is provided in correspondence to the second main power supply line. The first internal circuit has first and second power supply nodes connected to the first and second sub power supply lines respectively, receives at least one input signal and performs a prescribed operation. The first connection circuit connects the first main power supply line with the first sub power supply line in an operating mode, and separates the first main power supply line from the first sub power supply line in a standby mode. The second connection circuit connects the second main power supply line with the second sub power supply line in the operating mode, and separates the second main power supply line from the second sub power supply line in the standby mode. The power supply noise reduction circuit is connected to the first and second main power supply lines and the first and second sub power supply lines. The power supply noise reduction circuit includes a first capacitor connected between the first main power supply line and the second sub power supply line, a second capacitor connected between the first sub power supply line and the second main power supply line, and a third capacitor connected between the first sub power supply line and the second sub power supply line.

According to another aspect of the present invention, a semiconductor device comprises a first main power supply line, a second main power supply line, a first sub power supply line, a second sub power supply line, a first internal circuit, a first connection circuit and a control circuit.

The first main power supply line is supplied with a first power supply potential. The second main power supply line is supplied with a second power supply potential lower than the first power supply potential. The first sub power supply line is provided in correspondence to the first main power supply line. The second sub power supply line is provided in correspondence to the second main power supply line. The first internal circuit is connected to the first sub power supply line and the second sub power supply line, and performs a prescribed operation in response to at least one input signal. The first connection circuit connects the first main power supply line with the first sub power supply line in response to a first activation signal. The control circuit generates the first activation signal.

The control circuit includes a timing change circuit changing the activation timing for the first activation signal with reference to an input timing of an input signal in a test mode.

According to still another aspect of the present invention, a semiconductor device comprises a first main power supply line, a second main power supply line, a first sub power supply line, a second sub power supply line, a first internal circuit, a first control circuit and a second control circuit.

The first main power supply line is supplied with a first power supply potential. The second main power supply line is supplied with a second power supply potential lower than the first power supply potential. The first sub power supply line is provided in correspondence to the first main power supply line. The second sub power supply line is provided in correspondence to the second main power supply line. The first internal circuit has first and second power supply nodes connected to the first and second sub power supply lines respectively, receives at least one input signal and performs a prescribed operation. The first control circuit connects the first main power supply line with the first sub power supply line in an operating mode, and holds the potential difference between the first main power supply line and the first sub power supply line at a prescribed first value in a standby mode. The second control circuit connects the second main power supply line with the second sub power supply line in the operating mode, and holds the potential difference between the second main power supply line and the second sub power supply line at a prescribed second value in the standby mode.

Therefore, a main advantage of the present invention resides in that, in a circuit block having a hierarchical power supply structure, the operating speed of the circuit can be improved by employing a power supply-to-power supply capacitance cell.

Another advantage of the present invention resides in that an optimum timing for activation of hierarchical power supply lines compatibly implementing a high-speed operation and reduction of a leakage current and current consumption can be evaluated through a test.

Still another advantage of the present invention resides in that the potential of a sub power supply line can be adjusted so that the optimum potential of the sub power supply line causing no leakage current can be measured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 19 illustrates an exemplary circuit switching a switch with a fuse element and connection states;

DESCRIPTION OF THE PREFERRED EMBODIMENTS

Figure 1:
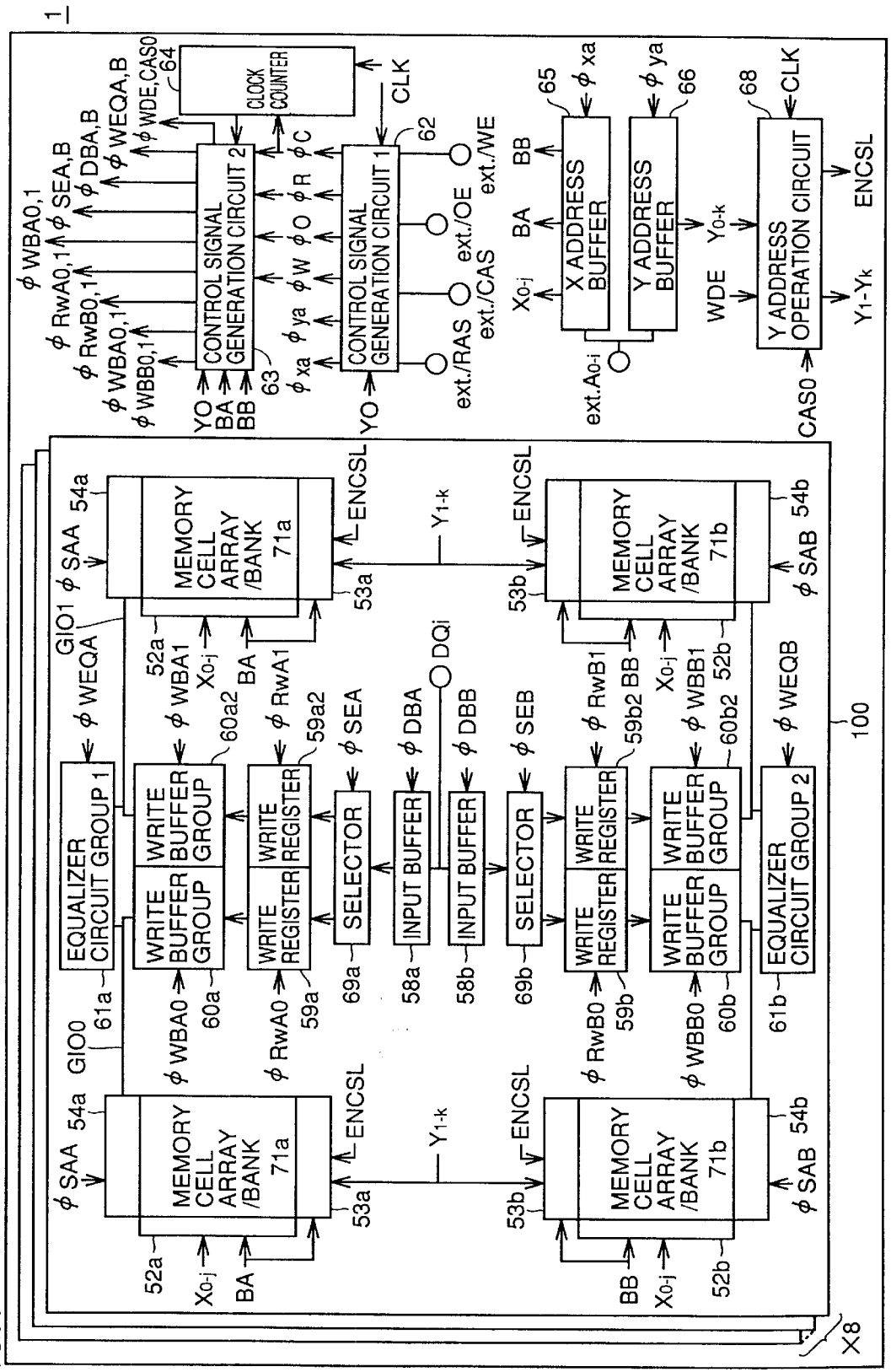
FIG. 1 is a block diagram functionally showing the structure of a principal part of a semiconductor device 1 according to an embodiment 1 of the present invention.

Embodiments of the present invention are now described in detail with reference to drawings. Referring to the drawings, identical numerals denote the same or corresponding parts.

[Embodiment 1]

FIG. 1 is a block diagram functionally showing the structure of a principal part of a semiconductor device 1 according to an embodiment 1 of the present invention.

FIG. 1 shows the structure of a functional part related to 1-bit input/output data in a synchronous dynamic random access memory (hereinafter referred to as SDRAM) operating in synchronization with a x8-bit structure clock signal as an exemplary semiconductor device.

A memory cell array part related to a data input/output terminal DQi includes memory cell arrays 71*a* forming a bank A and memory cell arrays 71*b* forming a bank B.

The bank A is split into memory cell array banks A0 and A1 selected in response to an address signal, and the bank B is split into memory cell array banks B0 and B1.

For each of the memory cell array banks A0 and A1, an X decoder group 52*a* including a plurality of row decoders decoding address signals A0 to Aj and selecting corresponding rows of each memory cell array 71*a*, a Y decoder group 53*a* including a plurality of column decoders decoding column address signals Y1 to Yk and generating column selection signals selecting corresponding columns of the memory cell array 71*a* and a sense amplifier group 54*a* detecting and amplifying data of a memory cell connected to a selected row of the memory cell array 71*a*.

The X decoder group 52*a* includes a row decoder provided in correspondence to each word line of the memory cell array 71*a*. In accordance with address signals X0 to Xj, the corresponding row decoder selects a word line.

The Y decoder group 53*a* includes a column decoder provided for each of column selection lines of the memory cell array 71*a*. Each column selection line selects four pairs of bit lines. The X decoder groups 52*a* and 53*a* simultaneously select 4-bit memory cells in each of the memory cell array banks A0 and A1. The X decoder group 52*a* and the Y decoder group 53*a* are activated by a bank specifying signal BA respectively. On the other hand, an X decoder group 52*b* and a Y decoder group 53*b* are provided also for each of the memory cell array banks B0 and B1, and activated by a bank specifying signal BB respectively.

The bank A is further provided with internal data transmission lines (global I/O lines) for transmitting the data detected/amplified by the sense amplifier groups 54*a* while transmitting write data to the selected memory cells of the memory cell arrays 71*a*. A global I/O line bus GIO0 is provided for the memory cell array bank A0, while a global I/O line bus GIO1 is provided for the memory cell array bank A1. Each global I/O line bus includes four pairs of global I/O lines for simultaneously transferring data to the simultaneously selected four-bit memory cells.

A write register 59*a* and a write buffer group 60*a* are provided in correspondence to the global I/O line bus GIO0 for the memory cell array bank A0, while a write register 59*a*2 and a write buffer group 60*a*2 are provided in correspondence to the global I/O line bus GIO1 for the memory cell array bank A1.

An input buffer 58*a* of a 1-bit width generates internal write data from input data supplied to the data input/output terminal DQi. A selector 69*a* is controlled by a selector control signal φSEA outputted from a second control signal generation circuit 63 for switching an output of the input buffer 58*a* and supplying the same to the write register 59*a* or 59*a*2. In other words, the input/output buffer 58*a* is activated in response to an input buffer activation signal φDBA for generating the internal write data from the input data supplied to the data input/output terminal DQi, while the selector 69*a* is controlled in response to the selector control signal φSEA outputted from the second control signal generation circuit 63 in response to an address signal to output the internal write data to either one of the right registers 59*a* and 59*a*2. The write registers 59*a* and 59*a*2 are activated in response to register activation signals φRwA0 and φwA1 respectively for sequentially storing the write data outputted from the selector 59a. The write buffer groups 60a and 60a2 are activated in response to write buffer activation signals φWBA0 and φWBA1 respectively for amplifying data stored in the corresponding write registers 59a and 59a2 and transmitting the same to the corresponding global I/O line buses GIO0 and GIO1 respectively.

An equalizer circuit group 61a is provided for the two systems of global I/O line buses GIO0 and GIO1 in common and activated in response to an equalizer circuit activation signal φWEQA for equalizing the global I/O line buses GIO0 and GIO1.

Each of the write buffer groups 60a and 60a2 and the write registers 59a and 59a2 has a 8-bit width.

The bank B also includes the memory cell array banks B0 and B1. Each of the memory cell array banks B0 and B1 includes an X decoder group 52b, a Y decoder group 53b, a sense amplifier group 54b activated in response to a sense amplifier activation signal φSAB, an equalizer circuit group 61b activated in response to an equalizer circuit activation signal φWEQB, a write buffer group 60b or 60b2 activated in response to a buffer activation signal φWBB0 or φWBB1, a write register 59b or 59b2 activated in response to a register activation signal φRwB0 or φRwB1, a selector 69b controlled by a selector control signal φSEB, and an input buffer 58b activated in response to a buffer activation signal φDBB.

The banks A and B are identical in structure to each other. Data can be inputted/outputted in synchronization with a high-speed clock signal due to the provision of the write registers 59a, 59a2, 59b and 59b2.

In accordance with the bank specifying signal BA or BB, only each control signal for either the bank A or the bank B is generated.

A functional block 100 shown in FIG. 1 is provided in correspondence to each data input/output terminal. The x8-bit structure SDRAM includes eight functional blocks 100 in correspondence to the respective data input/output terminals.

The banks A and B are rendered substantially identical in structure to each other so that only one of the banks A and B is selected by the bank specifying signal BA or BB, whereby the banks A and B can operate substantially completely independently of each other.

A first control signal generation circuit 62, the second control signal generation circuit 63 and a clock counter 64 are provided as a control system for individually driving the banks A and B respectively.

The first control signal generation circuit 62 incorporates externally supplied control signals, i.e., an external row address strobe signal ext./RAS, an external column address strobe signal ext./CAS, an external output enable signal ext./OE and an external write enable signal (write authorization signal) ext./WE in synchronization with an external clock signal CLK and generates internal control signals φxa, φya, φW, φO, φR and φC.

The second control signal generation circuit 63 generates the bank specifying signals BA and BB, the least significant bit Y0 of an external address signal, control signals for individually driving the banks A and B in response to the internal control signals φW, φO, φR and φC and an output of the clock counter 64, i.e., the equalizer circuit activation signals φWEQA and φWEQB, the sense amplifier activation signals φSAA and φSAB, the write buffer activation signals φWBA0, φWBA1, φWBB0 and φWBB1, the write register activation signals φRwA0, φRwA1, φRwB0 and φRwB1, the selector control signals φSEA and φSEB, the input buffer activation signals φDBA and φDBB, a signal CAS0 activated (low level) when the timing of an internal control signal is for a write operation, and a write decode enable signal WDE activated (high level) during a write operation period.

As peripheral circuits, the semiconductor device 1 further includes an X address buffer 65 incorporating external address signals ext.A0 to ext.Ai in response to the internal control signal φxa and generating the internal address signals X0 to Xj and the bank specifying signals BA and BB, and a Y address buffer 66 activated in response to the internal control signal φya for generating column selection signals Y0 to Yk for specifying a column selection line.

As a peripheral circuit, the semiconductor device 1 further includes a Y address operation circuit 68 controlled by the external clock signal CLK for receiving the column selection signals Y0 to Yk outputted from the Y address buffer 66 and the signals CAS0 and WDE and outputting the column address signals Y1 to Yk and a Y decoder activation signal ENCSL.

In the aforementioned SDRAM, an operating mode is decided in response to the values of the externally supplied control signals incorporated in synchronization with the external clock signal CLK. The bit number of continuously read or written data, which is called a burst length, is set at any of 1, 2, 4 and 8 bits in the SDRAM by changing the value of a mode register included in the first control signal generation circuit 62 by an internally supplied control signal. In addition, the mode register holds a set value of a CAS latency, a set value of a burst type interleave/sequential mode and the like.

The SDRAM does not regularly transmits/receives data to/from an external device but is generally set in a standby state while a microprocessor performs data processing, for example. In order to reduce power consumed by the SDRAM in such a standby state, it is effective to reduce subthreshold currents of MOS transistors.

The present invention is employed for reducing subthreshold currents in the standby state. While the SDRAM is employed as an exemplary semiconductor device in the above description, the present invention is not restricted to a semiconductor memory device such as the SDRAM in particular, but is applicable to all semiconductor devices (e.g., a microprocessor, a logic LSI and the like) including MOS circuits.

Figure 2:
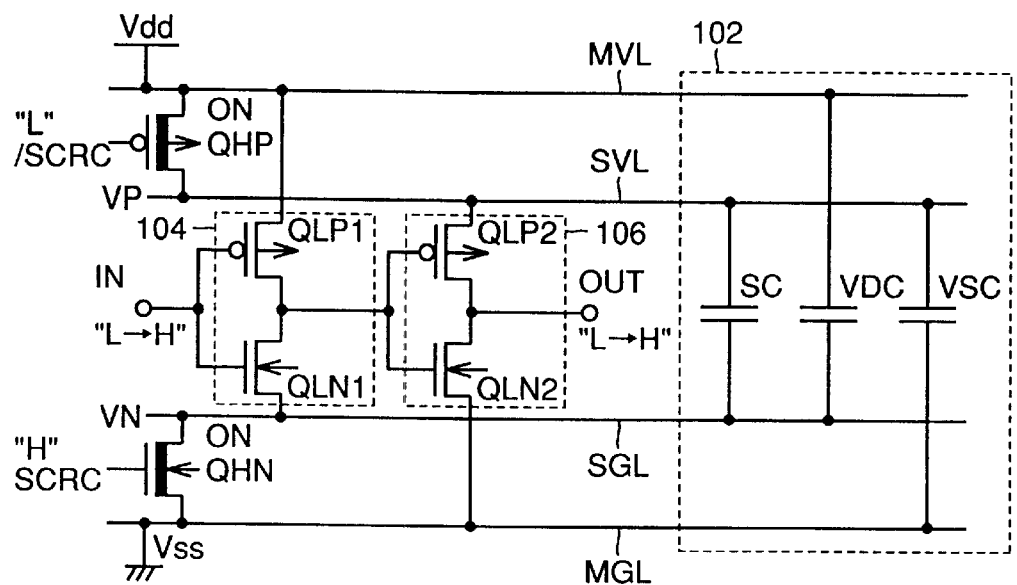
FIG. 2 is a circuit diagram showing an exemplary structure of an internal circuit included in the semiconductor device 1 according to the embodiment 1.

FIG. 2 is a circuit diagram showing an exemplary structure of an internal circuit included in the semiconductor device according to the embodiment 1.

Referring to FIG. 2, this internal circuit includes a main power supply line MVL supplied with a power supply potential Vdd, a main ground line MGL supplied with a ground potential Vss, a sub power supply line SVL supplied with a current from the main power supply line MVL in response to a control signal /SCRC, a sub ground line SGL supplied with a current from the main ground line MGL in response to a control signal SCRC, a P-channel MOS transistor QHP having a high threshold voltage connected between the main power supply line MVL and the sub power supply line SVL with a gate receiving the control signal /SCRC, and an N-channel MOS transistor QHN having a high threshold voltage connected between the main ground line MGL and the sub ground line SGL with a gate receiving the control signal SCRC.

This internal circuit further includes an invertor 104 connected to the main power supply line MVL and the sub ground line SGL for receiving an input signal IN, an invertor 106 connected to the sub power supply line SVL and the main ground line MGL for receiving and inverting an output of the invertor 104 and outputting an output signal OUT, and a power supply-to-power supply capacitance cell 102 connected to the main power supply line MVL, the sub power supply line SVL, the sub ground line SGL and the main ground line MGL.

The invertor 104 includes a P-channel MOS transistor QLP1 and an N-channel MOS transistor QLN1 serially connected between the main power supply line MVL and the sub ground line SGL with gates receiving the input signal IN. A connection node between the P-channel MOS transistor QLP1 and the N-channel MOS transistor QLN1 outputs the output signal of the invertor 104.

The invertor 106 includes a P-channel MOS transistor QLP2 and an N-channel MOS transistor QLN2 serially connected between the sub power supply line SVL and the main ground line MGL with gates receiving the output from the invertor 104. A connection node between the P-channel MOS transistor QLP2 and the N-channel MOS transistor QLN2 outputs the output signal OUT of the invertor 106.

The P-channel MOS transistors QLP1 and QLP2 have threshold voltages lower than that of the P-channel MOS transistor QHP. Further, the N-channel MOS transistors QLN1 and QLN2 have threshold voltages lower than that of the N-channel MOS transistor QHN.

Thus, the main power supply line MVL and the sub power supply line SVL are provided and two types of P-channel MOS transistors having different threshold voltages are employed for suppressing current consumption in the standby state of this circuit. Subthreshold currents in the standby state are reduced due to employment of such a hierarchical power supply structure.

The P-channel MOS transistor QHP has a high threshold voltage for reducing the subthreshold currents, while the P-channel MOS transistors QLP1 and QLP2 have low threshold voltages for increasing the operating speed. This also applies to the N-channel MOS transistors QNP and QLN1 and QLN2.

The power supply-to-power supply capacitance cell 102 includes a capacitor SC connected between the sub power supply line SVL and the sub ground line SGL, a capacitor VDC connected between the main power supply line MVL and the sub ground line SGL, and a capacitor VSC connected between the sub power supply line SVL and the main ground line MGL.

The power supply-to-power supply capacitance cell 102 indicates that the capacitors SC, VDC and VSC are regularly combined with each other to form a single cell. When the capacitors SC, VDC and VSC are thus connected to the power supply lines MVL and SVL, the sub power supply line SVL and the sub ground line SGL can be regularly stabilized for stabilizing the operation of the circuit connected to the sub power supply line SVL and the sub ground line SGL.

Figure 3:
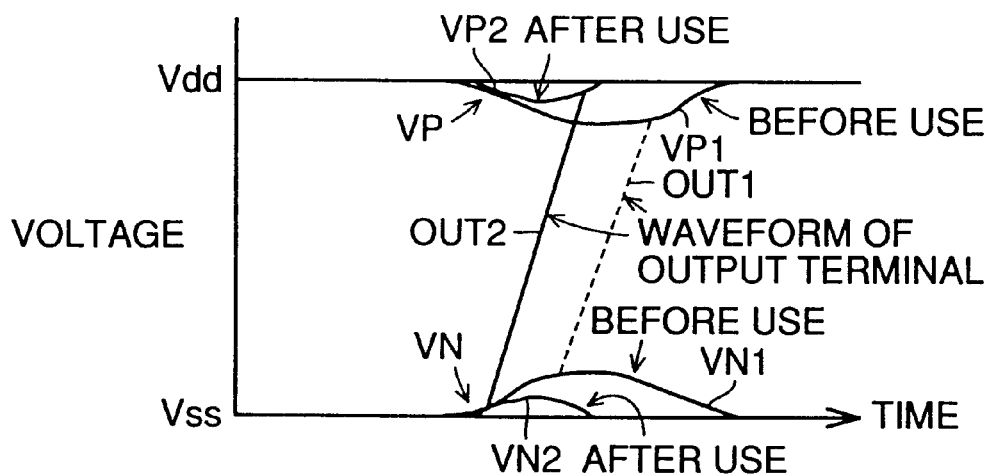
FIG. 3 shows waveforms in cases of using and not using a power supply-to-power supply capacitance cell 102.

FIG. 3 illustrates operating waveforms in cases of using and not using the power supply-to-power supply capacitance cell 102 shown in FIG. 2 respectively.

Referring to FIGS. 2 and 3, consider that the input signal IN changes from a low level to a high level. At this time, the control signal SCRC goes high, and the N-channel MOS transistor QHN and the P-channel MOS transistor QHP are rendered conductive. The output signal OUT also changes from a low level to a high level in response to the change of the input signal IN, through operations of the invertors 104 and 106. At this time, a voltage drop is developed on the potential of the sub power supply line SVL, i.e., a sub power supply line potential VP, only by the resistance of the P-channel MOS transistor QHP due to currents consumed in the invertors 104 and 106. On the other hand, the potential of the sub ground line SGL, i.e., a sub ground potential VN floats by the resistance of the N-channel MOS transistor QHN. The output signal OUT is delayed due to such voltage fluctuation. Referring to FIG. 3, symbols VP1, VN1 and OUT1 denote the waveforms of the sub power supply potential VP, the sub ground potential VN and the output signal OUT at this time respectively.

The power supply-to-power supply capacitance cell 102 is added in order to reduce this output delay. In this case, the currents consumed in the invertors 104 and 106 are partially supplied from the power supply-to-power supply capacitance cell 102. Therefore, noise appearing on the sub power supply line SVL and the sub ground line SGL is reduced. Referring to FIG. 3, symbols VP2, VN2 and OUT2 denote the waveforms of the sub power supply potential VP, the sub ground potential VN and the output signal OUT at this time respectively.

FIG. 3 shows that output delay of the internal circuit is improved by arranging the power supply-to-power supply capacitance cell 102 shown in FIG. 2.

Figure 4:
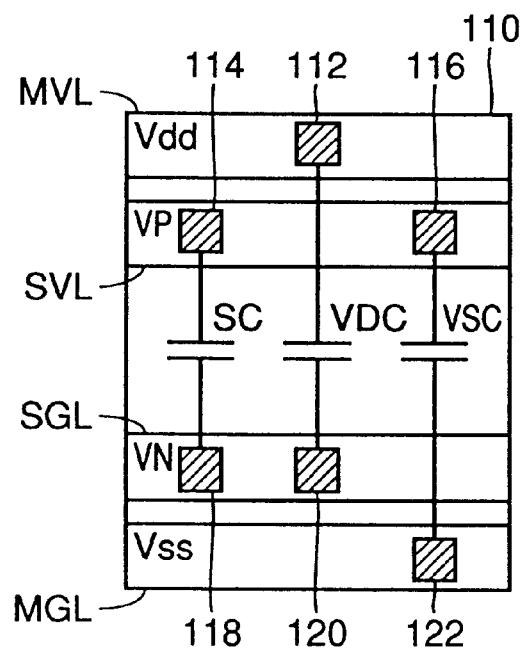
FIG. 4 schematically illustrates the power supply-to-power supply capacitance cell 102 shown in FIG. 2 employed as a standard cell.

FIG. 4 is a schematic diagram for illustrating the power supply-to-power supply capacitance cell 102 shown in FIG. 2 employed as a standard cell.

Referring to FIG. 4, a power supply-to-power supply capacitance cell 110 includes a main power supply line MVL, a sub power supply line SVL, a sub ground line SGL and a main ground line MGL arranged in parallel with each other along the shorter side direction of a rectangular cell frame.

Capacitors SC, VDC and VSC are arranged between the sub power supply line SVL and the sub ground line SGL. A first electrode of the capacitor SC is connected to the sub power supply line SVL through a contact cell 114. A second electrode of the capacitor SC is connected to the sub ground line SGL through a contact cell 118.

A first electrode of the capacitor VDC is connected to the main power supply line MVL through a contact cell 112. A second electrode of the capacitor VDC is connected to the sub ground line SGL through a contact cell 120.

A first electrode of the capacitor VSC is connected to the sub power supply line SVL through a contact cell 116. A second electrode of the capacitor VSC is connected to the main ground line MGL through a contact cell 122.

The term "contact cell" stands for a part of an interlayer isolation film provided with a through hole, which is filled up with a metal layer for connecting each power supply line and an electrode layer of each capacitor with each other.

Figure 5:
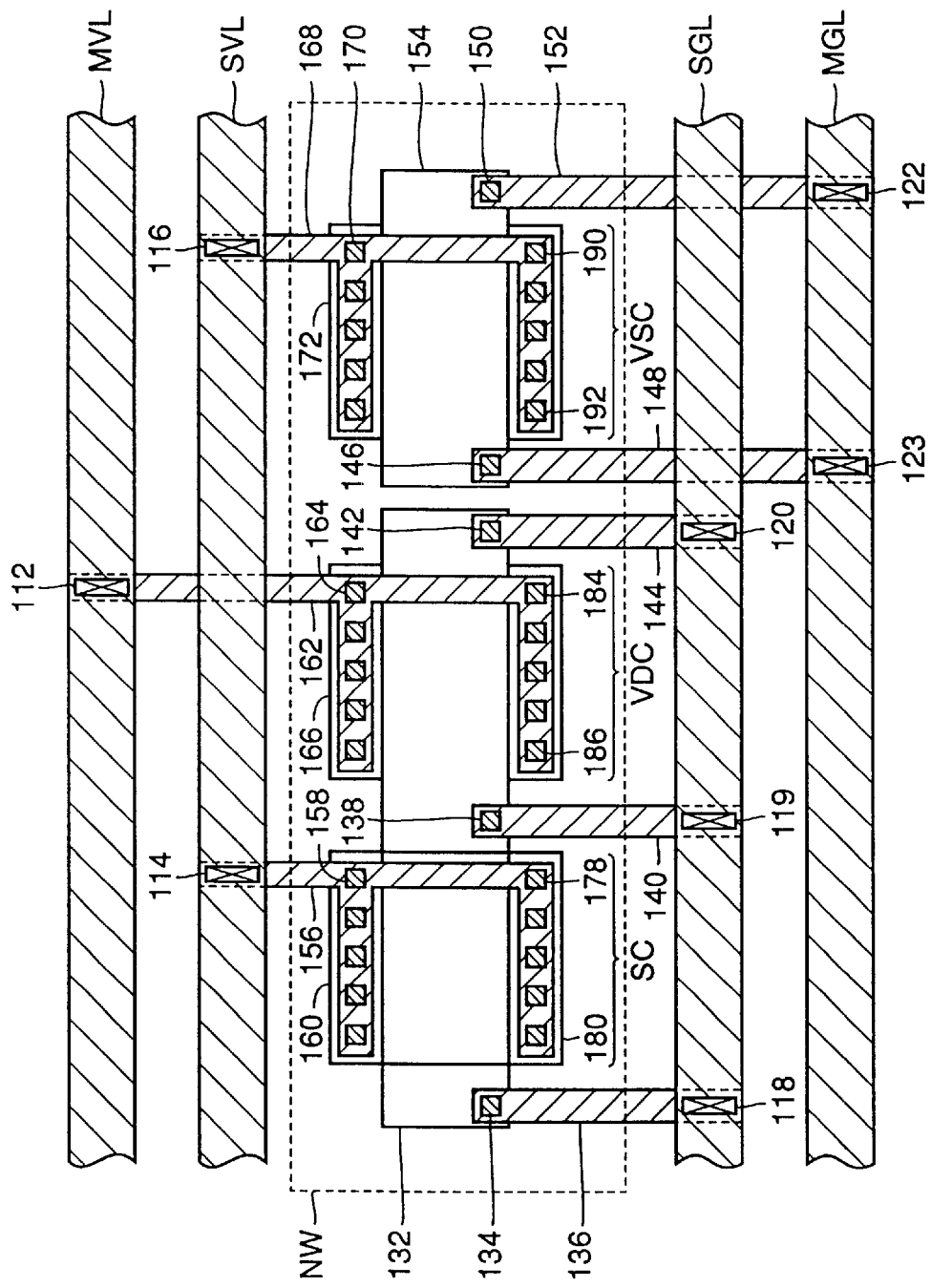
FIG. 5 is a layout diagram showing the arrangement of each element of the power supply-to-power supply capacitance cell shown in FIG. 4.

FIG. 5 is a layout diagram showing arrangement of each element of the power supply-to-power supply capacitance cell 110 shown in FIG. 4.

Referring to FIG. 5, the power supply-to-power supply capacitance cell 110 includes the main power supply line MVL, the sub power supply line SVL, the sub ground line SGL and the main ground line MGL arranged in parallel with each other along the longer side direction of a rectangular N well NW. These power supply lines MVL and SVL and ground lines SGL and MGL are prepared from second layer metal wires.

The capacitors SC, VDC and VSC are arranged between the sub power supply line SVL and the sub ground line SGL.

The capacitors SC, VDC and VSC are formed by MOS transistors. In these MOS transistors, sources and drains are connected to define the first electrodes of the capacitors SC, VDC and VSC, while gates define the second electrodes of the capacitors SC, VDC and VSC respectively.

For convenience of illustration, hereinafter a first connection node of each MOS transistor is referred to as a source while a second connection node thereof is referred to as a drain regardless of the level of a supplied potential.

In the capacitor SC, a source 160 and a drain 180 of the MOS transistor are connected with each other through contact cells 158 and 178 and a first layer metal wire 156, while a gate 132 made of polysilicon is connected with a first layer metal wire 136 through a contact cell 134.

The first layer metal wire 156 forming the first electrode of the capacitor SC is connected to the sub power supply line SVL through the contact cell 114. The first layer metal wire 136 forming the second electrode of the capacitor SC is connected to the sub ground line SGL through the contact cell 118.

In the capacitor VDC, a source 166 and a drain 186 of the MOS transistor are connected with each other through contact cells 164 and 184 and a first layer metal wire 162, and the gate 132 made of polysilicon is connected to a first layer metal wire 144 through a contact cell 142.

The first layer metal wire 162 forming the first electrode of the capacitor VDC is connected to the main power supply line MVL through the contact cell 112. The first layer metal wire 144 forming the second electrode of the capacitor VDC is connected to the sub ground line SGL through the contact cell 120.

The second electrodes of both capacitors SC and VDC are connected to the sub ground line SGL, and hence the gate 132 of polysilicon is common to these capacitors SC and VDC. In order to stabilize the potentials, the gate 132 is connected to a first layer metal wire 140 through a contact cell 138 in a portion between the capacitors SC and VDC, while the first layer metal wire 140 is connected to the sub ground line SGL through a contact cell 119.

In the capacitor VSC, a source 172 and a drain 192 of the MOS transistor are connected with each other through contact cells 170 and 190 and a first layer metal wire 168, and a gate 154 made of polysilicon is connected to a first layer metal wire 152 through a contact cell 150.

The first layer metal wire 168 forming the first electrode of the capacitor VSC is connected to the sub power supply line SVL through the contact cell 116. The first layer metal wire 152 forming the second electrode of the capacitor VSC is connected to the main ground line MGL through the contact cell 122.

In order to stabilize the potential, the gate 154 is connected to a first layer metal wire 148 through a contact cell 146 in a portion adjacent to the capacitor VDC, while the first layer metal wire 148 is connected to the main ground line MGL through a contact cell 123.

Figure 6:
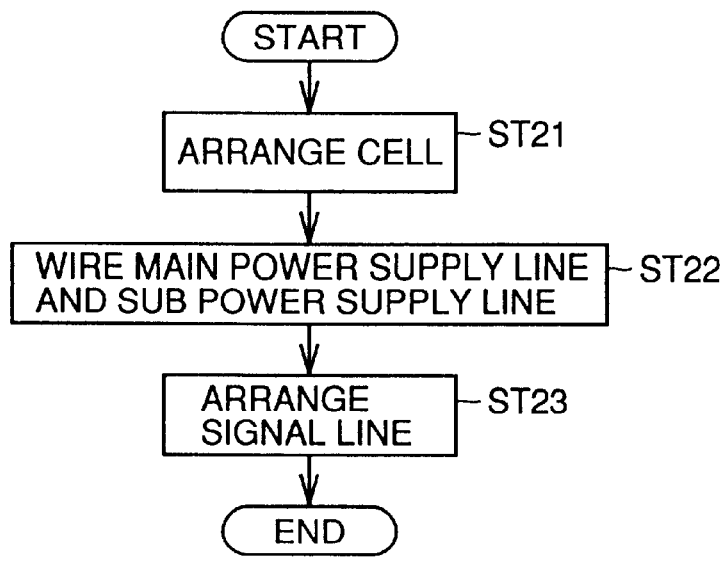
FIG. 6 is a flow chart for illustrating a case of forming the layout of a circuit block employing the power supply-to-power supply capacitance cell shown in FIGS. 4 and 5.

FIG. 6 is a flow chart for illustrating a case of forming the layout of a circuit block with the power supply-to-power supply capacitance cell shown in FIGS. 4 and 5.

Referring to FIG. 6, a logic gate cell and the power supply-to-power supply capacitance cell are arranged at a step ST21. Then, the main power supply line MVL, the sub power supply line SVL, the main ground line MGL and the sub ground line SGL are wired at a step ST22. Second layer metal wires are employed as power supply wires therefor.

Each logic gate cell and each power supply line of the power supply-to-power supply capacitance cell arranged at the step ST21 are connected with each other at the step ST22.

At a step ST23, signal lines from an input signal in the designed circuit block to an output signal are arranged.

Layout data of the circuit block is then completed. A computer automatically performs the design flow of the circuit block employing the standard cell shown in FIG. 6 on the basis of connection information for circuits and information on the sizes of each logic cell and the power supply-to-power supply capacitance cell.

Figure 7:
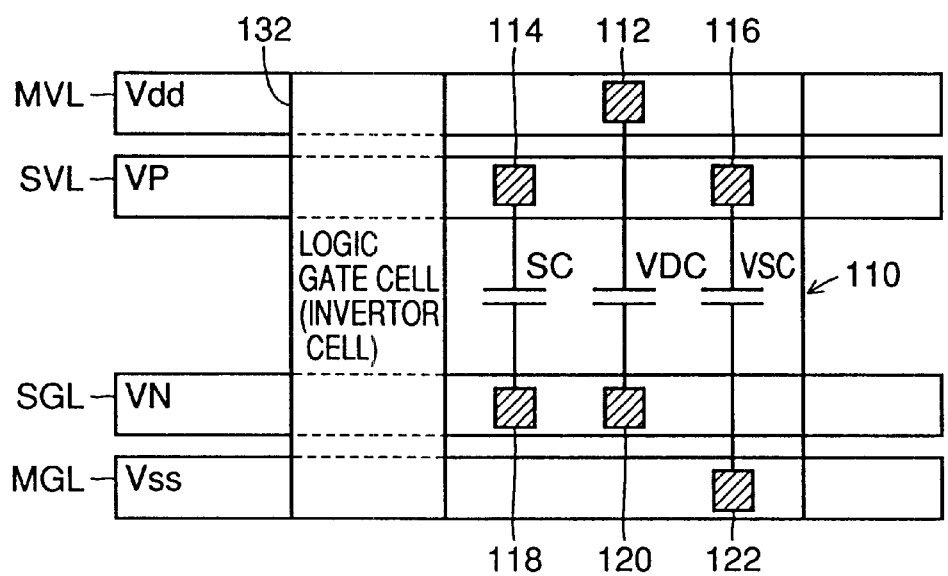
FIG. 7 is a model diagram showing exemplary arrangement of a circuit.

FIG. 7 is a model diagram showing exemplary arrangement of the circuit.

Referring to FIG. 7, the power supply-to-power supply capacitance cell 110 is arranged adjacently to a logic gate cell 132. The main power supply line MVL, the sub power supply line SVL, the sub ground line SGL and the main ground line MGL are so arranged that the logic gate cell 132 and each power supply line of the power supply-to-power supply capacitance cell 110 are connected with each other.

Thus, three capacitors are included in the power supply-to-power supply capacitance cell 110 for creating layout data, whereby the arrangement area can be reduced and management of arrangement points is simplified as compared with the case of separately arranging capacitors. From the P-channel MOS transistor QHP supplying the current to the sub power supply line SVL and the N-channel MOS transistor QHN supplying the current to the sub ground line SGL shown in FIG. 2, an effect can be attained by arranging the power supply-to-power supply capacitance cell in proximity to a circuit located on a separate position in the block.

In other words, an effective arrangement point of the power supply-to-power supply capacitance cell must be taken into consideration in the block. In this regard, the cell including three capacitors leads to reduction of the number of design steps for the semiconductor device 1.

A second exemplary hierarchical power supply structure employing such a power supply-to-power supply capacitance cell is now described.

Figure 8:
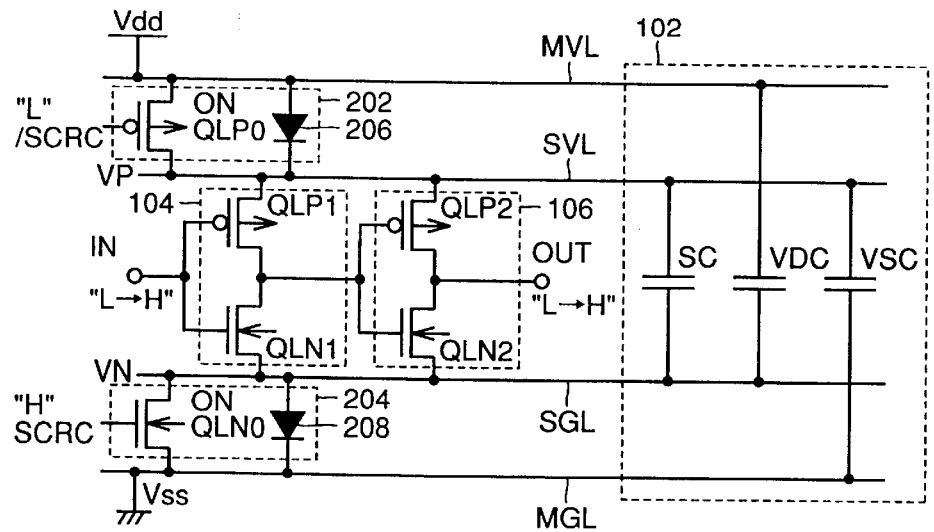
FIG. 8 is a circuit diagram for illustrating a second hierarchical power supply structure.

FIG. 8 is a circuit diagram for illustrating the second hierarchical power supply structure.

Referring to FIG. 8, a circuit block having this hierarchical power supply structure includes a connection circuit 202 in place of the P-channel MOS transistor QHP and a connection circuit 204 in place of the N-channel MOS transistor QHN with invertors 104 and 106 both supplied with currents from a sub power supply line SVL and a sub ground line SGL, dissimilarly to the internal circuit shown in FIG. 2. The remaining structure is similar to that of the internal circuit shown in FIG. 2, and hence redundant description is not repeated.

The connection circuit 202 includes a P-channel MOS transistor QLP0 connected between a main power supply line MVL and the sub power supply line SVL with a gate receiving a control signal /SCRC and a diode 206 forwardly connected between the main power supply line MVL and the sub power supply line SVL.

The connection circuit 204 includes an N-channel MOS transistor QLN0 connected between the sub ground line SGL and a main ground line MGL with a gate receiving a control signal SCRC and a diode 208 forwardly connected between the sub ground line SGL and the main ground line MGL.

In the circuit shown in FIG. 8, the threshold voltages of the P-channel MOS transistor QLP0 and the N-channel MOS transistor QLP0 may be equal to those of a P-channel MOS transistor and an N-channel MOS transistor employed for an internal circuit such as the invertor 104 respectively.

Therefore, no plurality of threshold voltages are required and hence the fabrication process can be simplified.

Also in the circuit having such a structure, noise caused on the sub power supply line SVL and the sub ground line SGL can be reduced by employing a power supply-to-power supply capacitance cell 102 advantageously for a high-speed operation of the circuit.

As hereinabove described, the semiconductor device 1 according to the embodiment 1 attains an effect of improving the operating speed of the circuit by employing the power supply-to-power supply capacitance cell in the circuit block having a hierarchical power supply structure. Further, the number of design steps can be reduced by employing this cell as a standard cell and applying the same to design of layout data of the block.

[Embodiment 2]

With reference to an embodiment 2 of the present invention, adjustment for reducing the time required for reducing noise of a sub power supply line SVL and activating the sub power supply line SVL is described.

Figure 9:
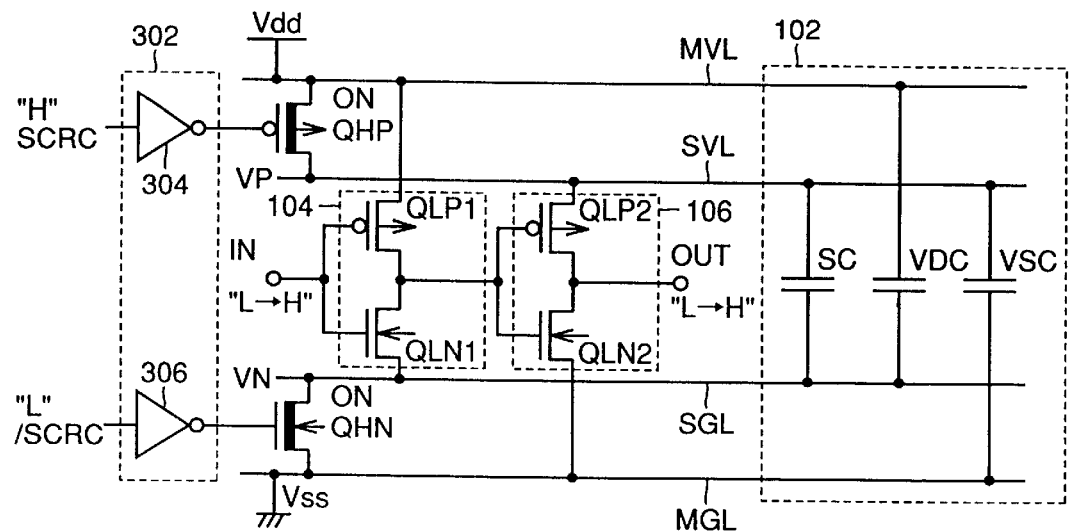
FIG. 9 is a circuit diagram for illustrating rise of a sub power supply line and noise thereof.

FIG. 9 is a circuit diagram for illustrating rise and noise of the sub power supply line SVL.

Referring to FIG. 9, this internal circuit includes a transistor driving circuit 302. The transistor driving circuit 302 includes an invertor 304 receiving and inverting a control signal SCRC and outputting the inverted signal to a gate of a P-channel MOS transistor QHP, and an invertor 306 receiving and inverting a control signal /SCRC and outputs the inverted signal to a gate of an N-channel MOS transistor QHP, dissimilarly to the circuit shown in FIG. 2. The remaining structure is similar to that of the circuit shown in FIG. 2, and hence redundant description is not repeated.

In this circuit, a power supply-to-power supply capacitance cell 102 reduces noise of the sub power supply line SVL, as shown in the embodiment 1.

Figures 10, 11:
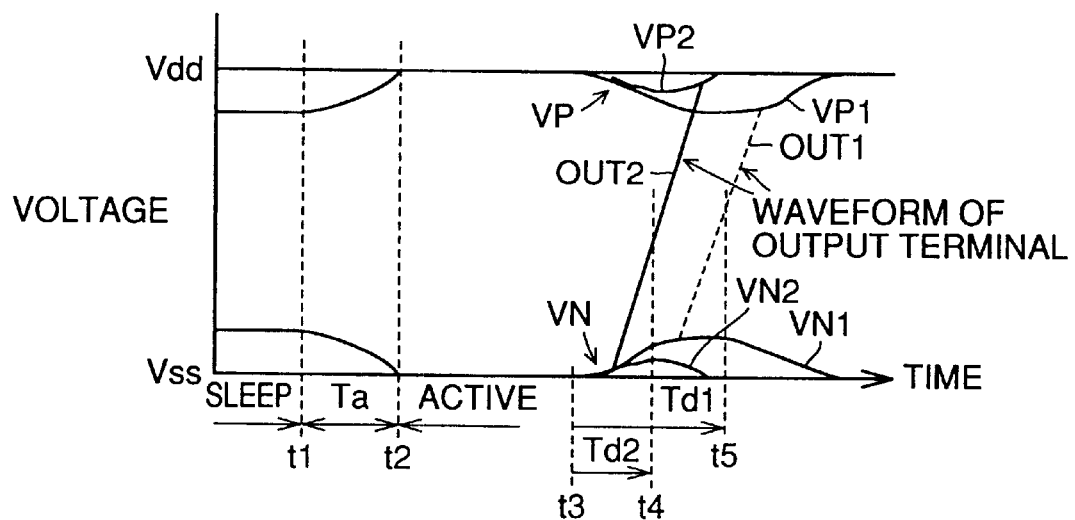
FIG. 10 is an operating waveform diagram of the circuit shown in FIG. 9.
FIG. 11 illustrates the relation of change of an activation time Ta and a delay time Td in a case of providing a sleep transistor and a capacitance cell in parallel.

FIG. 10 is an operating waveform diagram of the circuit shown in FIG. 9.

Referring to FIGS. 9 and 10, the P-channel MOS transistor QHP and the N-channel MOS transistor QHN for supplying currents to the sub power supply line SVL and a sub ground line SGL respectively are non-conductive and the sub power supply line SVL and the sub ground line SGL are inactive up to a time t1. Transistors coupling a main power supply line and a sub power supply line in operation such as the P-channel MOS transistor QHP and the N-channel MOS transistor QHP supplying currents to the sub power supply line SVL and the sub ground line SGL are hereinafter referred to as sleep transistors.

At the time t1, the control signal SCRC goes high and the sleep transistors QHP and QHN are responsively rendered conductive. At a time t2 after a lapse of an activation time Ta, the potential of the sub power supply line SVL reaches a power supply potential Vdd while that of the sub ground line SGL reaches a ground potential Vss. In other words, the circuit connected to the sub power supply line SVL and the sub ground line SGL enters an active state after the time t2. At a time t3, an output signal OUT changes in response to on change of an input signal IN, while an operation delay time varies with presence/absence of the power supply-to-power supply capacitance cell 102. The output signal OUT rises (shown in a waveform OUT1) at a time t5 if no power supply-to-power supply capacitance cell 102 is provided, while the output signal OUT rises (shown in a waveform OUT2) at a time t4 if the power supply-to-power supply cell 102 is provided. Therefore, the operation delay time of the internal circuit is Td1 or Td2 depending on presence/absence of the power supply-to-power supply capacitance cell 102.

As the sleep transistors QHP and QNP are increased in size, the currents for charging the sub power supply line SVL and the sub ground line SGL can be supplied in larger quantities and hence the activation time Ta is reduced. In order to reduce the output delay time of the internal circuit, it is advantageous to increase the capacitance value of the power supply-to-power supply capacitance cell 102. In place of increasing the sleep transistors QHP and QNP in size, a plurality of sleep transistors of the same size may be provided in parallel between the main power supply line MVL and the sub power supply line SVL. This also applies to sleep transistors connected between the main ground line MVL and the sub ground line SVL. Alternatively, a similar effect can be attained by arranging a plurality of power supply to power supply capacitance cells in parallel in place of increasing the capacitance value of the power supply-to-power supply capacitance cell 102.

FIG. 11 illustrates the relation between the activation time Ta and the delay time Td when providing sleep transistors or capacitance cells in parallel.

Referring to FIG. 11, the activation time Ta is reduced when the number of sleep transistors provided in parallel is increased, while the delay time Td of the internal circuit is reduced in this case.

When the number of capacitance cells is increased, on the other hand, the activation time Ta is increased due to a time for charging the sub power supply line and the sub ground line having increased capacitance values. When the number of the capacitance cells is increased, further, the delay time Td is reduced as described with reference to the embodiment 1.

When the number of the sleep transistors or the capacitance cells is increased, however, the effect varies with the positions of arrangement thereof. If employing cells usable both as sleep transistors and power supply-to-power supply capacitance cells by switching setting, therefore, arrangement of the power supply-to-power supply capacitance cells and sleep transistors can be optimized in an internal circuit having a hierarchical power supply structure in response to the state of current consumption of the internal circuit.

Figure 12:
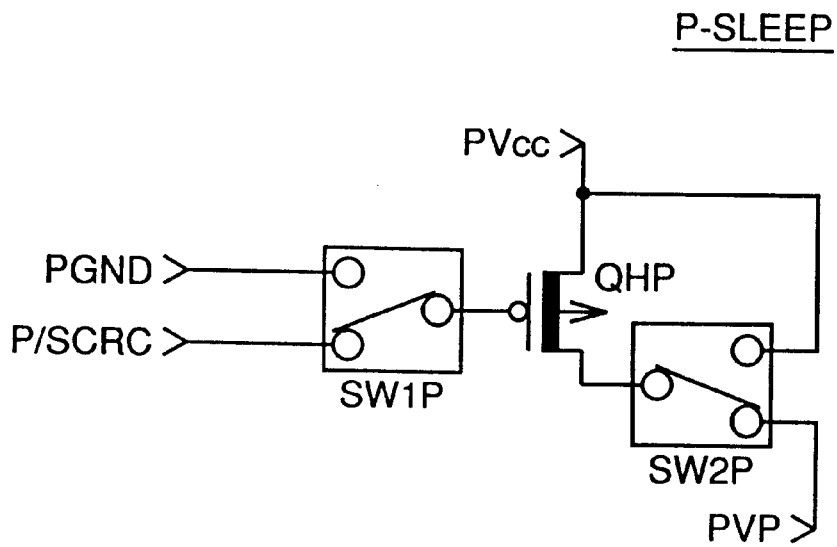
FIG. 12 is a circuit diagram showing the structure of a cell P_SLEEP employing a P-channel MOS transistor QHP initially as a sleep transistor.

FIG. 12 is a circuit diagram showing the structure of a cell P_SLEEP employing a P-channel MOS transistor QHP initially as a sleep transistor.

Referring to FIG. 12, the cell P_SLEEP includes the P-channel MOS transistor QHP, a switching circuit SW1P connected to a gate of the P-channel MOS transistor QHP, and a switching circuit SW2P connected to a drain of the P-channel MOS transistor QHP. An input node PVcc of the cell P_SLEEP is connected to a source of the P-channel MOS transistor QHP.

The switching circuit SW1P, connecting an input node P/SCRC of the cell P_SLEEP with the gate of the P-channel MOS transistor QHP in initialization, can connect an input node PGND to the gate of the P-channel MOS transistor QHP by changing setting later.

The switching circuit SW2P, connecting an input node PVP of the cell P_SLEEP with the drain of the P-channel MOS transistor QHP in initialization, can connect the input node PVcc to the drain of the P-channel MOS transistor QHP by changing setting later.

Thus, the cell P_SLEEP, initially operating as a sleep transistor, also serves as a capacitor connected between the nodes PVcc and PGND by changing setting at need.

Figure 13:
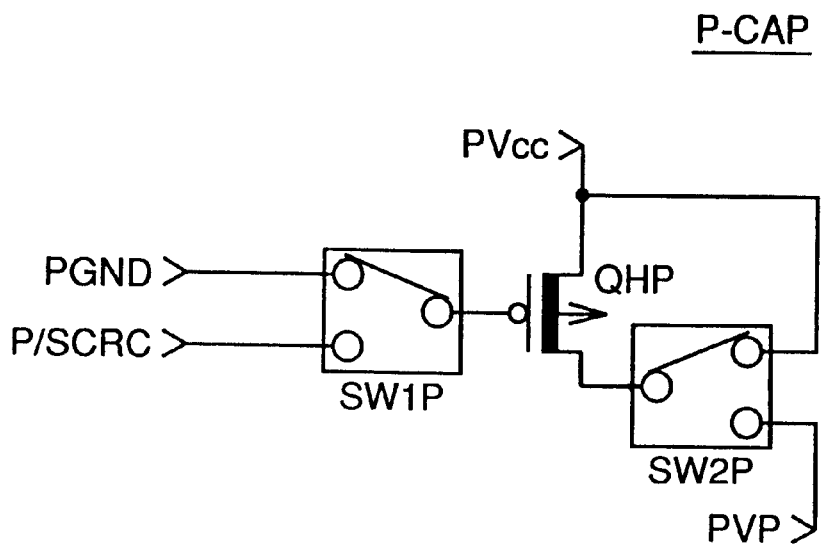
FIG. 13 is a circuit diagram showing the structure of a cell P_CAP employing a P-channel MOS transistor QHP initially as a sleep transistor.

FIG. 13 is a circuit diagram showing the structure of a cell P_CAP employing a P-channel MOS transistor QHP initially as a MOS capacitor.

Referring to FIG. 13, the cell P_CAP includes the P-channel MOS transistor QHP, a switching circuit SW1P connected to a gate of the P-channel MOS transistor QHP, and a switching circuit SW2P connected to a drain of the P-channel MOS transistor QHP. An input node PVcc of the cell P_CAP is connected to a source of the P-channel MOS transistor QHP.

The switching circuit SW1P, connecting an input node PGND of the cell P_CAP with the gate of the P-channel MOS transistor QHP in initialization, can connect an input node P/SCRC to the gate of the P-channel MOS transistor QHP by changing setting later.

The switching circuit SW2P, connecting the input node PVcc of the cell P_CAP with the drain of the P-channel MOS transistor QHP in initialization, can connect an input node PVP to the drain of the P-channel MOS transistor QHP by changing setting later.

Thus, the cell P_CAP, initially serving as a capacitor connected between the nodes PVcc and PGND, also operates as a sleep transistor by changing setting at need.

Figure 14:
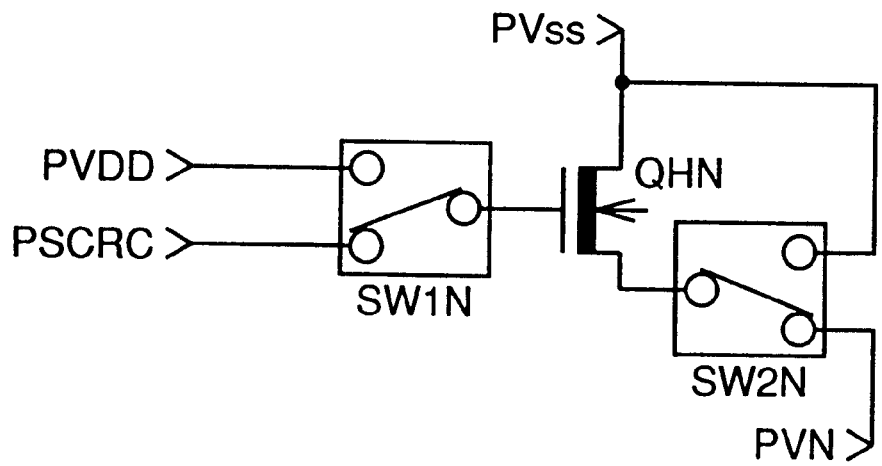
FIG. 14 is a circuit diagram showing the structure of a cell N_SLEEP employing an N-channel MOS transistor QHN initially as a sleep transistor.

FIG. 14 is a circuit diagram showing the structure of a cell N_SLEEP employing an N-channel MOS transistor QNP initially as a sleep transistor.

Referring to FIG. 14, the cell N_SLEEP includes the N-channel MOS transistor QHN, a switching circuit SW1N connected to a gate of the N-channel MOS transistor QHN, and a switching circuit SW2N connected to a drain of the N-channel MOS transistor QHN. An input node PVss of the cell N_SLEEP is connected to a source of the N-channel MOS transistor QHN.

The switching circuit SW1N, connecting an input node PSCRC of the cell N_SLEEP with the gate of the N-channel MOS transistor QHN in initialization, can connect an input node PVDD to the gate of the N-channel MOS transistor QHN by changing setting later.

The switching circuit SW2N, connecting an input node PVN of the cell N_SLEEP with the drain of the N-channel MOS transistor QHN in initialization, can connect the input node PVss to the drain of the N-channel MOS transistor QHN by changing setting later.

Thus, the cell N_SLEEP, initially operating as a sleep transistor, also serves as a capacitor connected between the nodes PVss and PVDD by changing setting at need.

Figure 15:
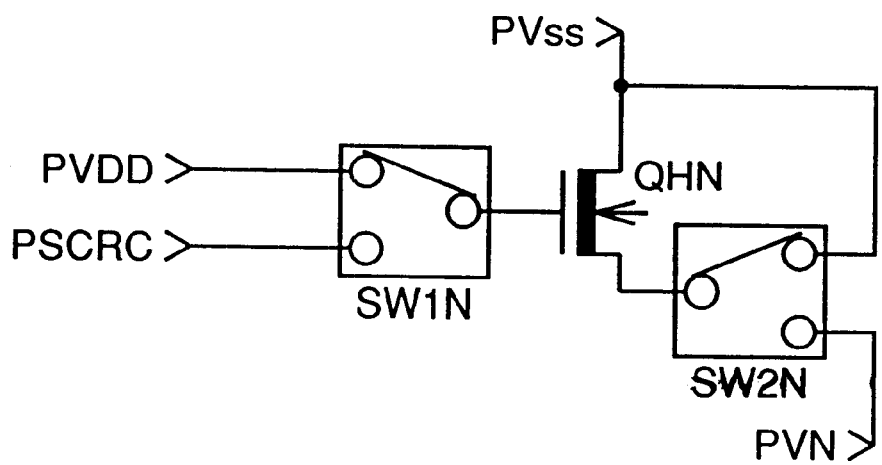
FIG. 15 is a circuit diagram showing the structure of a cell N_CAP employing an N-channel MOS transistor QHN initially as a MOS capacitor.

FIG. 15 is a circuit diagram showing the structure of a cell N_CAP employing an N-channel MOS transistor QHN initially as a MOS capacitor.

Referring to FIG. 15, the cell N_CAP includes the N-channel MOS transistor QHN, a switching circuit SW1N connected to a gate of the N-channel MOS transistor QHN, and a switching circuit SW2N connected to a drain of the N-channel MOS transistor QHN. An input node PVss of the cell N_CAP is connected to a source of the N-channel MOS transistor QHN.

The switching circuit SW1N, connecting an input node PVDD of the cell N_CAP with the gate of the N-channel MOS transistor QHN in initialization, can connect an input node PSCRC to the gate of the N-channel MOS transistor QHN by changing setting later.

The switching circuit SW2N, connecting the input node PVss of the cell N_CAP with the drain of the N-channel MOS transistor QHN in initialization, can connect an input node PVN to the drain of the N-channel MOS transistor QHN by changing setting later.

Thus, the cell N_CAP, initially serving as a capacitor connected between the nodes PVss and PVDD, also operates as a sleep transistor by changing setting at need.

Figure 16:
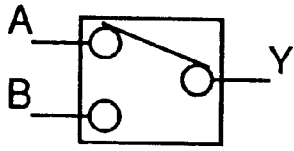
FIG. 16 is a diagram for illustrating switching of connection by a mask pattern.
Figure 16:
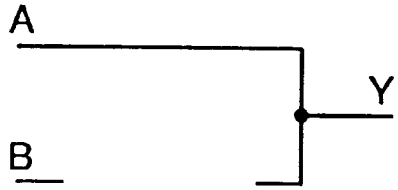
Figure 16:
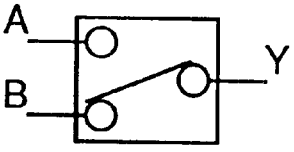
Figure 16:
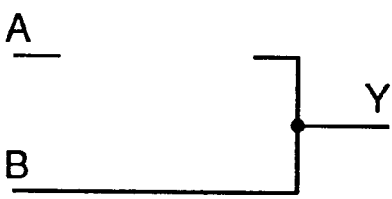

FIG. 16 is a diagram for illustrating switching of connection through a mask pattern.

Referring to FIG. 16, a connection pattern of a wire between nodes B and Y is removed in order to connect the node Y with a node A.

In order to connect the node B with the node Y, a wiring pattern between the nodes A and Y is removed.

Thus, connection can be switched by simply changing only a mask pattern of a wiring layer without changing a mask (employed for formation of transistors or the like) under the wiring layer.

Figure 17:
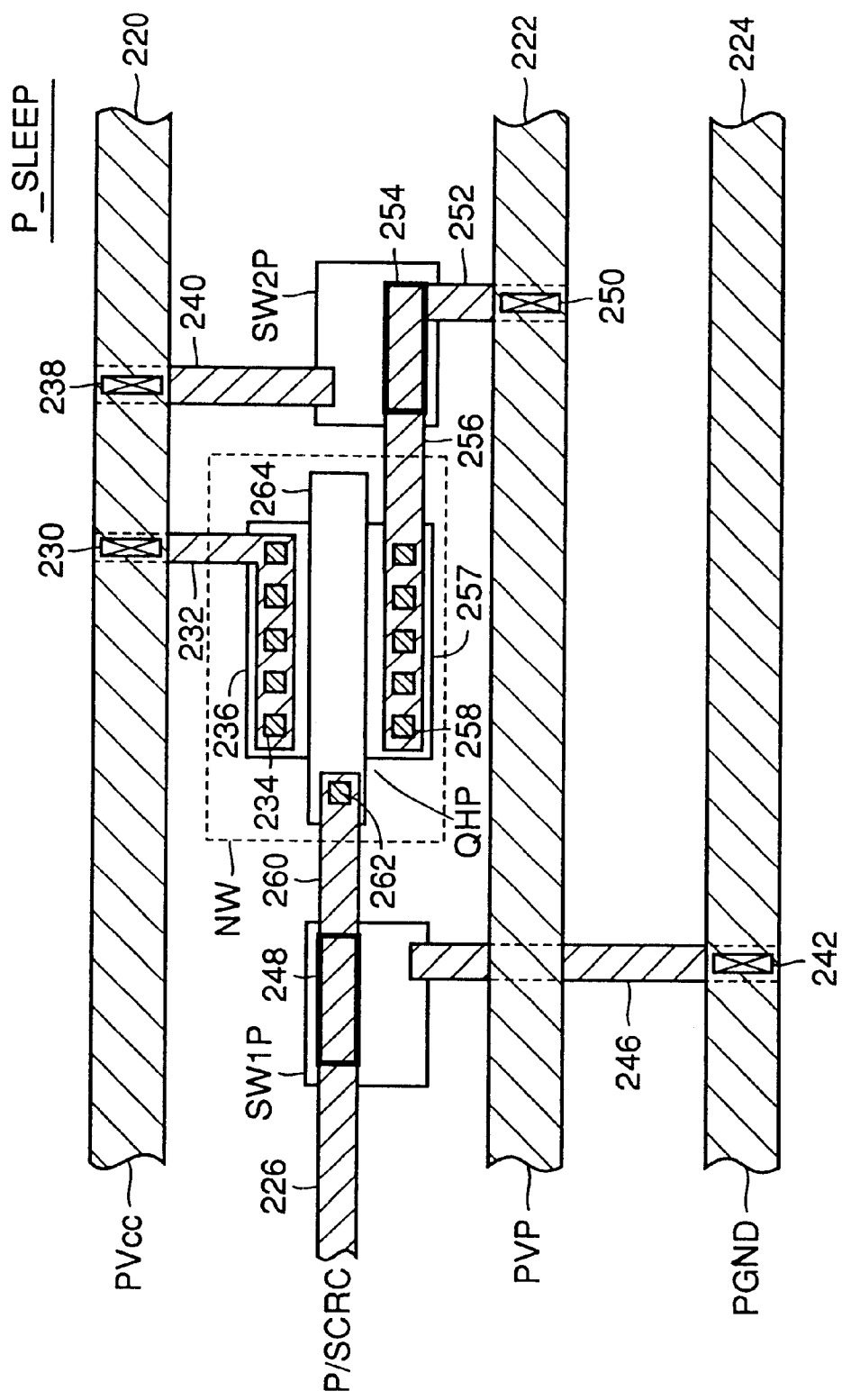
FIG. 17 illustrates the layout of the cell P_SLEEP shown in FIG. 12.

FIG. 17 illustrates the layout of the cell P_SLEEP shown in FIG. 12.

Referring to FIG. 17, the cell P_SLEEP includes second layer metal wires 220, 222 and 222 corresponding to the input nodes PVCC, PVP and PGND respectively, a first layer metal wire 226 corresponding to the input node P/SCRC and the P-channel MOS transistor QHP provided in an N well.

In the P-channel MOS transistor QHP, a source 236 is connected to the second layer metal wire 220 through contact cells 234 and 230 and a first layer metal wire 232, while a drain 257 is connected to a first layer metal wire 256 through a contact cell 258. A gate 264 made of polysilicon is connected to a first layer metal wire 260 through a contact cell 262.

In the switch SW1P, the first layer metal wire 260 is connected to either a first layer metal wire 246 connected to a second layer metal wire 224 through a contact cell 242 or the first layer metal wire 226 corresponding to the input node P/SCRC. In the state shown in FIG. 17, a first layer metal wire 248 which is a switching pattern is provided to connect the first layer metal wires 260 and 226 with each other.

In the switch SW2P, a first layer metal wire 256 is connected to either a first layer metal wire 252 connected to the second layer metal wire 222 through a contact cell 250 or a first layer metal wire 240 connected to the second layer metal wire 220 through a contact cell 238. In the state shown in FIG. 17, a first layer metal wire 254 which is a switching pattern is provided to connect the first layer metal wires 256 and 252 with each other.

Figure 18:
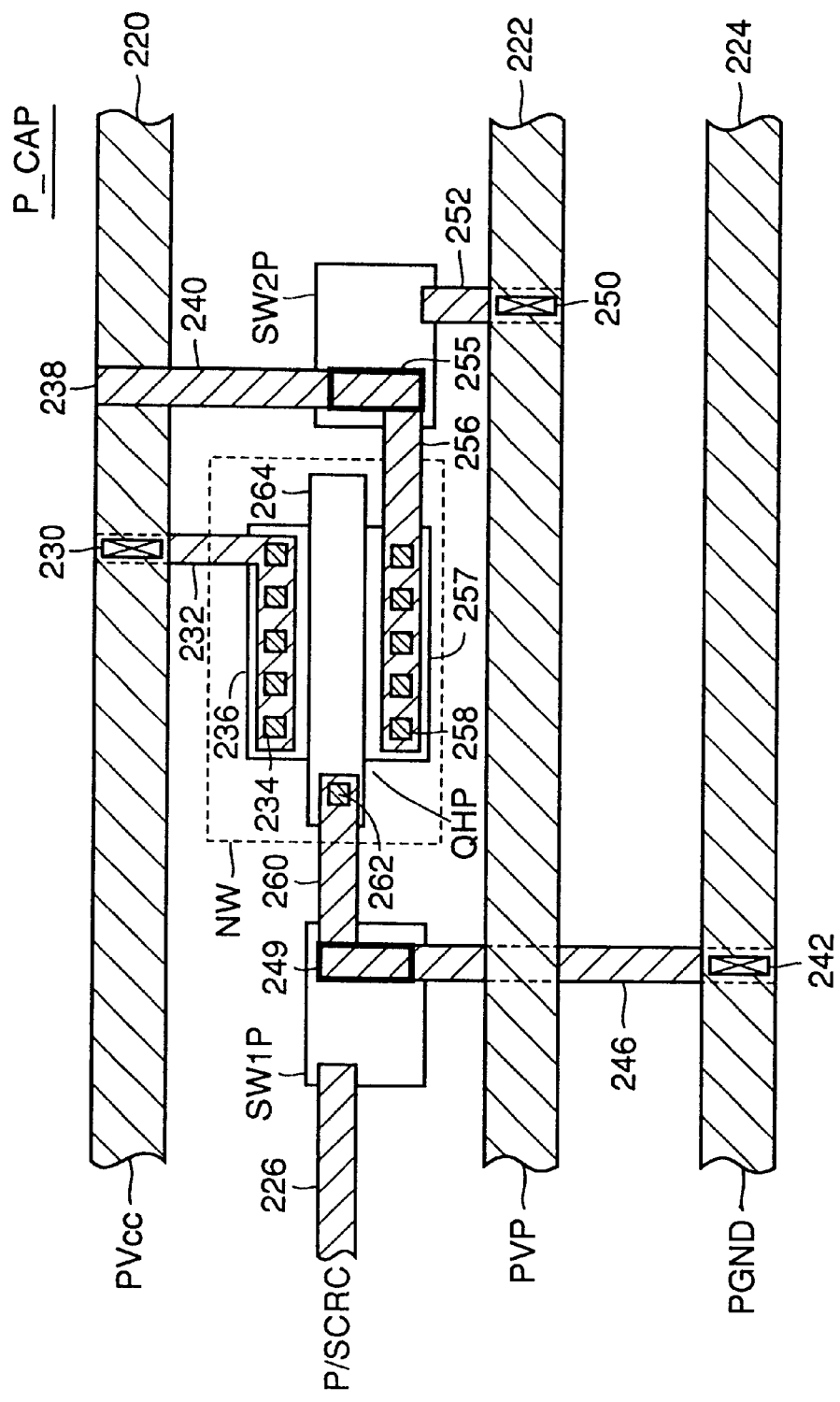
FIG. 18 illustrates the layout of the cell P_CAP shown in FIG. 13.

FIG. 18 illustrates the layout of the cell P_CAP shown in FIG. 13.

Referring to FIG. 18, a first layer metal wire 249 which is a switching pattern is provided to connect first layer metal wires 260 and 246 with each other in the switch SW1P, while a first layer metal wire 255 which is a switching pattern is provided to connect first layer metal wires 256 and 240 with each other in the switch SW2P in the cell P_CAP, dissimilarly to the cell P_SLEEP shown in FIG. 17. The remaining structure is similar to that of the cell P_SLEEP shown in FIG. 17, and hence redundant description.

Although not illustrated, the layouts of the cells N_SLEEP and N_CAP shown in FIGS. 14 and 15 can be readily created through the aforementioned layouts of the cells P_SLEEP and P_CAP.

FIG. 19 illustrates an exemplary circuit switching a switch with a fuse element and connection states.

Referring to FIG. 19, either node A or B is connected to a node Y in this switching circuit. A resistance R1 having a large resistance value is connected between the nodes A and Y. A fuse element H1 is connected between the nodes B and Y. When connecting the nodes B and Y with each other, the fuse element H1 is left intact. In this case, the nodes B and Y are connected with each other since the fuse element H1 has a low resistance value while the resistance R1 has a high resistance value.

When connecting the nodes A and Y with each other, the fuse element H1 is cut with a laser beam or the like. Then, the node Y is not influenced by the node B but connected with the node A.

Figure 20:
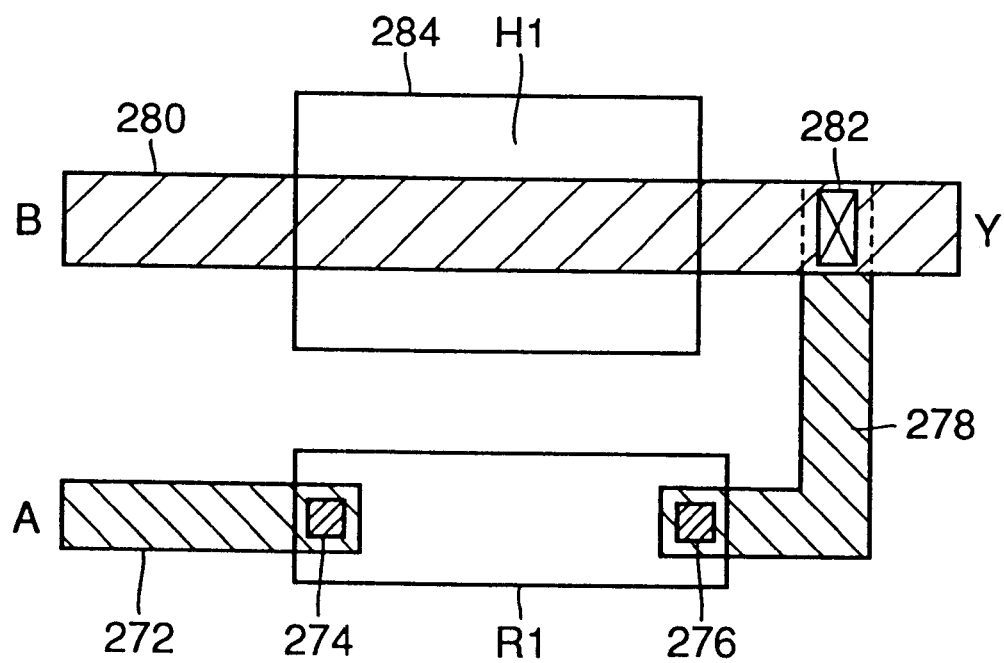
FIG. 20 is a diagram for illustrating the layout of a changeover switch including the fuse element shown in FIG. 19.

FIG. 20 is a diagram for illustrating the layout of a changeover switch including the fuse element H1 shown in FIG. 19.

Referring to FIGS. 19 and 20, this changeover switch includes a first layer metal wire 272 corresponding to the node A, a second layer metal wire 280 having a first end corresponding to the node B and a second end corresponding to the node Y, the resistance R1, and a first layer metal wire 278 for connecting the resistance R1 and the node Y with each other.

The resistance R1 is an N- or P-type impurity region having high resistance, for example. A first end of the resistance R1 is connected to the first layer metal wire 272 through a contact cell 274. A second end of the resistance R1 is connected to the first layer metal wire 278 through a contact cell 276.

A fuse blow window 284 is provided on a protective oxide film of a semiconductor substrate across the center of the second layer metal wire 280. In the second layer metal wire 280, a part enclosed with the fuse blow window 284 corresponds to the fuse element H1. In the second layer metal wire 280, a part closer to the node Y than the fuse blow window 284 is connected to the first layer metal wire 278 through a contact cell 282.

When arranging such a changeover switch on a corresponding region as the switch SW1P shown in FIG. 17 or the switch SW1N, connection can be changed also after formation of wires for switching a sleep transistor to a capacitor or vice versa.

Figure 21:
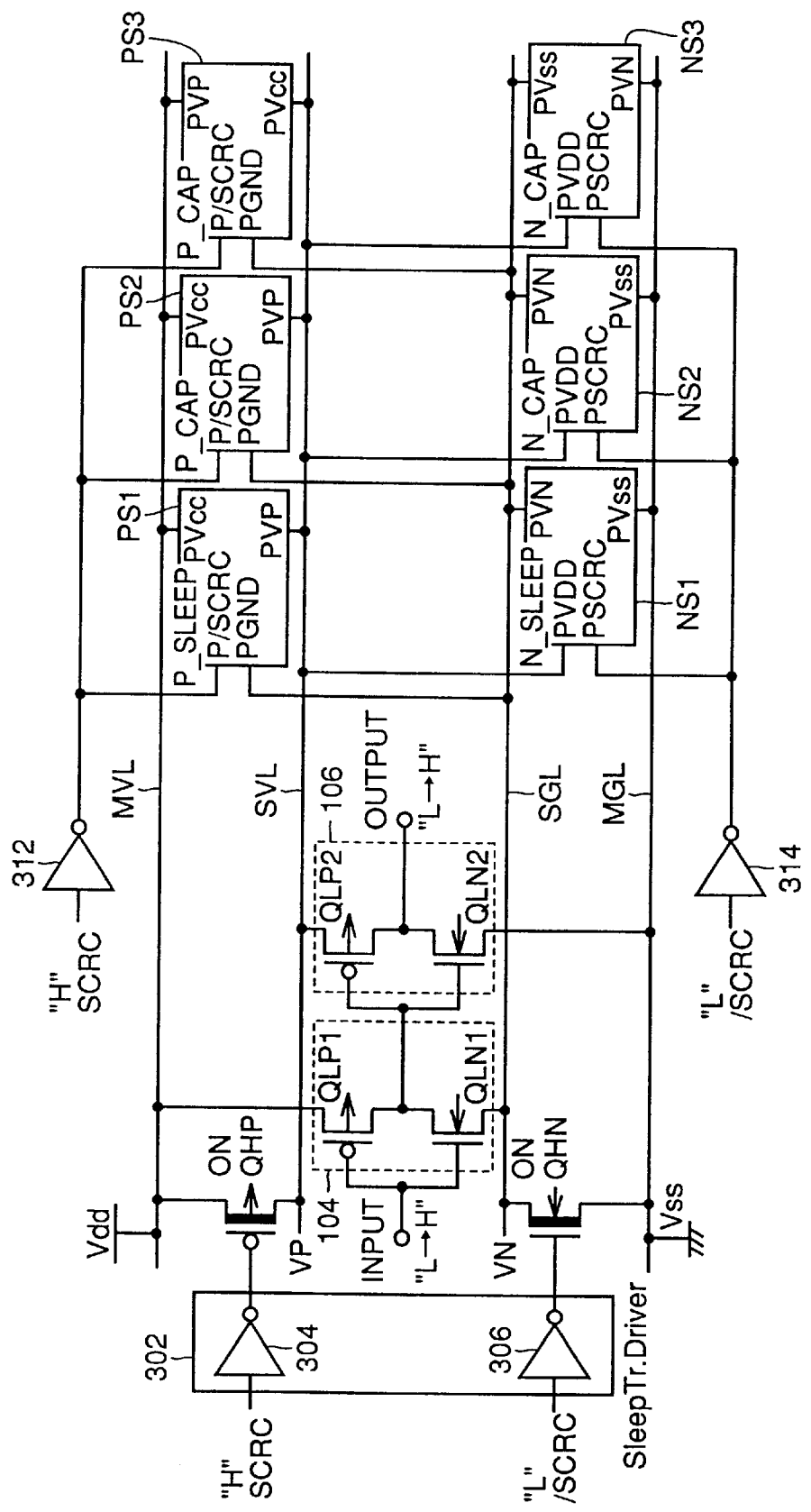
FIG. 21 illustrates exemplary arrangement of the circuit shown in FIGS. 12 to 15 on a circuit block having a hierarchical power supply structure.

FIG. 21 illustrates the circuit shown in FIGS. 12 to 15 arranged on a circuit block having a hierarchical power supply structure.

Referring to FIG. 21, this circuit includes power supply-to-power supply capacitance cells PS1 to PS3 and NS1 to NS3 in place of the power supply-to-power supply capacitance cell 102, an invertor 312 receiving and inverting a control signal SCRC and supplying the inverted signal to the power supply capacitance cells PS1 to PS3 and an invertor 314 receiving and inverting a control signal /SCRC and supplying the inverted signal to the power supply-to-power supply capacitance cells NS1 to NS3, dissimilarly to the circuit shown in FIG. 9. The remaining structure is similar to that of the circuit shown in FIG. 9, and hence redundant description is not repeated.

The power supply-to-power supply capacitance cell PS1 has the structure shown in FIG. 12, and operates as a sleep transistor provided between a main power supply line MVL and a sub power supply line SVL.

The power supply-to-power supply capacitance cells PS2 and PS3 have the structure shown in FIG. 13, and the power supply-to-power supply capacitance cell PS2 serves as a decoupling capacitance provided between the main power supply line MVL and a sub ground line SGL, while the power supply-to-power supply capacitance cell PS3 serves as a decoupling capacitance provided between the sub power supply line SVL and the sub ground line SGL.

The power supply-to-power supply capacitance cell NS1 has the structure shown in FIG. 14, and operates as a sleep transistor connected between a main ground line MGL and the sub ground line SGL.

The power supply-to-power supply capacitance cells NS2 and NS3 have the structure shown in FIG. 15, and the power supply-to-power supply capacitance cell NS2 serves as a decoupling capacitance provided between the sub power supply line SVL and the main ground line MGL, while the power supply-to-power supply capacitance cell NS3 serves as a decoupling capacitance provided between the sub power supply line SVL and the sub ground line SGL.

These power supply-to-power supply capacitance cells NS2 and NS3 have switching circuits including fuses and the like therein, and can be changed to sleep transistors at need.

By employing this structure, the number of sleep transistors, the number of power supply-to-power supply capacitances and the arrangement relation therebetween can be adjusted and optimized by actually operating an internal circuit and observing the current state of a sub power supply.

[Embodiment 3]

Figure 22:
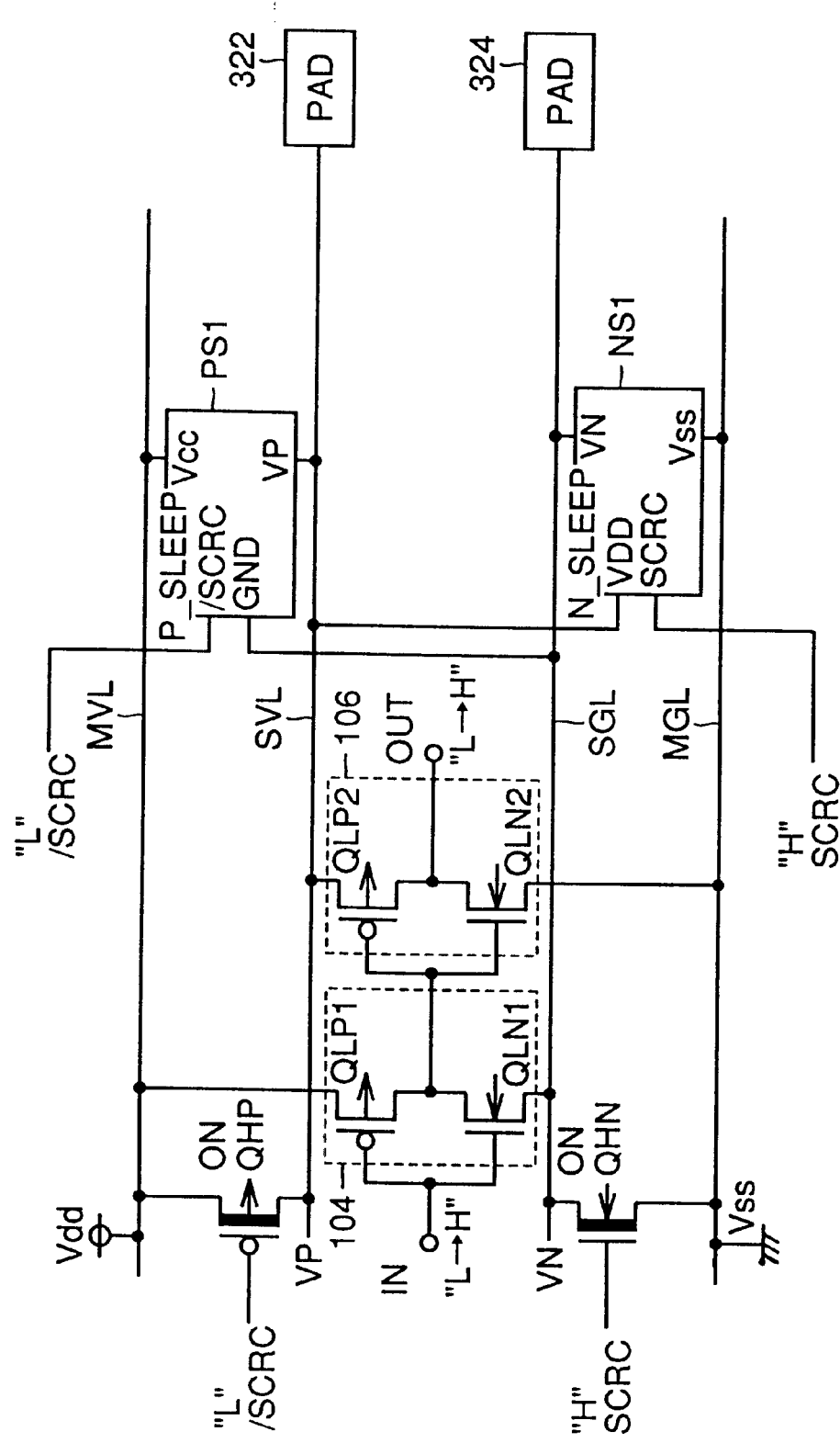
FIG. 22 illustrates the structure of a circuit block of a semiconductor device according to an embodiment 3.

FIG. 22 illustrates the structure of a circuit block of a semiconductor device according to an embodiment 3 of the present invention.

Referring to FIG. 22, this circuit block includes a main power supply line MVL supplied with a power supply potential Vdd, a main ground line MGL supplied with a ground potential Vss, a sub power supply line SVL supplied with the power supply potential Vdd by a P-channel MOS transistor QHP when a control signal /SCRC is at a low level, and a sub ground line SGL supplied with the ground potential Vss by an N-channel MOS transistor QHN when a control signal SCRC is at a high level.

This circuit block further includes serially connected invertors 104 and 106 as an exemplary internal circuit.

The invertor 104 includes a P-channel MOS transistor QLP1 and an N-channel MOS transistor QLN1 serially connected between the main power supply line MVL and the sub ground line SGL with gates receiving an input signal IN. A connection node between the P-channel MOS transistor QLP1 and the N-channel MOS transistor QLN1 outputs an output signal of the invertor 104.

The invertor 106 includes a P-channel MOS transistor QLP2 and an N-channel MOS transistor QLN2 serially connected between the sub power supply line SVL and the main ground line MGL with gates receiving the output of the invertor 104. The connection node between the P-channel MOS transistor QLP2 and the N-channel MOS transistor QLN2 outputs an output signal OUT of the invertor 106.

The P-channel MOS transistors QLP1 and QLP2 have threshold voltages lower than that of the P-channel MOS transistor QHP. The N-channel MOS transistors QLN1 and QLN2 have threshold voltages lower than that of the N-channel MOS transistor QHN.

The circuit block further includes power supply-to-power supply capacitance cells PS1 and NS1. The power supply-to-power supply capacitance cell PS1 has the circuit structure shown in FIG. 12, and operates as a sleep transistor. The power supply-to-power supply capacitance cell NS1 has a structure similar to that shown in FIG. 14, and operates as a sleep transistor. Therefore, redundant description is not repeated.

The circuit block further includes a pad 322 connected to the sub power supply line SVL and a pad 324 connected to the sub ground line SGL. The feature of the semiconductor device according to the embodiment 3 resides in the inclusion of these pads 322 and 324. While the power supply-to-power supply capacitance cells PS1 and NS1 are representatively singly shown on the power supply side and the ground side respectively, a plurality of power supply-to-power supply capacitance cells are provided in parallel in practice.

The number of power supply-to-power supply capacitance cells for operating as sleep transistors and arrangement thereof can be optimized by externally observing potential fluctuation of the sub power supply line SVL and the sub ground line SGL through the pads 322 and 324 and changing internal setting of the plurality of power supply-to-power supply capacitance cells.

Therefore, the power supply-to-power supply capacitance cells can be adjusted while actually operating the semiconductor device and observing the state of the sub power supply line SVL, for correctly and simply optimizing sleep transistors and power supply-to-power supply capacitances.

[Embodiment 4]

Figure 23:
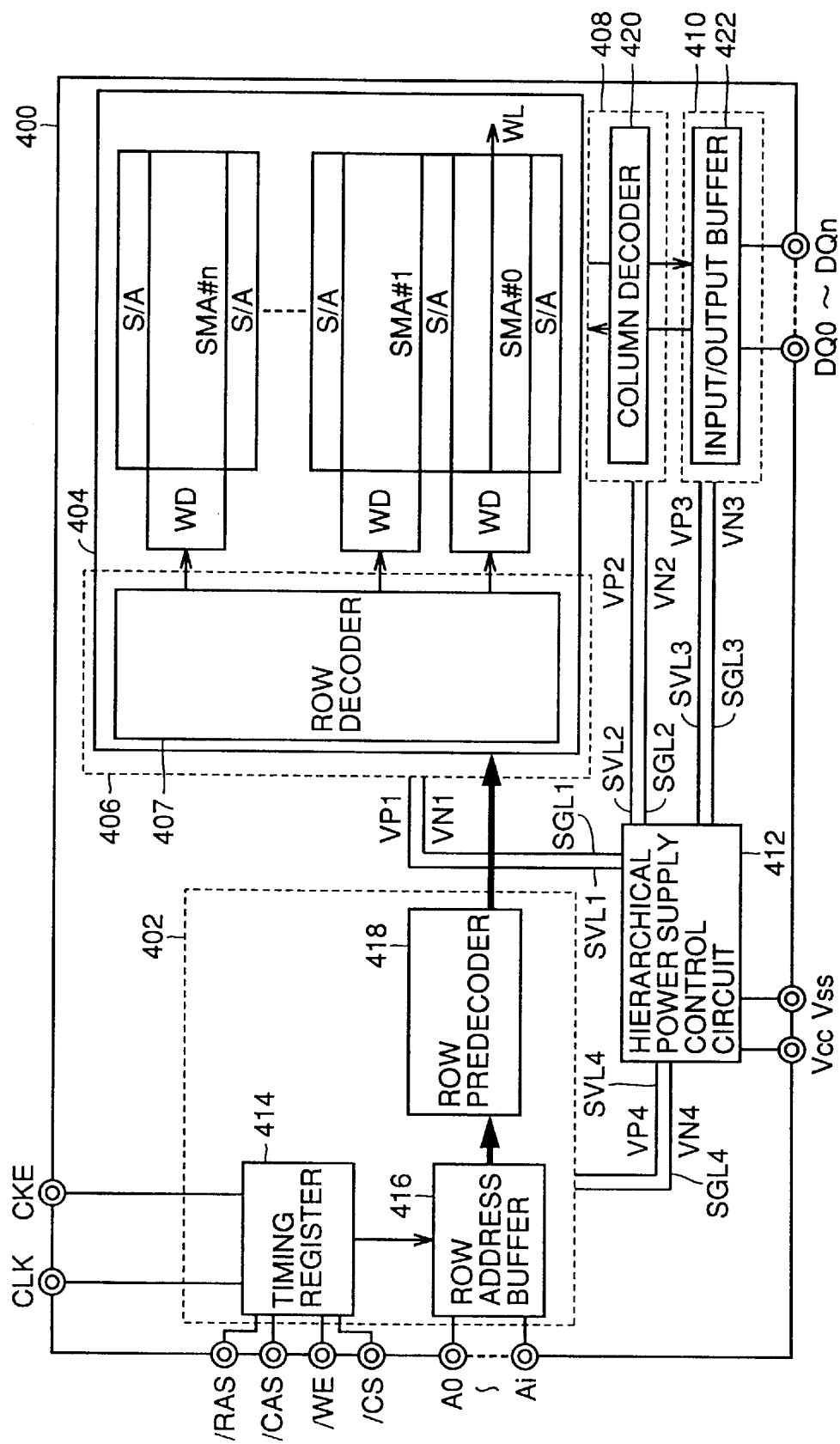
FIG. 23 is a block diagram schematically showing the structure of a semiconductor device according to an embodiment 4.

FIG. 23 is a block diagram schematically showing the structure of a semiconductor device 400 according to an embodiment 4 of the present invention.

Referring to FIG. 23, the semiconductor device 400 includes a timing register 414 incorporating control signals /RAS, /CAS, /WE and /CS in response to a clock signal CLK and a clock enable signal CKE, a row address buffer 416 incorporating address signals A0 to Ai (i: natural number) in accordance with a control signal from the timing register 414, a row predecoder 418 predecoding an internal row address signal incorporated by the row address buffer 416, an input/output buffer 422 transmitting/receiving data signals DQ0 to DQn to/from an external device, a column decoder 420 incorporating and decoding a column address in response to a control signal of the timing register 414, a memory array 404 having an address specified by the row predecoder 418 and the column decoder 420 for receiving the data signals DQ0 to DQn, and a hierarchical power supply control circuit 412 receiving a power supply potential Vcc and a ground potential Vss for controlling a hierarchical power supply.

The memory array 404 includes a row decoder 407 receiving the row address signal from the row predecoder 418 and decoding the same, and sub memory arrays SMA#0 to SMA#n writing data in corresponding memory cells in response to signals outputted from the row decoder 407 and the column decoder 420. Each sub memory array is provided with a word driver WD activating a word line WL and a sense amplifier S/A amplifying data of a memory cell read on a bit line.

The hierarchical power supply control circuit 412 controls sub power supply lines SVL1 to SVL4 and sub ground lines SGL1 to SGL4. The sub power supply line SVL1 and the sub ground line SGL1 supply power supply potentials VP1 and VN1 to a circuit block 406 including the row decoder 407. The sub power supply line SVL2 and the sub ground line SGL2 supply power supply potentials VP2 and VN2 to a circuit block 408 including the column decoder 420 respectively. The sub power supply line SVL3 and the sub ground line SGL3 supply power supply potentials VP3 and VN3 to a circuit block 410 including the input/output buffer 422 respectively. The sub power supply line SVL4 and the sub ground line SGL4 supply power supply potentials VP4 and VN4 to a circuit block 402 including the timing register 414, the row address buffer 416 and the row predecoder 418 respectively.

When the hierarchical power supply is thus split in units of circuit blocks or banks and has a plurality of sub power supply lines, arrangement of monitor pads corresponding to all sub power supply lines disadvantageously leads to increase of the chip area. A circuit structure for reducing the number of such monitor pads is shown with reference to the embodiment 4.

Figure 24:
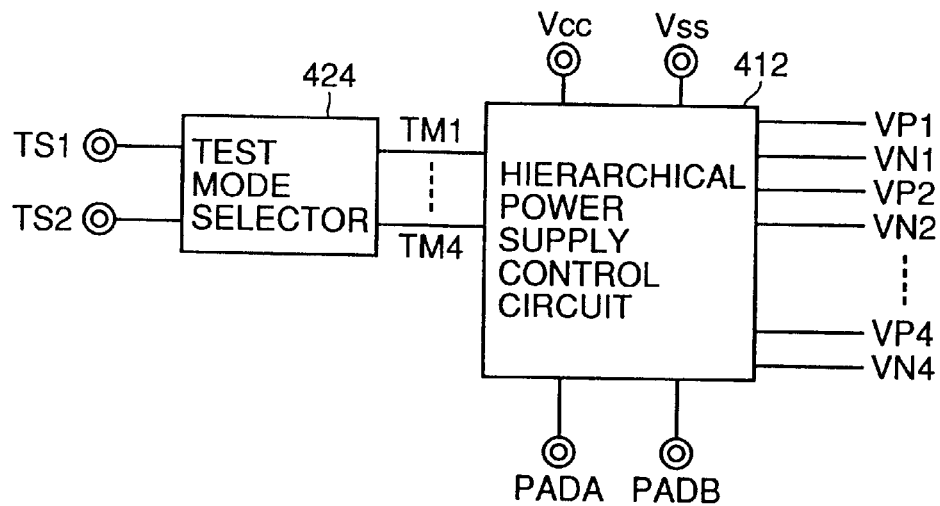
FIG. 24 is a schematic block diagram of a hierarchical power supply test circuit in the semiconductor device according to the embodiment 4.

FIG. 24 is a schematic block diagram of a hierarchical power supply test circuit in the semiconductor device according to the embodiment 4.

Referring to FIG. 24, this hierarchical power supply test circuit includes a test mode selector 424 receiving test signals TS1 and TS2 inputted from an external pad and decoding a combination thereof, and a hierarchical power supply control circuit 412 receiving output signals TM1 to TM4 from the test mode selector 424 and supplying any of power supply potentials VP1 to VP4 to a pad PADA while supplying any of power supply potentials VN1 to VN4 to a pad PADB.

Figure 25:
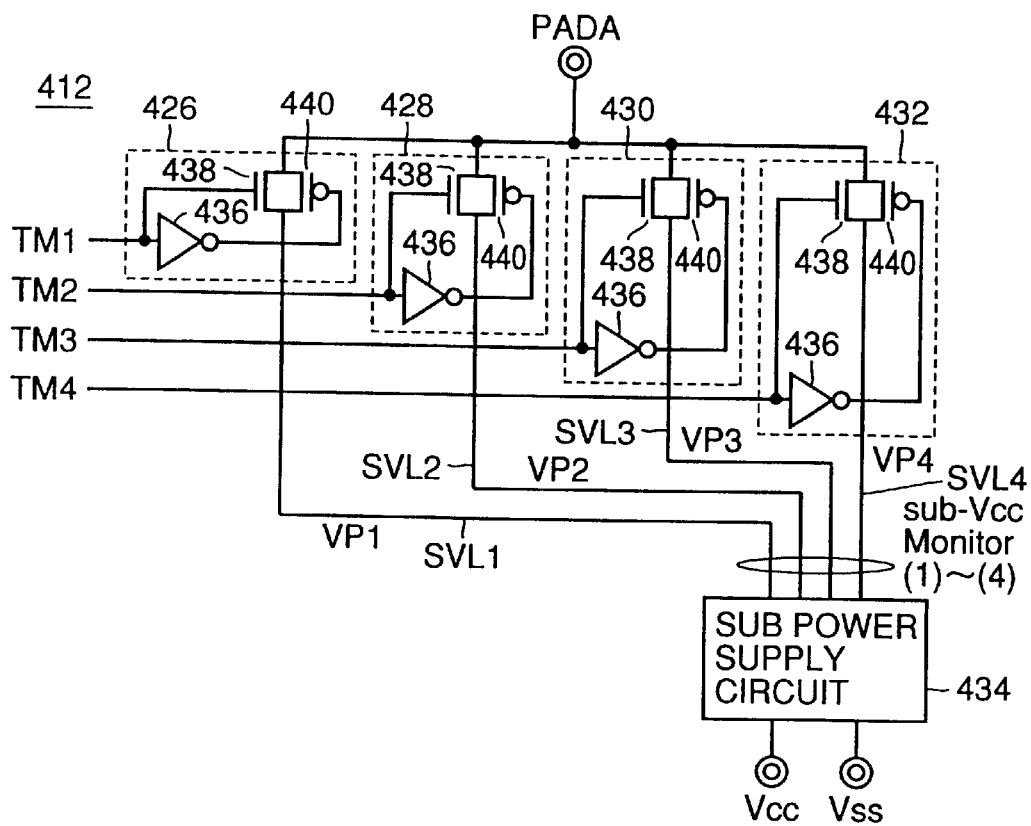
FIG. 25 is a circuit diagram showing the structure of a hierarchical power supply control circuit 412.

FIG. 25 is a circuit diagram showing the structure of the hierarchical power supply control circuit 412.

Referring to FIG. 25, the hierarchical power supply control circuit 412 includes a sub power supply circuit 434 receiving a power supply potential Vcc and a ground potential Vss and outputting the power supply potentials VP1 to VP4, a switching circuit 426 supplying the power supply potential VP1 to the pad PADA when the signal TM1 is at a high level, a switching circuit 428 supplying the power supply potential VP2 to the pad PADA when the signal TM2 is at a high level, a switching circuit 430 supplying the power supply potential VP3 to the pad PADA when the signal TM3 is at a high level, and a switching circuit 432 supplying the power supply potential VP4 to the pad PADA when the signal TM4 is at a high level.

The switching circuit 426 includes an invertor 436 receiving and inverting the signal TM1, an N-channel MOS transistor 438 connected between a sub power supply line SVL1 and the pad PADA with a gate receiving the signal TM1, and a P-channel MOS transistor 440 connected between the sub power supply line SVL1 and the pad PADA with a gate receiving an output of the invertor 436. The switching circuits 428, 430 and 432 are similar in structure to the switching circuit 426, and hence redundant description is not repeated.

Figure 26:
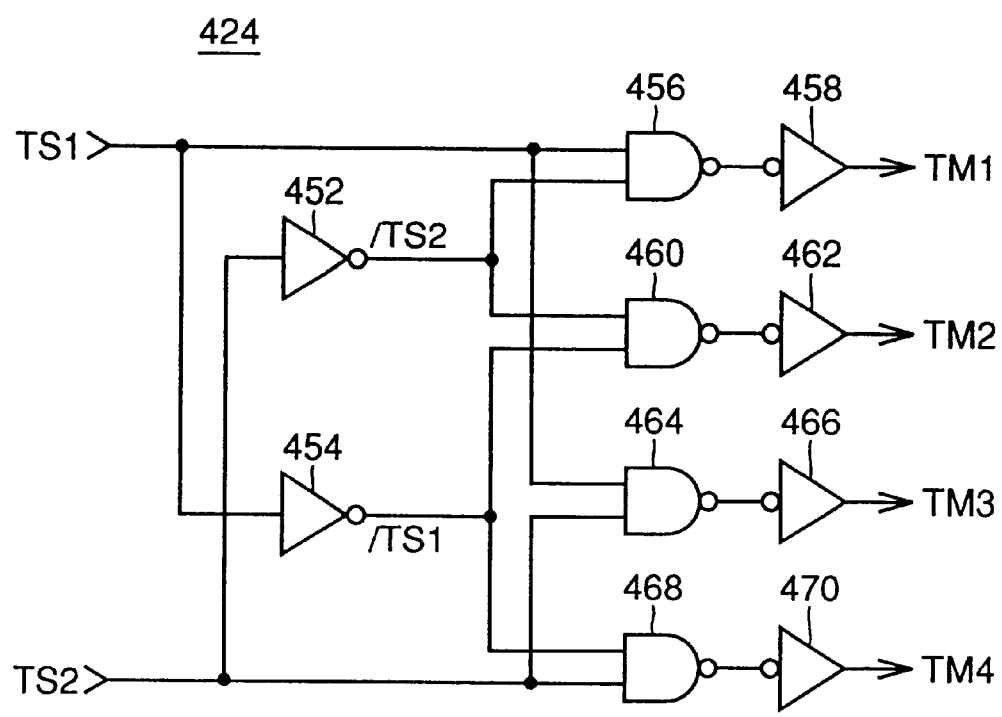
FIG. 26 is a circuit diagram showing the structure of a test mode selector 24 shown in FIG. 24.

FIG. 26 is a circuit diagram showing the structure of the test mode selector 424 shown in FIG. 24.

Referring to FIG. 26, the test mode selector 424 includes an invertor 454 receiving and inverting the test signal TS1 and outputting a signal /TS1, an invertor 452 receiving and inverting the test signal TS2 and outputting a signal /TS2, a NAND circuit 456 receiving the test signal TS1 and the signal /TS2, and an invertor 458 receiving and inverting an output of the NAND circuit 456 and outputting the signal TM1.

The test mode selector 424 further includes a NAND circuit 460 receiving the signals /TS2 and /TS1, an invertor 462 receiving and inverting an output of the NAND circuit 460 and outputting the signal TM2, a NAND circuit 464 receiving the test signals TS1 and TS2, an invertor 466 receiving and inverting an output of the NAND circuit 464 and outputting the signal TM3, a NAND circuit 468 receiving the signal /TS1 and the test signal TS2, and an invertor 470 receiving and inverting an output of the NAND circuit 468 and outputting the signal TM4.

By employing this structure, one of the signals TM1 to TM4 goes high in response to the logic combination of the test signals TS1 and TS2, so that a switching circuit corresponding thereto is rendered conductive to connect the monitor pad PADA with a monitor wire for the sub power supply line SVL. The test signals TS1 and TS2 for switching, which are inputted from dedicated pads, may alternatively be generated by a combination of input signals from pins exerting no influence on the operation.

In the semiconductor device according to the embodiment 4, as hereinabove described, the monitor pad PADA may not be provided for each sub power supply line, whereby the situation of each sub power supply line can be observed through a small number of monitor pads, and optimization of switching between power supply-to-power supply capacitances and sleep transistors can be adjusted in each circuit block similarly to the embodiment 3.

[Embodiment 5]

Figure 27:
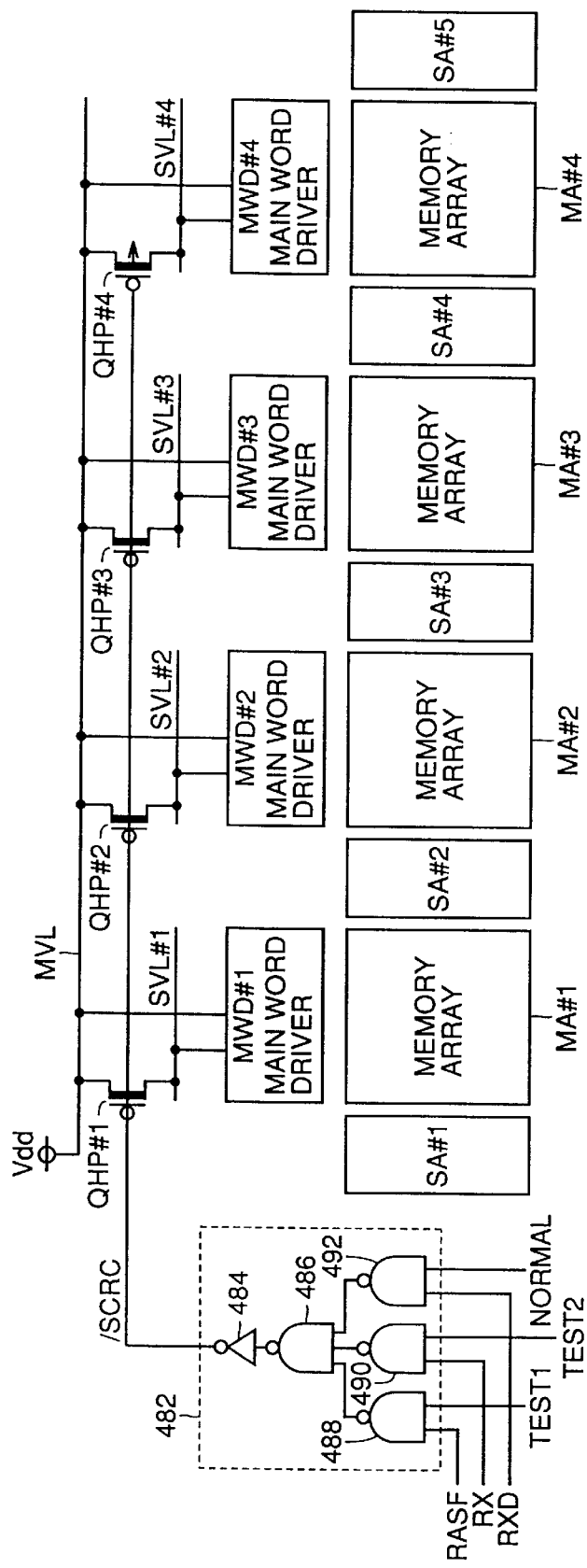
FIG. 27 is a circuit diagram showing a structure related to a row-system power supply wire in a semiconductor device according to an embodiment 5.

FIG. 27 is a circuit diagram showing a structure related to a row-system power supply wire of a semiconductor device according to an embodiment 5 of the present invention.

Referring to FIG. 27, the semiconductor device according to the embodiment 5 includes memory arrays MA#1 to MA#4 storing data, sense amplifiers SA#1 to SA#5 amplifying and reading data written in memory cells of the memory arrays MA#1 to MA#4, and main word drivers MWD#1 to MWD#4 activating word lines of the memory arrays MA#1 to MA#4.

Sub power supply lines SVL#1 to SVL#4 are provided in correspondence to the main word drivers MWD#1 to MWD#4 respectively. P-channel MOS transistors QHP#1 to QHP#4 which are sleep transistors are provided in correspondence to the sub power supply lines SVL#1 to SVL#4 respectively.

The sleep transistor QHP#1 is connected between a main power supply line MVL supplied with a power supply potential Vdd and the sub power supply line SVL#1 with a gate receiving a control signal /SCRC. The sleep transistor QHP#2 is connected between the main power supply line MVL and the sub power supply line SVL#2 with a gate receiving the control signal /SCRC. The sleep transistor QHP#3 is connected between the main power supply line MVL and the sub power supply line SVL#3 with a gate receiving the control signal /SCRC. The sleep transistor QHP#4 is connected between the main power supply line MVL and the sub power supply line SVL#4 with a gate receiving the control signal /SCRC.

The semiconductor device further includes a selection circuit 482 inverting one of row-system timing signals RASF, RX and RXD and outputting the inverted signal as the control signal /SCRC in response to states of signals TEST1, TEST2 and NORMAL.

The row-system timing signals RAS, RX and RXD are row-system reference signals generated by a control signal generally provided at the center of the chip for generating control signals from external command signal and clock signal.

The selection circuit 482 includes a NAND circuit 488 receiving the timing signal RASF and the signal TEST1, a NAND circuit 490 receiving the timing signal RX and the signal TEST2, a NAND circuit 492 receiving the timing signal RXD and the signal NORMAL, a three-input NAND circuit 486 receiving outputs of the NAND circuits 488, 490 and 492, and an invertor 484 receiving and inverting an output of the NAND circuit 486 and outputting the control signal /SCRC.

The timing signals RASF, RX and RXD are row-system control signals generated by the control signal generation circuit at the center of the chip on the basis of externally supplied signals ext./RAS, ext./CAS and ext./WE. For example, the signal RASF is the earliest row-system signal serving as the reference for activation of a bank or the like, the signal RX controls the timing for activating a word line, and the signal RXD controls the timing for activation of a sense amplifier.

Figure 28:
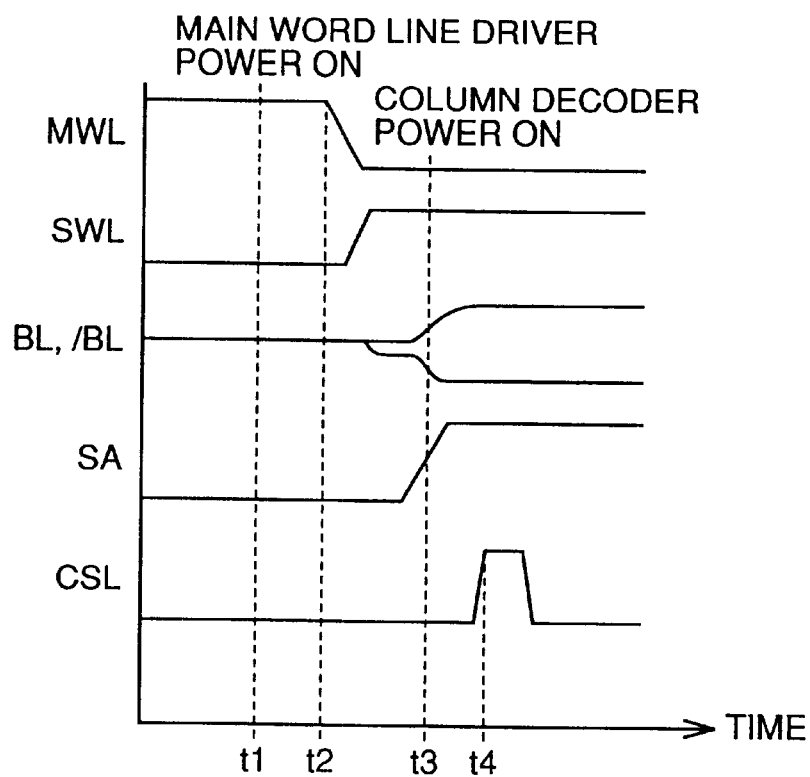
FIG. 28 is a waveform diagram for illustrating an activation timing for a sub power supply line connected to a word line driver and a column decoder.

FIG. 28 is a waveform diagram for illustrating an activation timing for a sub power supply line connected to a word line driver and a column decoder.

Referring to FIG. 28, a sub power supply line of a main word line driver is turned on in advance to an operation timing of a row-system circuit at a time t1, to prepare for an input signal such as a row address signal. At a time t2, the row address signal reaches each memory array, so that a main word line is activated, followed by activation of a sub word line SWL. Data of a memory cell corresponding to an address is read on a pair of bit lines BL and /BL, and a sense amplifier SA is activated to amplify the data.

A power supply line of a column decoder is turned on at a time t3, and then a column selection line is activated at a time t4, for selecting a corresponding bit line so that the data is read on a data bus.

A circuit having a hierarchical power supply structure connects a sub power supply line and a main power supply line with each other in units of a block of a certain degree of circuits. If the sub power supply line is excessively quickly activated, current consumption is increased due to leakage although a high-speed operation can be implemented. If the timing for activating the sub power supply line is delayed, an input signal such as an address signal is inputted to drive the circuit while the power supply potential of the sub power supply line is not sufficiently recovered and hence no high-speed operation can be attained although current consumption resulting from leakage can be suppressed.

Figure 29:
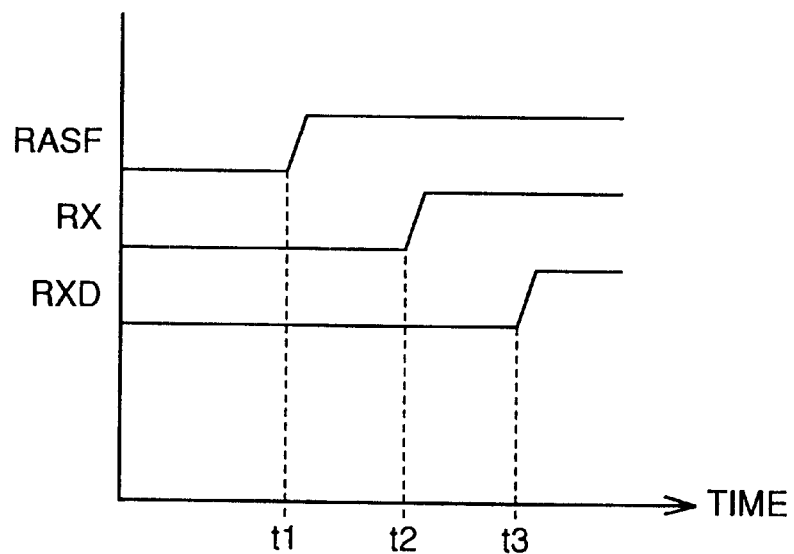
FIG. 29 is a waveform diagram for illustrating timings for activating timing signals RASF, RX and RXD.

FIG. 29 is a waveform diagram for illustrating timings for activating the timing signals RASF, RX and RXD.

Referring to FIG. 29, the row-system timing signal RASF is activated first, then the timing signal RX is activated, and then the timing signal RXD is activated.

Referring to FIGS. 27 and 29, the signal NORMAL is at a high level in an ordinary operation and hence each sub power supply line is turned on in accordance with activation of the timing signal RXD. When either signal TEST1 or TEST2 goes high after entering a test mode, a trigger signal for activating the sub power supply line is switched.

The point of this embodiment resides in that the sub power supply line is controlled with the latest signal in ordinary setting, while a test of starting charging the sub power supply line at an earlier timing can also be made.

An optimum timing compatibly attaining implementation of a high-speed operation and reduction of current consumption resulting from leakage can be evaluated by this test.

The optimum timing for activating the sub power supply line can be found out by providing the test circuit according to the embodiment 5.

[Embodiment 6]

Figure 30:
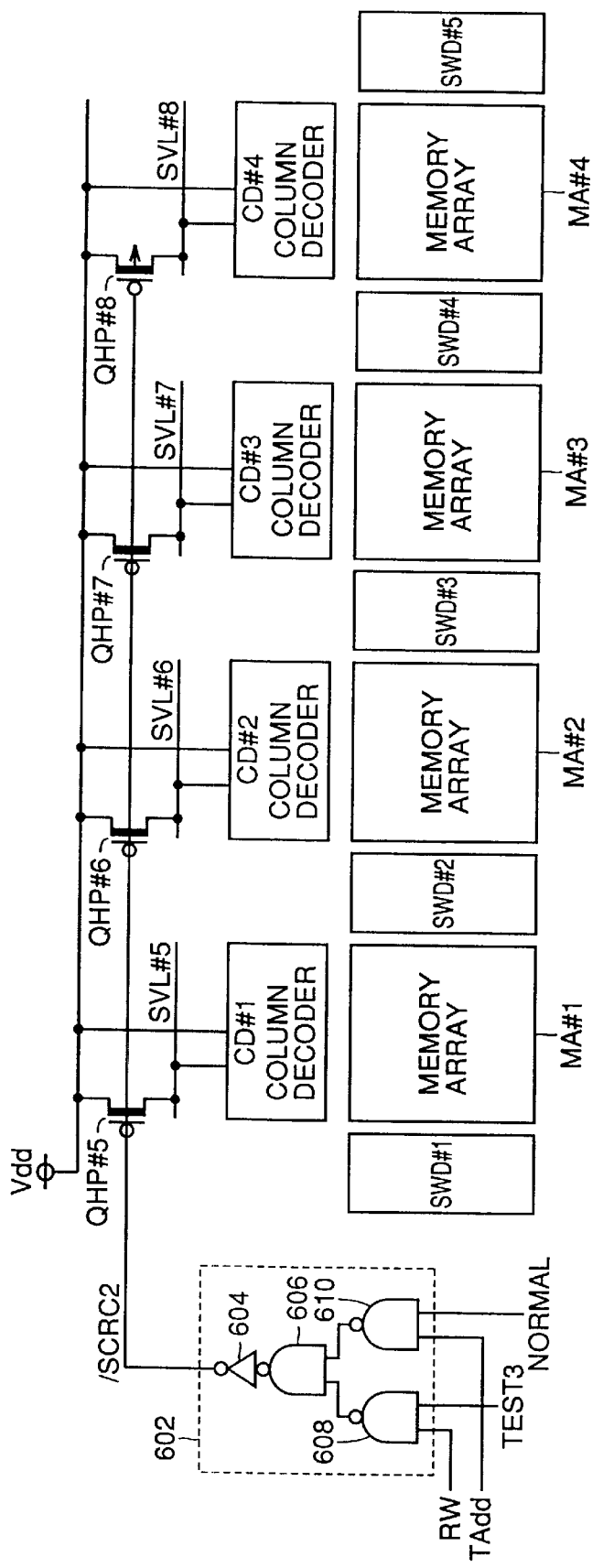
FIG. 30 is a circuit diagram showing a structure related to a column-system power supply wire in a semiconductor device according to an embodiment 6.

FIG. 30 is a circuit diagram showing a structure related to a column-system power supply wire of a semiconductor device according to an embodiment 6 of the present invention.

Referring to FIG. 30, the semiconductor device according to the embodiment 6 includes memory arrays MA#1 to MA#4 storing data, sub word drivers SWD#1 to SWD#5 driving sub word lines for accessing memory cells of the memory arrays MA#1 to MA#4, and column decoders CD#1 to CD#4 selecting bit lines of the memory arrays MA#1 to MA#4. Sub power supply lines SVL#5 to SVL#8 are provided in correspondence to the column decoders CD#1 to CD#4 respectively. P-channel MOS transistors QHP#5 to QHP#8 which are sleep transistors are provided in correspondence to the sub power supply lines SVL#5 to SVL#8 respectively.

The sleep transistor QHP#5 is connected between a main power supply line MVL supplied with a power supply potential Vdd and the sub power supply line SVL#5 with a gate receiving a control signal /SCRC2. The sleep transistor QHP#6 is connected between the main power supply line MVL and the sub power supply line SVL#6 with a gate receiving the control signal /SCRC2. The sleep transistor QHP#7 is connected between the main power supply line MVL and the sub power supply line SVL#7 with a gate receiving the control signal /SCRC2. The sleep transistor QHP#8 is connected between the main power supply line MVL and the sub power supply line SVL#8 with a gate receiving the control signal /SCRC2.

The semiconductor device further includes a selection circuit 602 selecting one of column-system timing signals RW and TAdd in response to states of signals TEST3 and NORMAL, inverts the same and outputs the inverted signal as the control signal /SCRC2.

The selection circuit 602 includes a NAND circuit 608 receiving the signals RW and TEST3, a NAND circuit 610 receiving the signals TAdd and NORMAL, a NAND circuit 606 receiving outputs of the NAND circuits 608 and 610, and an invertor 604 receiving and inverting an output of the NAND circuit 606 and outputting the control signal /SCRC2.

In a column-system operation, the signal RW which is a read/write identification clock is first supplied to each memory array, followed by supply of the signal TAdd indicating a timing for outputting a column address to each memory array. The signal TAdd changes slower than the signal RW by a time required for predecoding the address.

Therefore, the optimum timing for activating a hierarchical power supply line can be examined by switching the trigger signal between an ordinary mode and a test mode, similarly to the embodiment 5.

[Embodiment 7]

Figure 31:
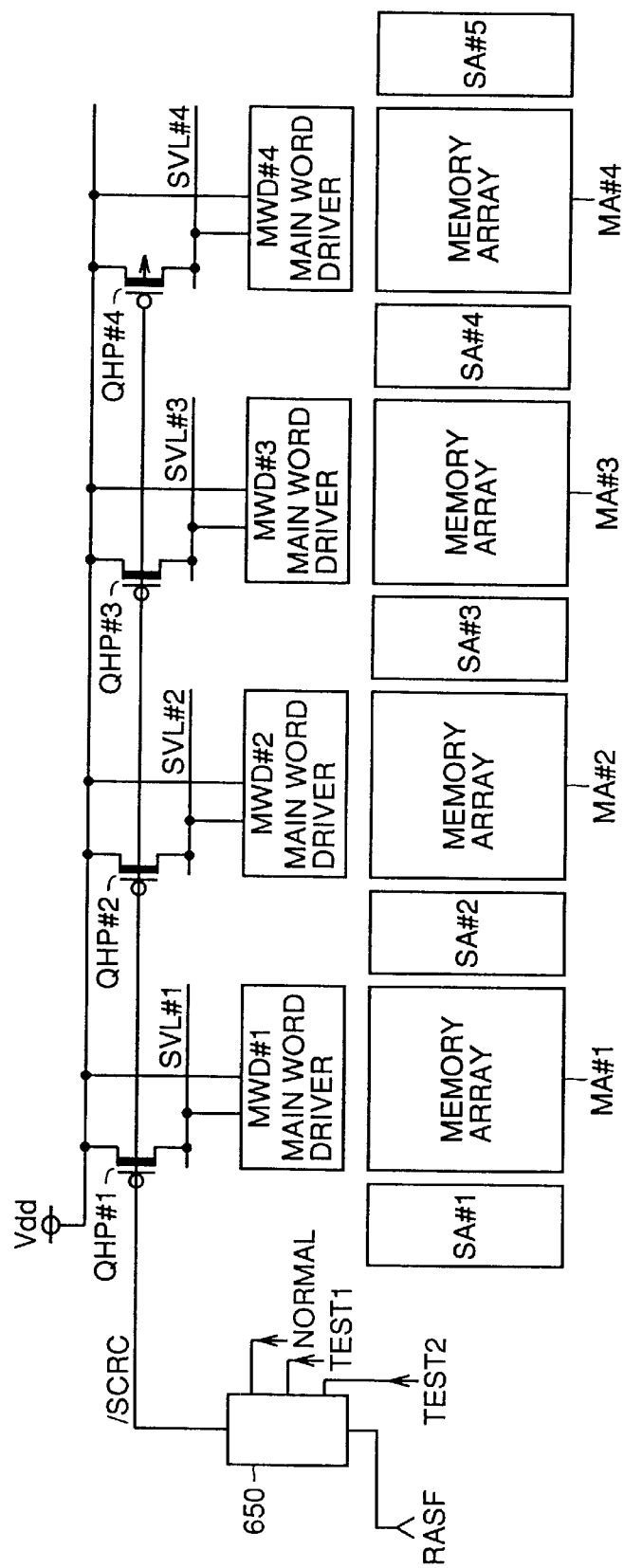
FIG. 31 is a circuit diagram showing a structure related to a power supply wire in a semiconductor device according to an embodiment 7.

FIG. 31 is a circuit diagram showing a structure related to a power supply wire of a semiconductor device according to an embodiment 7 of the present invention.

Referring to FIG. 31, the semiconductor device according to the embodiment 7 includes a delay circuit 650 receiving a timing signal RASF in place of the selection circuit 482, dissimilarly to the structure shown in FIG. 27. The remaining structure is similar to that shown in FIG. 27, and hence redundant description is not repeated.

Figure 32:
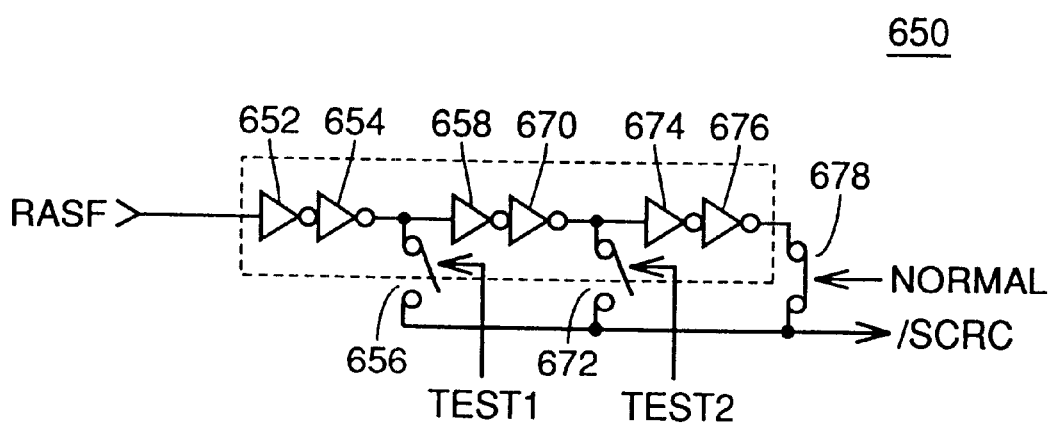
FIG. 32 is a circuit diagram showing the structure of a delay circuit 650.

FIG. 32 is a circuit diagram showing the structure of the delay circuit 650.

Referring to FIG. 32, the delay circuit 650 includes serially connected invertors 652 and 654 receiving the timing signal RASF, serially connected invertors 658 and 670 receiving an output of the invertor 654, and serially connected invertors 674 and 676 receiving an output of the invertor 670.

The delay circuit 650 further includes a switch 678 supplying an output of the invertor 676 to an output node as a control signal /SCRC when a signal NORMAL is in an active state, a switching circuit 656 supplying the output signal of the invertor 654 to the output node as the control signal /SCRC when a signal TEST1 is in an active state, and a switching circuit 672 supplying the output signal of the invertor 670 as the control signal /SCRC when a signal TEST2 is in an active state.

The timing for activating the control signal /SCRC can be quickened as compared with that in an ordinary operation by inactivating the signal NORMAL and activating either signal TEST1 or TEST2 in a test mode due to provision of the delay circuit 650, whereby an effect similar to that of the embodiment 1 can be attained for examining the optimum timing for activating a sub power supply line.

[Embodiment 8]

A semiconductor device according to an embodiment 8 of the present invention enables monitoring of a leakage current in a standby state of the semiconductor device having a hierarchical power supply structure.

Figure 33:
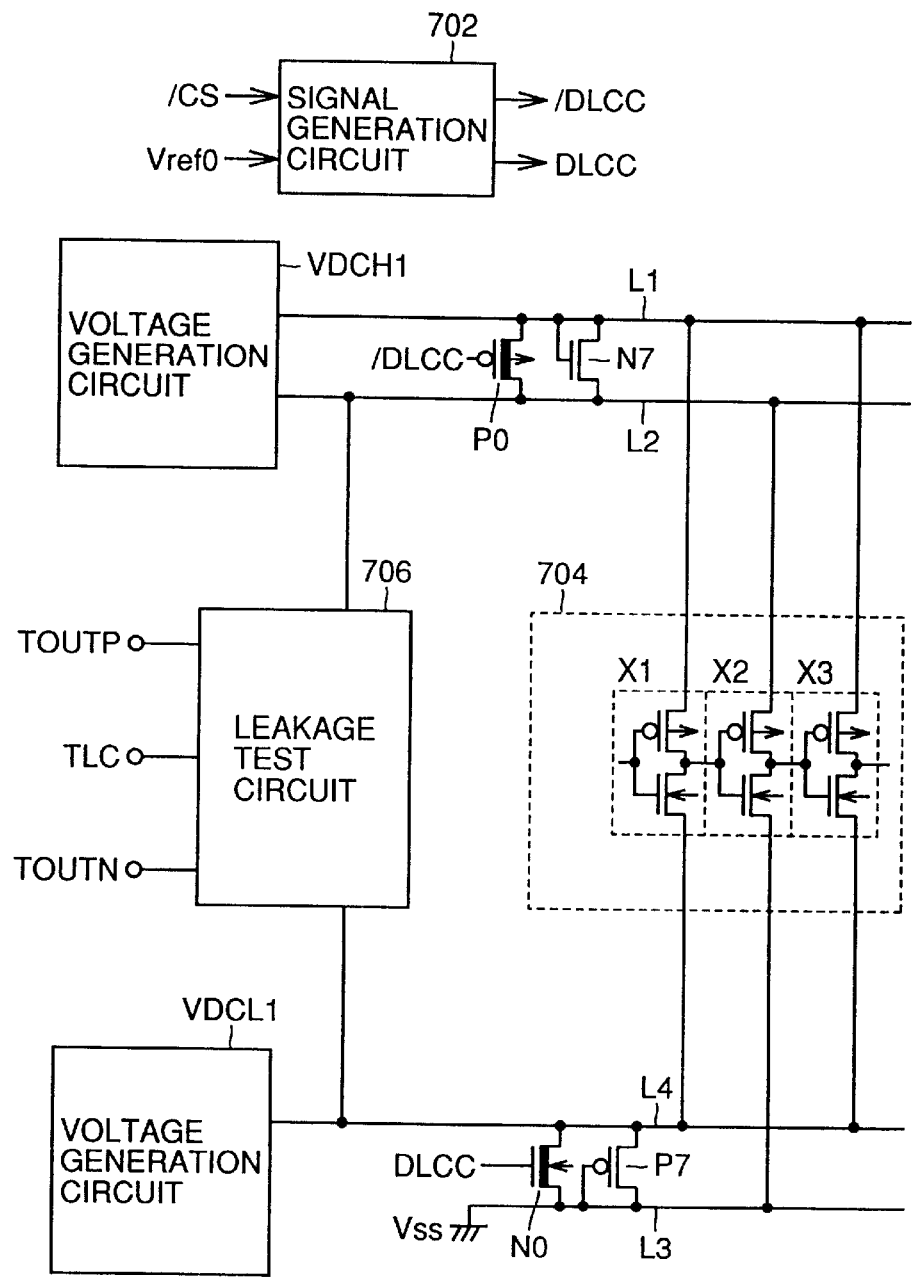
FIG. 33 illustrates the structure of a principal part of a leakage current test circuit in an embodiment 8.

FIG. 33 illustrates the structure of a principal part of a leakage current test circuit according to the embodiment 8.

Referring to FIG. 33, an internal circuit 704 is supplied with operating currents from a main power supply line L1, a sub power supply line L2, a main ground line L3 and a sub ground line L4. The internal circuit 704 includes an invertor X1 supplied with the operating currents from the main power supply line L1 and the sub ground line L4, an invertor X2 supplied with operating power supply currents from the sub power supply line L2 and the main ground line L3 for receiving and inverting an output of the invertor X1, and an invertor X3 supplied with operating power supply currents from the main power supply line L1 and the sub ground line L4 for receiving and inverting an output of the invertor X2. A sleep transistor P0 is provided between the main power supply line L1 and the sub power supply line L2. A sleep transistor N0 is connected between the main ground line L3 and the sub ground line L4. The sleep transistor P0 is a P-channel MOS transistor having a high threshold voltage with a gate receiving a control signal /DLCC. The sleep transistor N0 is an N-channel MOS transistor having a high threshold voltage with a gate receiving a control signal DLCC.

A signal generation circuit 702 is provided for receiving a control signal /CS and a reference potential Vref0 and generating the control signals /DLCC and DLCC for driving the sleep transistors P0 and N0.

Between the main power supply line L1 and the sub power supply line L2, further, a diode-connected N-channel MOS transistor N7 is provided for preventing the potential difference from exceeding a constant value. Between the sub ground line L4 and the main ground line L3, in addition, a diode-connected P-channel MOS transistor P7 is provided for preventing the potential difference from exceeding a constant value.

The potentials of the main power supply line L1 and the sub power supply line L2 are supplied by a voltage generation circuit VDCH1.

The potential of the sub ground line L4 is supplied by a voltage generation circuit VDCL1. The main ground line L3 is supplied with a ground potential Vss.

The sub power supply line L2 and the sub ground line L4 are connected with a leakage test circuit 706 for monitoring leakage-current generated in the internal circuit in response to the potentials thereof respectively. The leakage test circuit 706 is connected with external terminals TLC, TOUTP and TOUTN.

Figure 34:
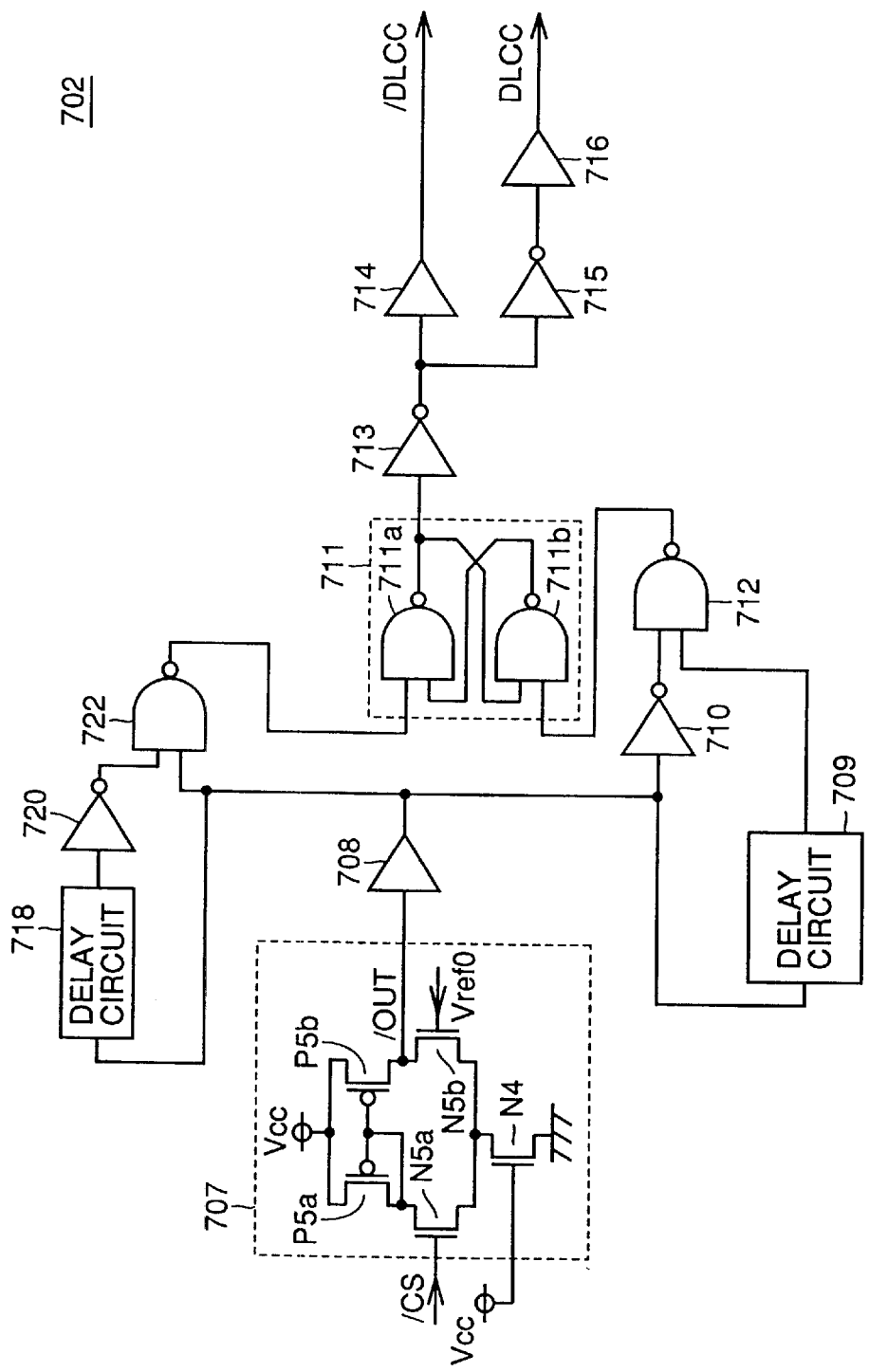
FIG. 34 is a circuit diagram showing the structure of a signal generation circuit 702.

FIG. 34 is a circuit diagram showing the structure of the signal generation circuit 702.

Referring to FIG. 34, the signal generation circuit 702 includes a differential amplifier circuit 707 receiving a control signal /CS, comparing the same with a reference potential Vref0 and outputting a signal /OUT, a buffer 708 receiving the output of the differential amplifier circuit 707, delay circuits 718 and 709 receiving and delaying an output of the buffer 708, an invertor 720 receiving and inverting an output of the delay circuit 718, a NAND circuit 722 receiving outputs of the buffer 708 and the invertor 720, an invertor 710 receiving and inverting the output of the buffer 708, and a NAND circuit 712 receiving outputs of the invertor 710 and the delay circuit 709.

The signal generation circuit 702 further includes a latch circuit 711 receiving outputs of the NAND circuits 722 and 712, an invertor 713 receiving and inverting an output of the latch circuit 711, a buffer 714 receiving an output of the invertor 713 and outputting the control signal /DLCC, an invertor 715 receiving and inverting the output of the invertor 713, and a buffer 716 receiving an output of the invertor 715 and outputting the control signal DLCC.

The differential amplifier circuit 707 includes an N-channel MOS transistor N4 having a gate supplied with a power supply potential Vcc and a drain coupled to the ground potential Vss, an N-channel MOS transistor N5a having a gate receiving the control signal /CS and a source connected to a drain of the N-channel MOS transistor N4, a P-channel MOS transistor P5a having a gate and a drain connected to a drain of the N-channel MOS transistor N5a and a source coupled to the power supply potential Vcc, an N-channel MOS transistor N5b having a gate receiving the reference potential Vref0 and a source connected to the drain of the N-channel MOS transistor N4, and a P-channel MOS transistor P5b having a gate connected to the N-channel MOS transistor N5a, a source coupled to the power supply potential Vcc and a drain connected to that of the N-channel MOS transistor N5b. The drain of the N-channel MOS transistor N5b outputs the signal /OUT.

The latch circuit 711 includes cross-coupled NAND circuits 711a and 711b. An input node of the NAND circuit 711a is supplied with the output of the NAND circuit 722. An input node of the NAND circuit 711b is supplied with the output of the NAND circuit 712. An output of the NAND circuit 711a is supplied to an input node of the invertor 713 as an output of the latch circuit 711.

The signal generation circuit 702 generates the control signals DLCC and /DLCC controlling the hierarchical power supply in response to fall/rise of the control signal /CS.

Figure 35:
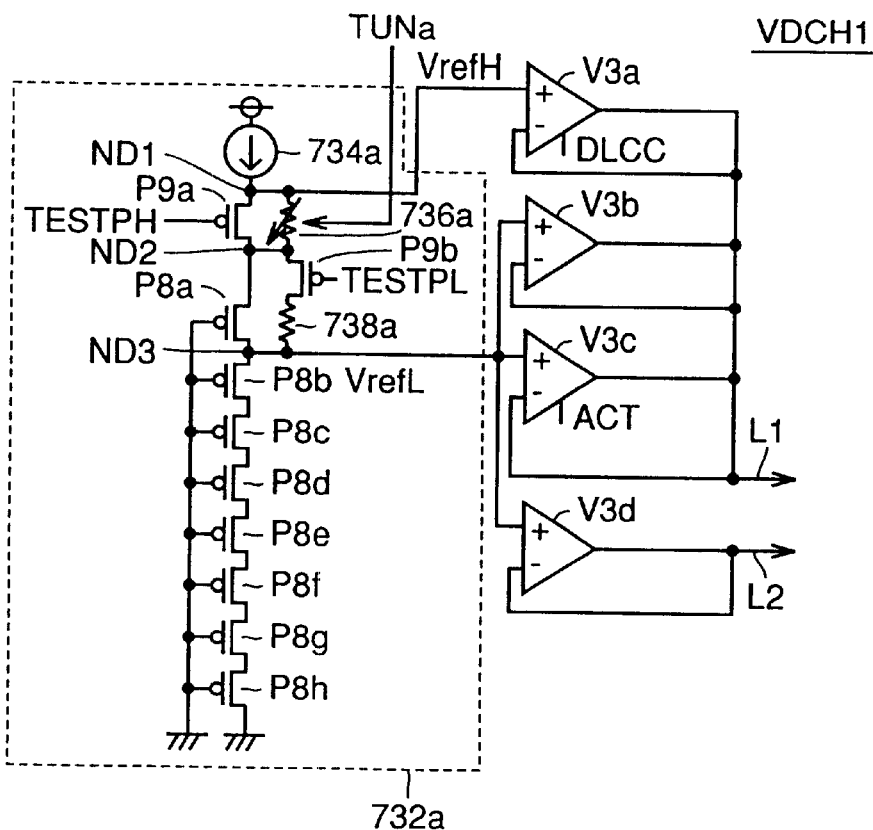
FIG. 35 is a circuit diagram showing the structure of a voltage generation circuit VDCH1.

FIG. 35 is a circuit diagram showing the structure of the voltage generation circuit VDCH1.

Referring to FIG. 35, the voltage generation circuit VDCH1 includes a reference potential generation circuit 732a generating reference potentials VrefH and VrefL, a differential amplifier V3a having a positive input node supplied with the reference potential VrefH and an output and a negative input node connected to the main power supply line L1 and activated in response to the control signal DLCC, a differential amplifier V3b having a positive input node supplied with the reference potential Vref and a negative input node and an output node connected to the main power supply line L1, a differential amplifier V3c having a positive input node supplied with the reference potential VrefL and a negative input node and an output node connected with the main power supply line L1 and activated in response to a signal ACT, and a differential amplifier V3d having a positive input node supplied with the reference potential VrefL and a negative input node and an output node connected to the sub power supply line L2.

The reference potential generation circuit 732a includes a constant current source 734a connected between a power supply node and a node ND1, a P-channel MOS transistor P9a and a variable resistance 736a connected in parallel between the node ND1 and a node ND2, a P-channel MOS transistor P8a connected between the node ND2 and a node ND3, a P-channel MOS transistor P9b and a resistance 738a serially connected between the nodes ND2 and ND3, and seven P-channel MOS transistors P8b to P8h serially connected between the node ND3 and a ground node.

The P-channel MOS transistor P9a has a gate receiving a control signal TESTPH. The P-channel MOS transistor P9b has a gate receiving a control signal TESTPL. Gates of the P-channel MOS transistors P8a to P8h are connected to the ground node. The resistance value of the variable resistance 736a changes in response to a control signal TUNa.

The control signal TESTPH is set low and the control signal TESTPL is set high in an ordinary operation. In the ordinary operation, therefore, the P-channel MOS transistor P9a is rendered conductive and the reference potential VrefH outputted from the node ND1 and the reference potential VrefL outputted from the node ND3 reach constant values regardless of the state of the control signal TUNa.

When executing a leakage monitor test, on the other hand, the control signal TESTPH is set high and the control signal TESTPL is set low. In the test, therefore, the P-channel MOS transistor P9a is rendered non-conductive, the resistance value of the variable resistance 736a change in response to the state of the control signal TUNa, and the values of the reference potentials VrefH and VrefL can be changed in response.

Figure 36:
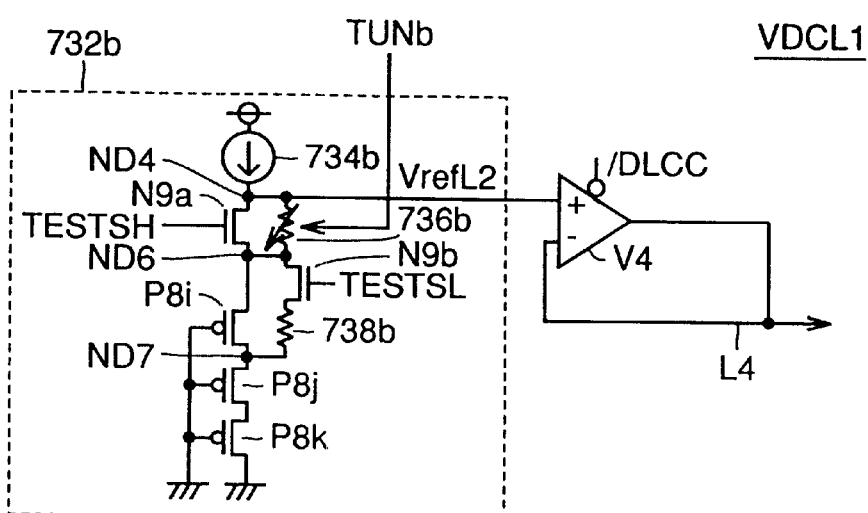
FIG. 36 is a circuit diagram showing the structure of a voltage generation circuit VDCL1.

FIG. 36 is a circuit diagram showing the structure of the voltage generation circuit VDCL1.

Referring to FIG. 36, the voltage generation circuit VDCL1 includes a reference potential generation circuit 732b generating a reference potential VrefL2, and a differential amplifier V4 having a positive input node supplied with the reference potential VrefL2 and a negative input node and an output node connected to the sub ground line L4 and activated in response to the control signal /DLCC.

The reference potential generation circuit 732b includes a constant current source 734b connected between a power supply node and a node ND4, an N-channel MOS transistor N9a connected between the node ND4 and a node ND6 with a gate receiving a control signal TESTSH, a variable resistance 736b connected between the nodes ND4 and ND6 with a resistance value changed in response to a control signal TUNb, a P-channel MOS transistor P8i connected between the node ND6 and a node ND7 with a gate connected to a ground node, an N-channel MOS transistor N9b and a resistance 738b serially connected between the nodes ND6 and ND7, and P-channel MOS transistors P8j and P8k serially connected between the node ND7 and the ground node with gates connected to the ground node.

The gate of the N-channel MOS transistor N9b receives a control signal TESTSL.

In the voltage generation circuit VDCL1, the control signal TESTSH is set high and the control signal TESTSL is set low in the ordinary operation. Therefore, the N-channel MOS transistor N9a is rendered conductive, and hence the reference potential VrefL2 reaches a constant value in the ordinary operation regardless of the state of the control signal TUNb.

When executing the leakage monitor test, the control signal TESTSH is set low and the control signal TESTSH is set high. In this case, the N-channel MOS transistor N9a is rendered non-conductive and the resistance value of the variable resistance 736b changes in response to the control signal TUNb, and hence the reference potential VrefL2 can be changed.

Figure 37:
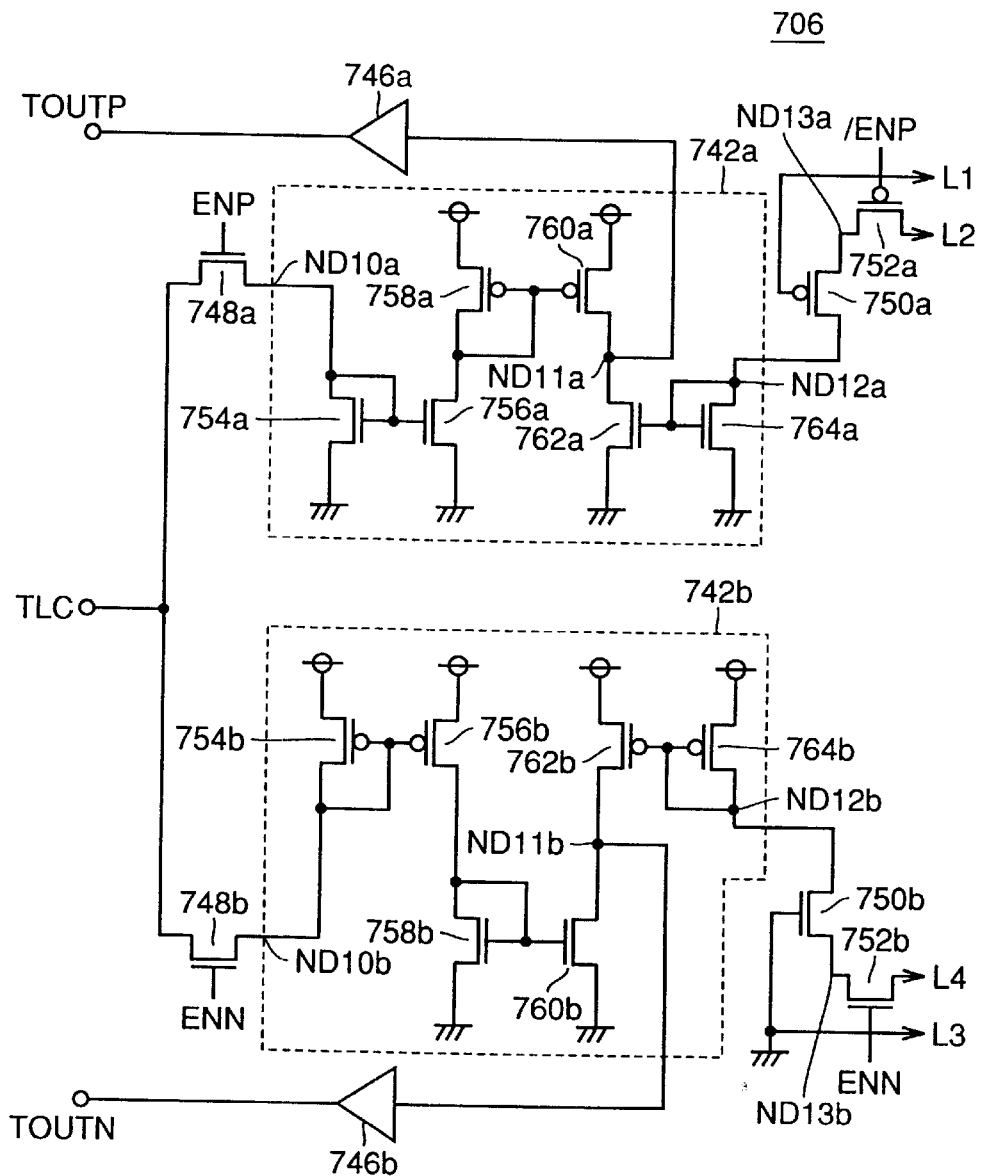
FIG. 37 is a circuit diagram showing the structure of a leakage test circuit 706 in FIG. 33.

FIG. 37 is a circuit diagram showing the structure of the leakage test circuit 706 shown in FIG. 33.

Referring to FIG. 37, the leakage test circuit 706 includes an N-channel MOS transistor 748a connected between the test terminal TLC and a node ND10a with a gate receiving a control signal ENP, a P-channel MOS transistor 752a connected between the sub power supply line L2 and a node ND13a with a gate receiving a control signal /ENP, a P-channel MOS transistor 750a connected between the node ND13a and a node ND12a with a gate connected to the main power supply line L1, a current compare circuit 742a comparing a current flowing into the node ND10a with that flowing into the node ND12a and outputting the result of comparison to a node ND11a, and a buffer 746a having an input connected to the node ND11a and an output connected to the test terminal TOUTP.

The leakage test circuit 706 further includes an N-channel MOS transistor 748b connected between the test terminal TLC and a node ND10b with a gate receiving a control signal ENN, an N-channel MOS transistor 752b connected between the sub ground line L4 and a node ND13b with a gate receiving the control signal ENN, an N-channel MOS transistor 750b connected between the node ND13b and a node ND12b with a gate connected to the main ground line L3, a current compare circuit 742b comparing a current flowing out from the node ND10b with that flowing out from the node ND12b and outputting the result of comparison to a node ND11b, and a buffer 746b having an input connected to the node ND11b and an output connected to the test terminal TOUTN.

The current compare circuit 742a includes an N-channel MOS transistor 754a having a gate and drain connected to the node ND10a and a source connected to a ground node, an N-channel MOS transistor 756a having a gate connected to the drain of the N-channel MOS transistor 754a and a source connected to a ground node, a P-channel MOS transistor 758a having a gate and a drain connected to the drain of the N-channel MOS transistor 756a and a source connected to a power supply node, a P-channel MOS transistor 760a connected between the node ND11a and a power supply node with a gate connected to the drain of the N-channel MOS transistor 756a, an N-channel MOS transistor 762a connected between the node ND11a and a ground node with a gate connected to the node ND12a, and an N-channel MOS transistor 764a having a gate and a drain connected to the node ND12a and a source connected to a ground node.

The current compare circuit 742b includes a P-channel MOS transistor 754b having a gate and a drain connected to the node ND10b and a source connected to a power supply node, a P-channel MOS transistor 756b having a gate connected to the node ND10b and a source connected to a power supply node, an N-channel MOS transistor 758b having a gate and a drain connected to the drain of the P-channel MOS transistor 756b and a source connected to a ground node, an N-channel MOS transistor 760b connected between the node ND11b and a ground node with a gate connected to the drain of the P-channel MOS transistor 756b, a P-channel MOS transistor 762b connected between a power supply node and the node ND11b with a gate connected to the node ND12b, and a P-channel MOS transistor 764b having a source connected to a power supply node and a gate and a drain connected to the node ND12b.

A circuit operation for a leakage test in the embodiment 8 is now described.

With reference to FIGS. 35 and 37, description is now made on the case of monitoring a leakage current generated in the internal circuit 704 in response to the potential of the main power supply line L1 and the sub power supply line L2. In this case, the control signal ENP is set high and the control signal ENN is set low. Thus, the gate of the P-channel MOS transistor 750a is connected with the main power supply line L1 and the source thereof is connected with the sub power supply line L2. This state is identical to that in a standby mode of a P-channel MOS transistor included in the invertor X2 shown in FIG. 33. Therefore, a leakage current similar to that flowing in a cut-off P-channel MOS transistor in the internal circuit 704 flows in the P-channel MOS transistor 750a. On the other hand, the node ND10a of the current compare circuit 742a is connected with the test terminal TLC since the N-channel MOS transistor 748a is rendered conductive. When externally feeding a current gradually into the test terminal TLC therefore, the current exceeds the leakage current of the P-channel MOS transistor 750a at a certain value, and hence a logical level outputted at the test terminal TOUTP is inverted. This current value is correlated with the leakage current of the P-channel MOS transistor 750a flowing in the internal circuit 704.

In order to attain a high-speed operation, the potential difference between the main power supply line L1 and the sub power supply line L2 is preferably minimized in a standby state. In order to reduce the leakage current in the P-channel MOS transistor in the internal circuit 704, on the other hand, the potential difference between the main power supply line L1 and the sub power supply line L2 is preferably maximized. Similarly to the above, the potential difference between the main ground line L3 and the sub ground line L4 is advantageously reduced in order to attain a high-speed operation in the standby state. In order to suppress a leakage current generated in an N-channel MOS transistor in the standby state of the internal circuit 704, however, the potential difference is preferably increased.

At this time, the potentials of the main power supply line L1 and the sub power supply line L2 can be changed by changing the control signal TUNa from the voltage generation circuit VDCH1 shown in FIG. 35, and it is possible to measure the optimum potentials of the main power supply line L1 and the sub power supply line L2 generating no leakage current.

When setting the control signal ENP low while setting the control signal ENN high, on the other hand, the N-channel MOS transistor 750b enters the same standby state as an N-channel MOS transistor included in the invertor X3 of the internal circuit 704, and hence a leakage current flowing in the N-channel MOS transistor of the internal circuit 704 can be monitored.

Also in this case, the potential of the sub ground line L4 can be changed by adjusting the control signal TUNb inputted in the voltage generation circuit VDCL1 shown in FIG. 35, and hence it is possible to measure the optimum potential of the sub power supply line L3 generating no leakage current.

[Embodiment 9]

Figure 38:
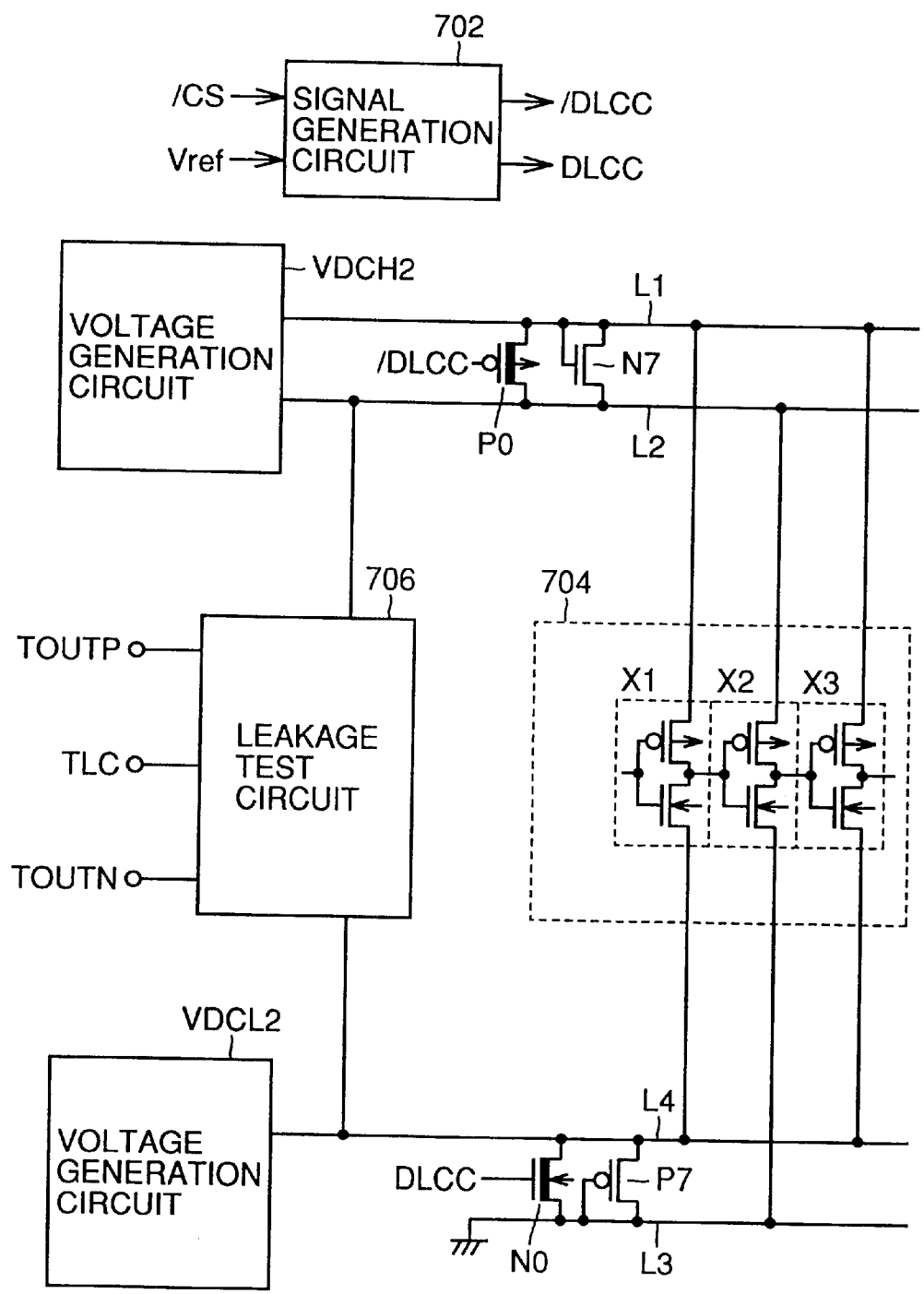
FIG. 38 is a circuit diagram showing a principal part of a circuit structure related to a leakage test in an embodiment 9.

FIG. 38 is a circuit diagram showing a principal part of a circuit structure related to a leakage test according to an embodiment 9 of the present invention.

Referring to FIG. 38, the circuit structure of a semiconductor device according to the embodiment 9 is different from that shown in FIG. 33 in a point that the same includes voltage generation circuits VDCH2 and VDCL2 in place of the voltage generation circuits VDCL1 and VDCL2 respectively. The remaining structure is similar to that of the circuit shown in FIG. 33, and hence redundant description is not repeated.

Figure 39:
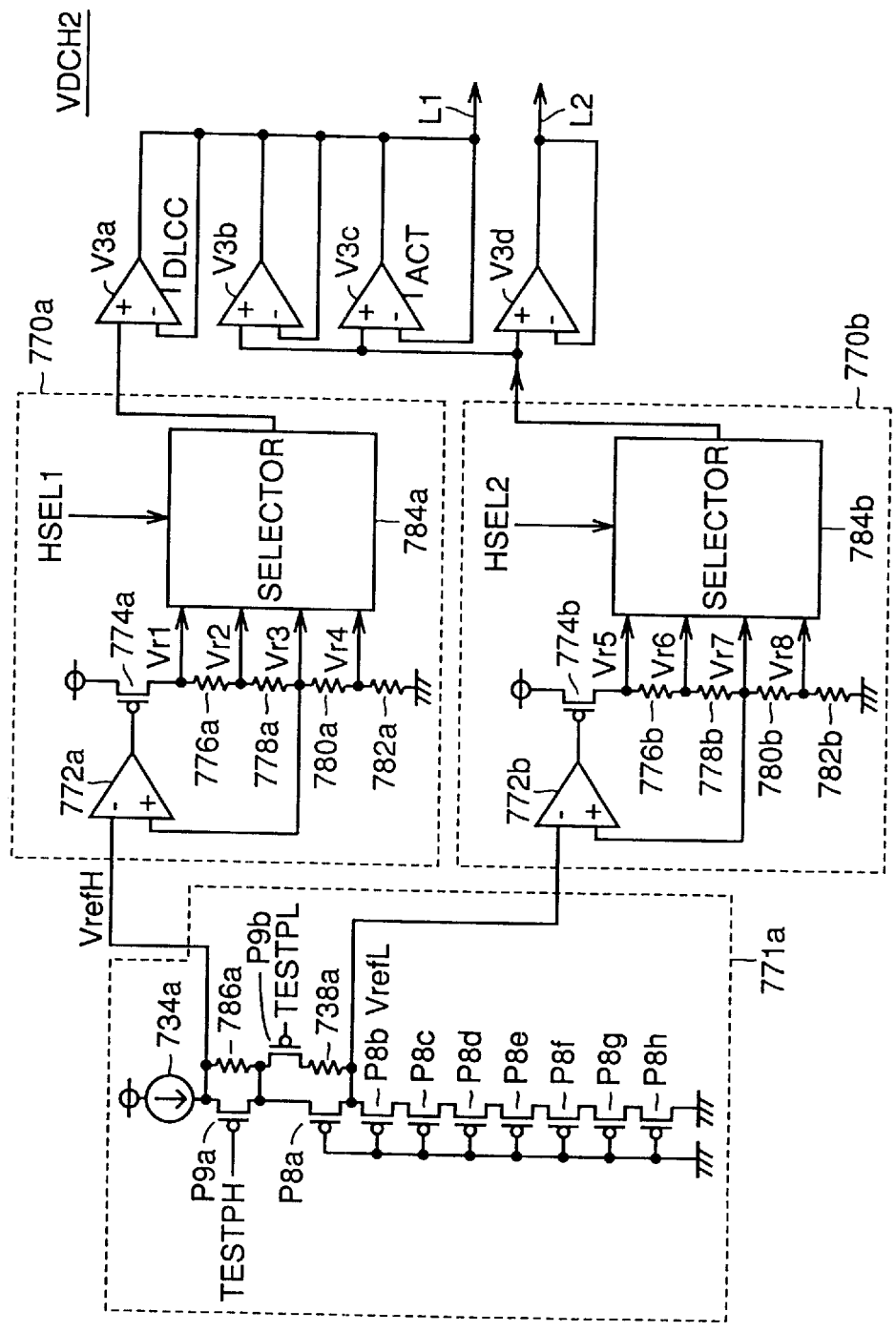
FIG. 39 is a circuit diagram showing the structure of a voltage generation circuit VDCH2 in FIG. 38.

FIG. 39 is a circuit diagram showing the structure of the voltage generation circuit VDCH2 shown in FIG. 38.

Referring to FIG. 39, the voltage generation circuit VDCH2 includes a reference voltage generation circuit 771a in place of the reference voltage generation circuit 732a, a voltage conversion circuit 770a receiving a reference potential VrefH outputted from the reference voltage generation circuit 771a, converting the same and supplying the converted potential to a differential amplifier V3a and a voltage conversion circuit 770b receiving a reference potential VrefL, converting the same and supplies the converted potential to positive input nodes of differential amplifiers V3b, V3c and V3d, dissimilarly to the voltage generation circuit VDCH1 shown in FIG. 35. The remaining structure is similar to that of the voltage generation circuit VDCH1, and hence redundant description is not repeated.

The reference potential generation circuit 771a includes a resistance 786a in place of the variable resistance 736a, dissimilarly to the reference potential generation circuit 732a shown in FIG. 35. The remaining structure is similar to that of the reference potential generation circuit 732a, and hence redundant description is not repeated.

The voltage conversion circuit 770a includes a compare circuit 772a having a negative input node receiving the reference potential VrefH generated by the reference potential generation circuit 771a, a P-channel MOS transistor 774a having a gate receiving an output of the compare circuit 772a and a source connected to a power supply node, and resistances 776a, 778a, 780a and 782a serially connected between a drain of the P-channel MOS transistor 774a and a ground node.

Output nodes of the P-channel MOS transistor 774a and the resistance 776a are at a converted potential Vr1. Output nodes of the resistances 776a and 778a are at a converted potential Vr2. A connection node between the resistances 778a and 780a is at a converted potential Vr3. Output nodes of the resistances 780a and 782a are at a converted potential Vr4. The converted potential Vr3 is supplied to a positive input node of the compare circuit 772a.

The voltage conversion circuit 770a further includes a selector 784a receiving the converted potentials Vr1 to Vr4 and outputting any one of the converted potentials Vr1 to Vr4 in response to a selection signal HSEL1. The output of the selector 784a is supplied to a positive input node of the differential amplifier V3a.

The voltage conversion circuit 770b includes a compare circuit 772b having a negative input node receiving the reference potential VrefH generated by the reference potential generation circuit 771a, a P-channel MOS transistor 774b having a gate receiving an output of the compare circuit 772b and a source connected to a power supply node, and resistances 776b, 778b, 780b and 782b serially connected between a drain of the P-channel MOS transistor 774b and a ground node.

Output nodes of the P-channel MOS transistor 774b and the resistance 776b are at a converted potential Vr5. Output nodes of the resistances 776b and 778b are at a converted potential Vr6. A connection node between the resistances 778b and 780b is at a converted potential Vr7. Output nodes of the resistances 780b and 782b are at a converted potential Vr8. The converted potential Vr7 is supplied to a positive input node of the compare circuit 772b.

The voltage conversion circuit 770b further includes a selector 784b receiving the converted potentials Vr5 to Vr8 and outputting any one of the converted potentials Vr5 to Vr8 in response to a selection signal HSEL2. The output of the selector 784b is supplied to positive input nodes of the differential amplifiers V3b, V3c and V3d.

Figure 40:
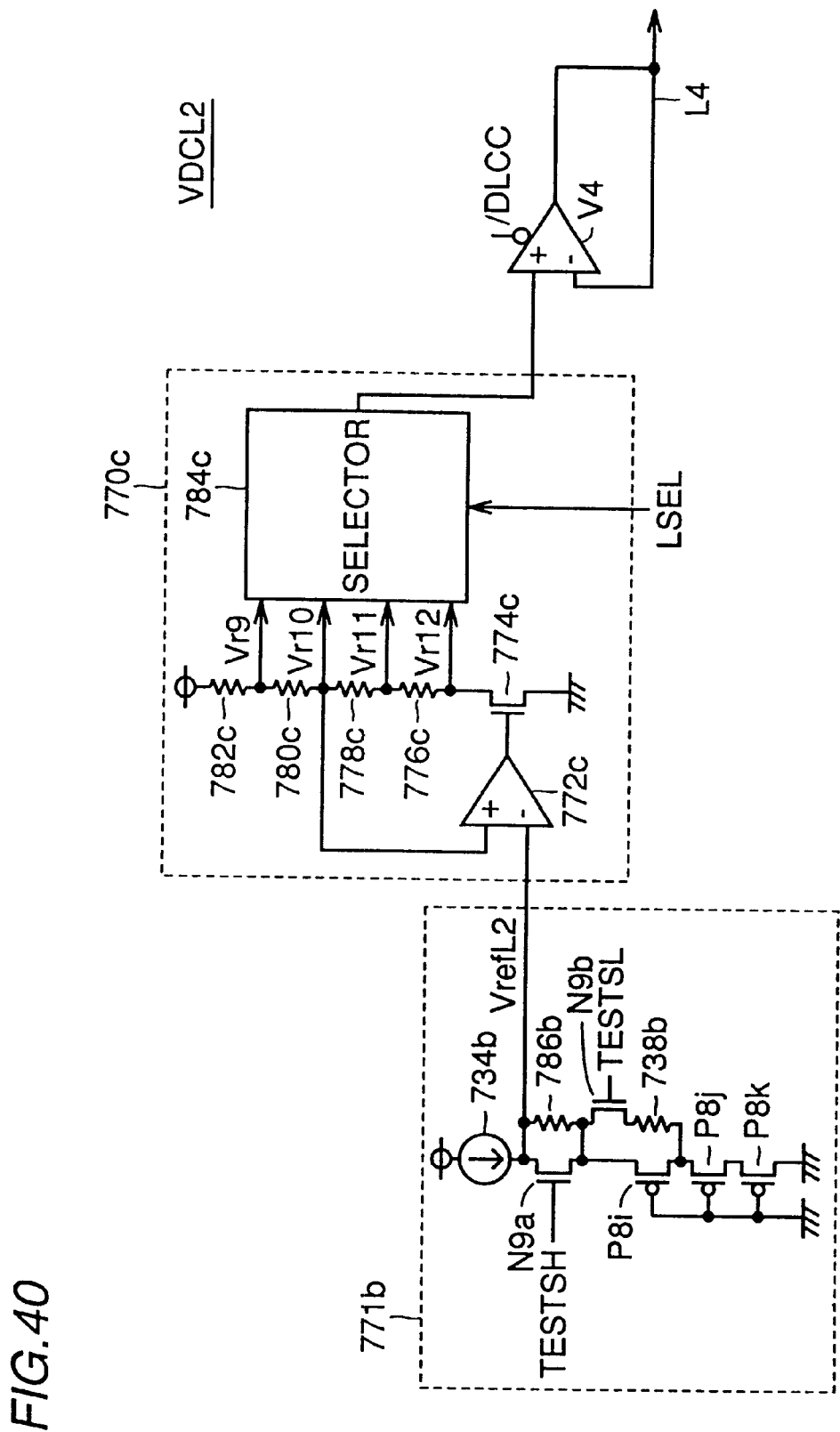
FIG. 40 is a circuit diagram showing the structure of a voltage generation circuit VDCL2.

FIG. 40 is a circuit diagram showing the structure of the voltage generation circuit VDCL2.

Referring to FIG. 40, the voltage generation circuit VDCL2 includes a reference potential generation circuit 771b generating a reference potential VrefL2, a voltage conversion circuit 770c converting the reference potential VrefL2 generated from the reference potential generation circuit 771b, and a differential amplifier V4 having a positive input node receiving an output of the voltage conversion circuit 770c and an output node and a negative node connected to a sub ground line L4 and activated in response to a control signal /DLCC.

The reference voltage generation circuit 771b includes a resistance 786b in place of the variable resistance 736b, dissimilarly to the reference voltage generation circuit 732b shown in FIG. 36. The remaining structure is similar to that of the voltage generation circuit 732b, and hence redundant description is omitted.

The voltage conversion circuit 770c includes a compare circuit 772c having a negative input node receiving the reference potential VrefL2 generated by the reference potential generation circuit 771b, an N-channel MOS transistor 774c having a gate receiving an output of the compare circuit 772c and a source connected to a ground node, and resistances 782c, 780c, 778c and 776c serially connected between a power supply node and a drain of the N-channel MOS transistor 774c.

A connection node between the resistances 782c and 780c outputs a converted potential Vr9. A connection node between the resistances 780c and 778c outputs a converted potential Vr10. A connection node between the resistances 778c and 776c outputs a converted potential Vr11. A connection node between the resistance 776c and the N-channel MOS transistor 774c outputs a converted potential Vr12. The converted potential Vr10 is supplied to a positive input node of the compare circuit 772c.

The voltage conversion circuit 770c further includes a selector 784c receiving the converted potentials Vr9 to Vr12 and outputting any one of the converted potentials Vr9 to Vr12 in response to a control signal LSEL. The output of the selector 784c is inputted in a positive input node of the differential amplifier V4.

By employing the aforementioned structure, the semiconductor device according to the embodiment 9 can externally change the potential levels of a sub power supply line and a sub ground line while monitoring leakage currents flowing in the leakage monitor transistors 750a and 750b shown in FIG. 37 in the standby state, thereby adjusting the potentials to optimum hierarchical power supply levels.

[Embodiment 10]

Figure 41:
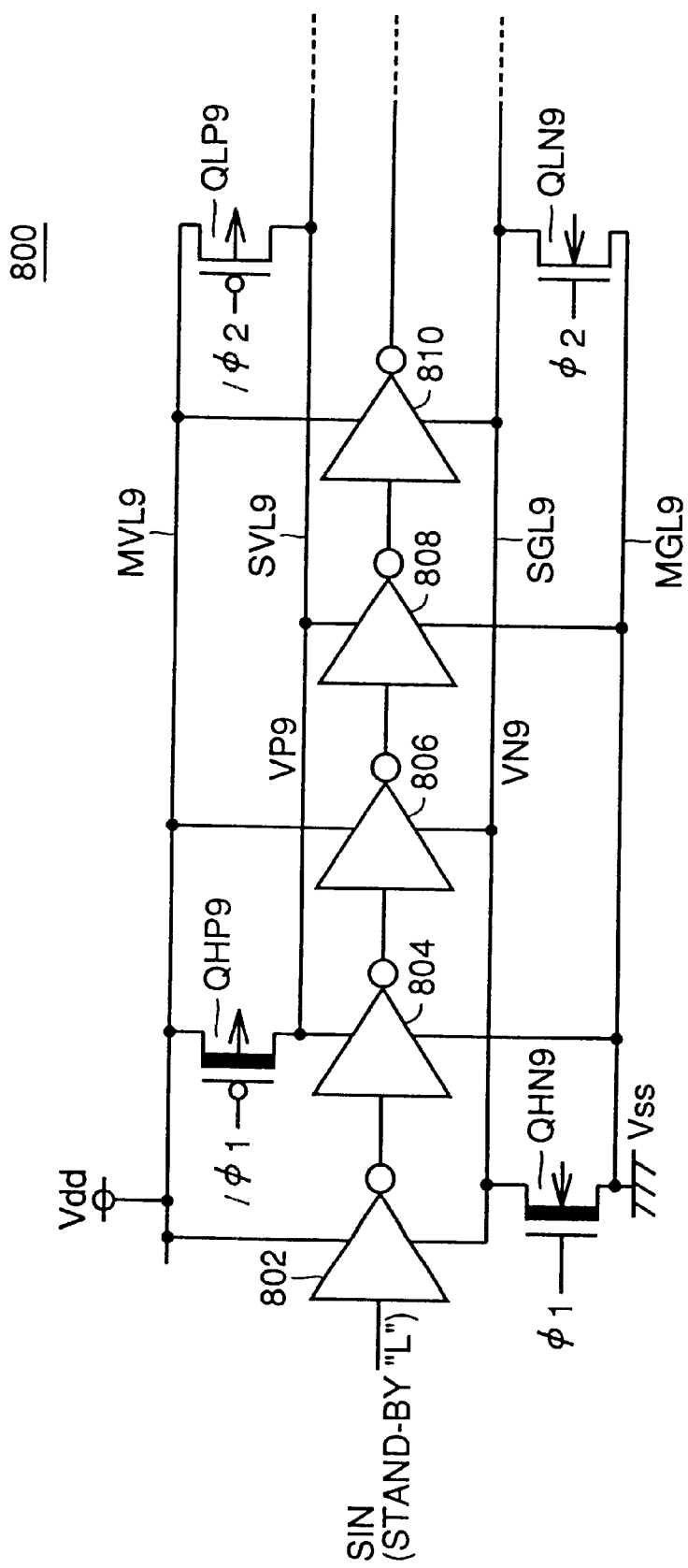
FIG. 41 is a circuit diagram showing the structure of a circuit block employed for a semiconductor device according to an embodiment 10.

FIG. 41 is a circuit diagram showing the structure of a circuit block 800 employed in a semiconductor device according to an embodiment 10 of the present invention.

Referring to FIG. 41, the circuit block 800 includes a main power supply line MVL9 supplied with a power supply potential Vdd, a main ground line MGL9 supplied with a ground potential Vss, an N-channel MOS transistor QHN9 having a gate receiving a control signal $\phi 1$ and a source connected to the main ground line MGL9, an N-channel MOS transistor QLN9 having a gate receiving a control signal $\phi 2$ and a source connected to the main ground line MGL9, a sub ground line SGL9 connected to drains of the N-channel MOS transistors QHN9 and QLN9, a P-channel MOS transistor QHP9 having a gate receiving a control signal $/\phi 1$ and a source connected to the main power supply line MVL9, a P-channel MOS transistor QLP9 having a gate receiving a control signal $/\phi 2$ and a source connected to the main power supply line MVL9, and a sub power supply line SVL9 connected to drains of the P-channel MOS transistors QHP9 and QLP9.

The P-channel MOS transistor QHP9 and the N-channel MOS transistor QHN9 have high threshold voltages.

The circuit block 800 further includes serially connected invertors 802, 804, 806, 808 and 810 receiving an input signal SIN.

The invertors 802, 806 and 810 are supplied with operating currents by the main power supply line MVL9 and the sub ground line SGL9. The invertors 804 and 808 are supplied with operating currents by the sub power supply line SVL9 and the main ground line MGL9.

MOS transistors included in the invertors 802 to 810 have low threshold voltages for attaining a high-speed operation, and the P-channel MOS transistor QLP9 and the N-channel MOS transistor QLN9 have low threshold voltages similarly to the transistors of the invertors 802 to 810.

Figure 42:
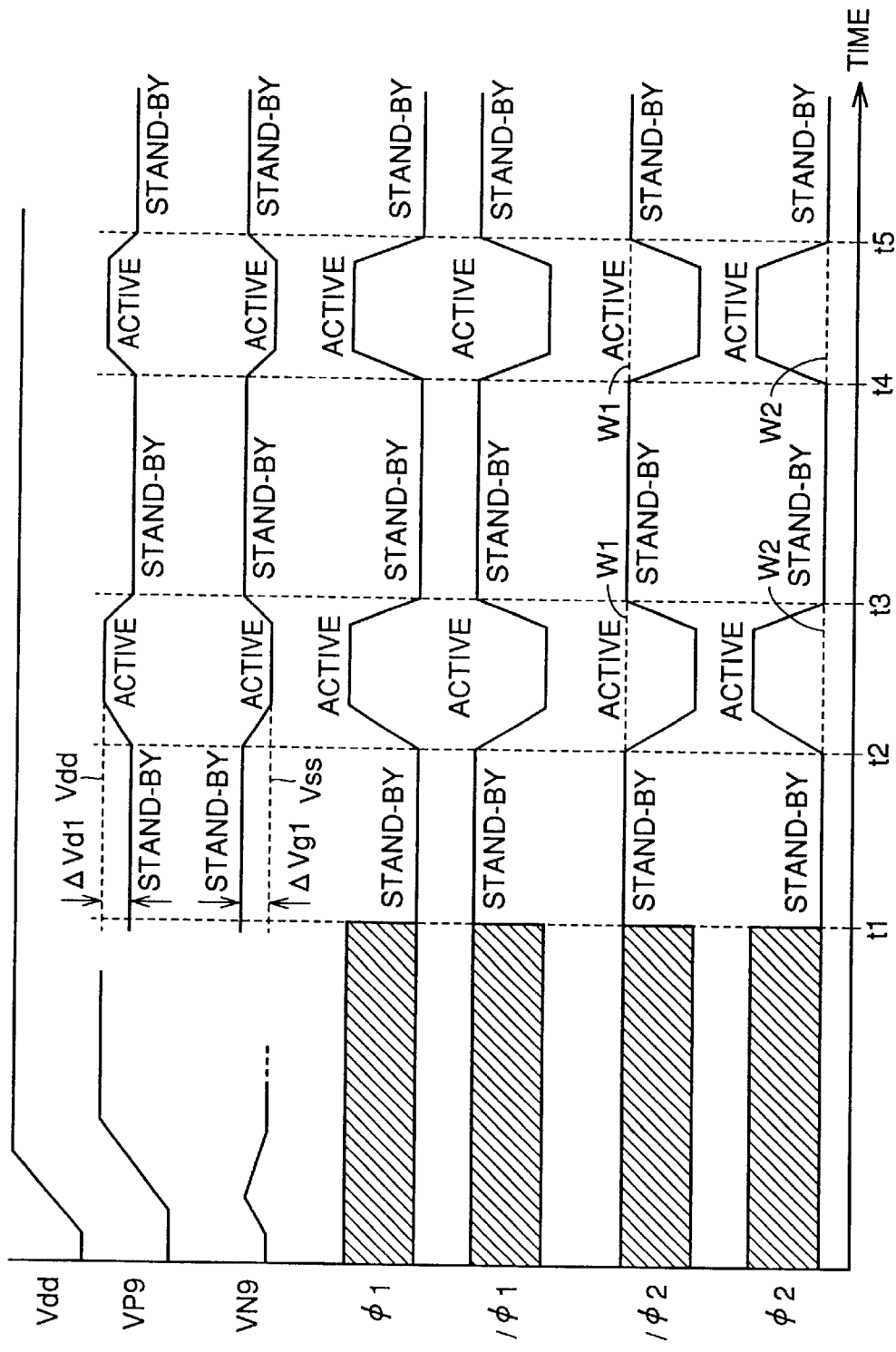
FIG. 42 is a waveform diagram for illustrating a driven state of each power supply line of a circuit block 800.

FIG. 42 is a waveform diagram for illustrating driven states of the respective power supply lines of the circuit block 800.

Referring to FIGS. 41 and 42, the power supply potential Vdd rises before a time t1. Between the time t1 and a time t2, the circuit block 800 enters a standby state, the signal SIN is set low, the control signal $\phi 1$ is set low, and the control signal $/\phi 2$ is set high. The control signal $/\phi 1$ is set high, and the control signal $\phi 2$ is set low. In the standby state, therefore, the P-channel MOS transistor QHP9 and the N-channel MOS transistor QHN9 are rendered non-conductive, and the P-channel MOS transistor QLP9 and the N-channel MOS transistor QLN9 are also rendered non-conductive.

The P-channel MOS transistor QHP9 and the N-channel MOS transistor QHN9 employed for supplying the operating currents for the invertors 802 to 810 have large gate widths. On the other hand, the P-channel MOS transistor QLP9 and the N-channel MOS transistor QLN9 for holding the potential levels of the sub power supply line SVL9 and the sub ground line SGL9 in the standby state respectively have small gate widths W with extremely high resistance values although subthreshold currents flow in non-conductive states.

Therefore, the potential VP9 of the sub power supply line SVL9 is lower than the power supply potential Vdd by $\Delta$Vd1 in the standby time, and this potential difference $\Delta$Vd1 is smaller than that in the case provided with no N-channel MOS transistor QLN9.

Similarly, the potential VN9 of the sub ground line SGL9 is higher than the ground potential Vss by $\Delta$Vd1 in the standby time, and this potential difference $\Delta$Vd1 can be rendered smaller than that in the case provided with no P-channel MOS transistor QLP9.

Therefore, the time required for activation can be reduced when the control signal $\phi 1$ goes high and the control signal $/\phi 1$ goes low for activating the sub power supply line SVL9 and the sub ground line SGL9. While the control signals $/\phi 2$ and $\phi 2$ are set low and high respectively and the P-channel MOS transistor QLP9 and the N-channel MOS transistor QLN9 are set in conductive states for activating the sub power supply line SVL9 and the sub ground line SGL9, the potentials of the sub power supply line SVL9 and the sub ground line SGL9 are equalized with each other also when fixing the control signals $/\phi 2$ and $\phi 2$ at high and low levels respectively, as shown in waveforms W1 and W2 in FIG. 42.

The circuit block 800 according to the embodiment 10 is provided with the P-channel MOS transistor QLP9 and the N-channel MOS transistor QLN9 for deciding the potentials of the sub power supply line SVL9 and the sub ground line SGL9 in the standby state in addition to the P-channel MOS transistor QHP9 and the N-channel MOS transistor QHN9 having large gate widths and high threshold voltages supplying power supply currents to the internal circuit in operation.

By employing the aforementioned structure, the semiconductor device according to the embodiment 10 can reduce a starting time for activating the circuit block 800 by approximating the potentials of the sub power supply line SVL9 and the sub ground line SGL9 to those of the main power supply line MVL9 and the main ground line MGL9 respectively in the standby state. Further, the gate widths of the transistors QLP9 and QLN9 for level holding are so reduced that no problem arises from leakage currents in the standby state resulting from provision of these transistors QLP9 and QLN9.

[Embodiment 11]

Figure 43:
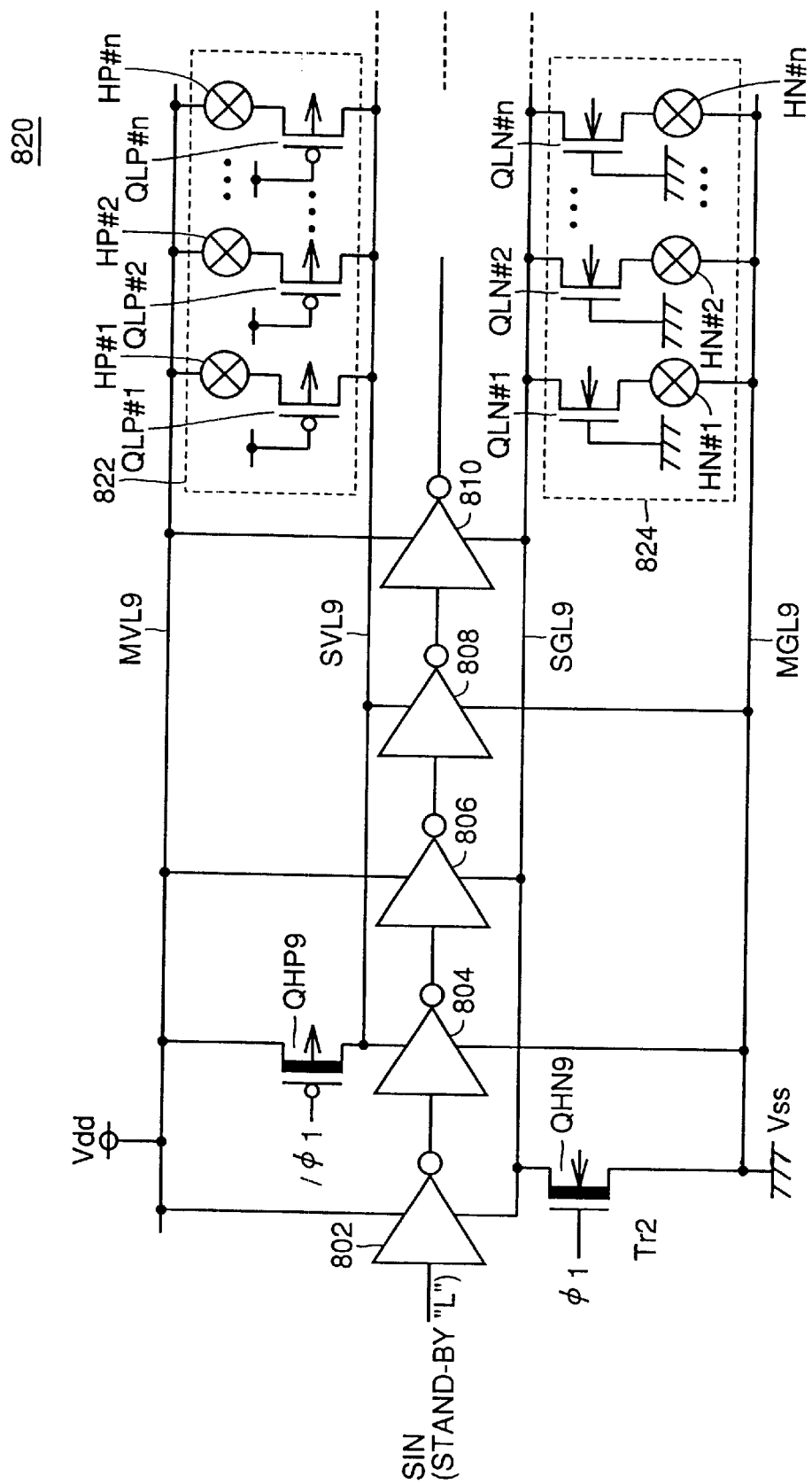
FIG. 43 is a circuit diagram showing the structure of a circuit block 820 employed in an embodiment 11.
Figure 44:
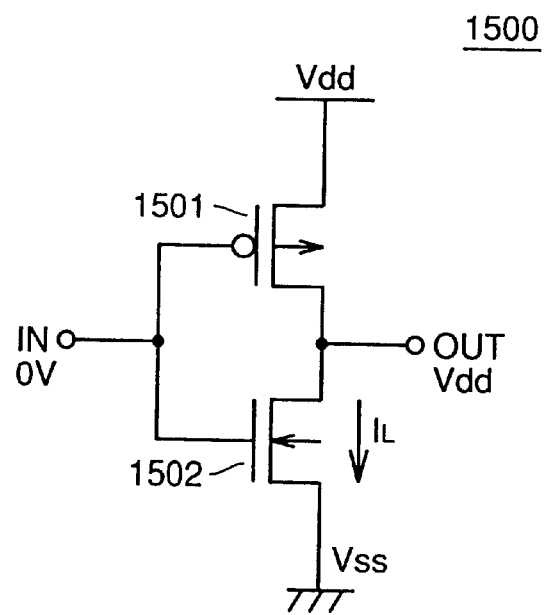
FIG. 44 is a circuit diagram showing the structure of an invertor 1500 in a conventional semiconductor device.
Figure 45:
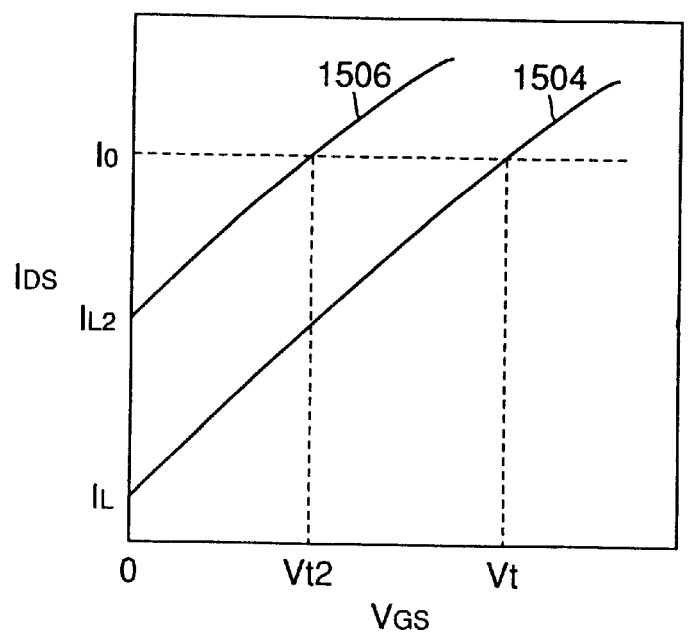
FIG. 45 illustrates the relation between gate-to-source voltages VGS and drain currents IDS of N-channel MOS transistors.
Figure 46:
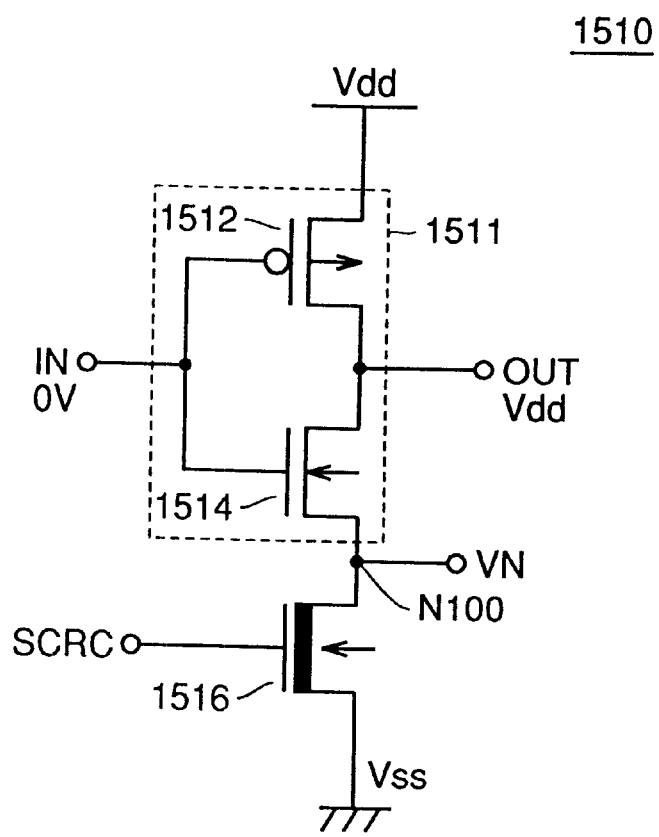
FIG. 46 is a circuit diagram showing a generally proposed invertor 1510 for reducing a subthreshold current by switching a source voltage.
Figure 47A:
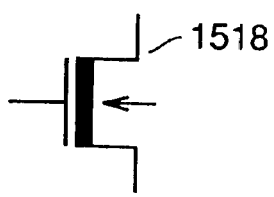
FIGS. 47A and 47B are diagrams for illustrating types of transistors, with FIG. 47A illustrating the symbol of a transistor having a high threshold voltage and FIG. 47B illustrating the symbol of a transistor having a low threshold voltage.
Figure 47B:
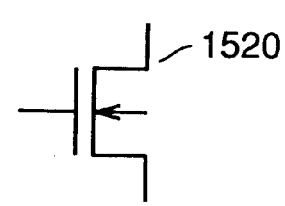
Figure 48:
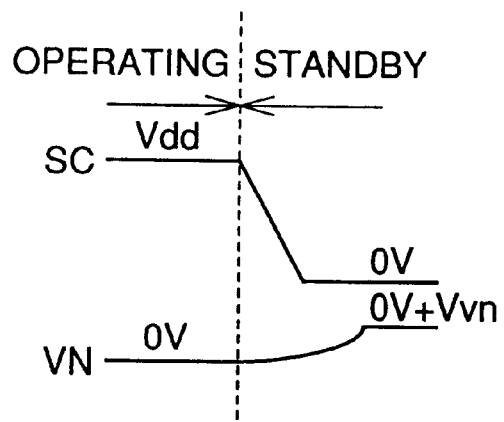
FIG. 48 is a waveform diagram for illustrating change of a sub ground potential VN of a node N100 around switching of a control signal SCRC.
Figure 49:
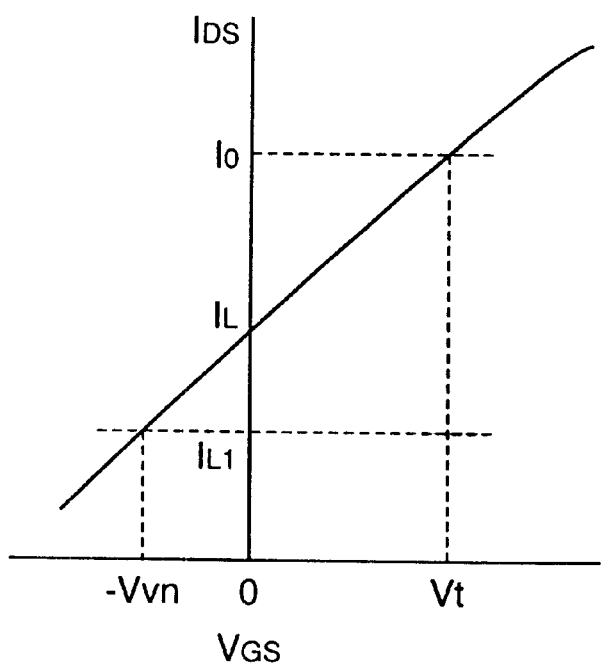
FIG. 49 is a graph for illustrating the relation between a drain current IDS flowing in an N-channel MOS transistor 1514 in a standby state and a gate-to-source voltage VGS.
Figure 50:
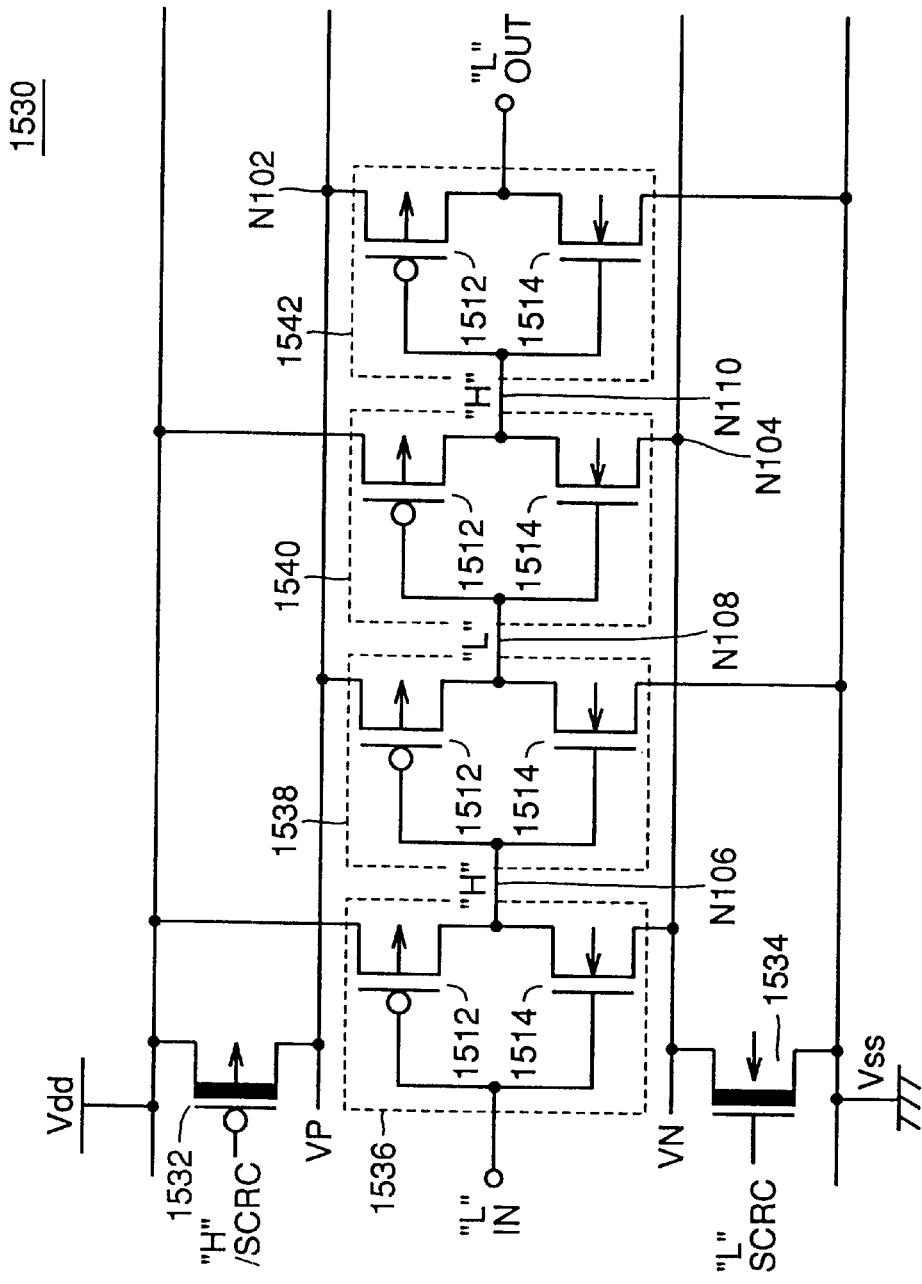
FIG. 50 is a circuit diagram for illustrating the structure of a circuit 1530 employing serially connected invertors of FIG. 46 and the state of each node in a standby state.
Figure 51:
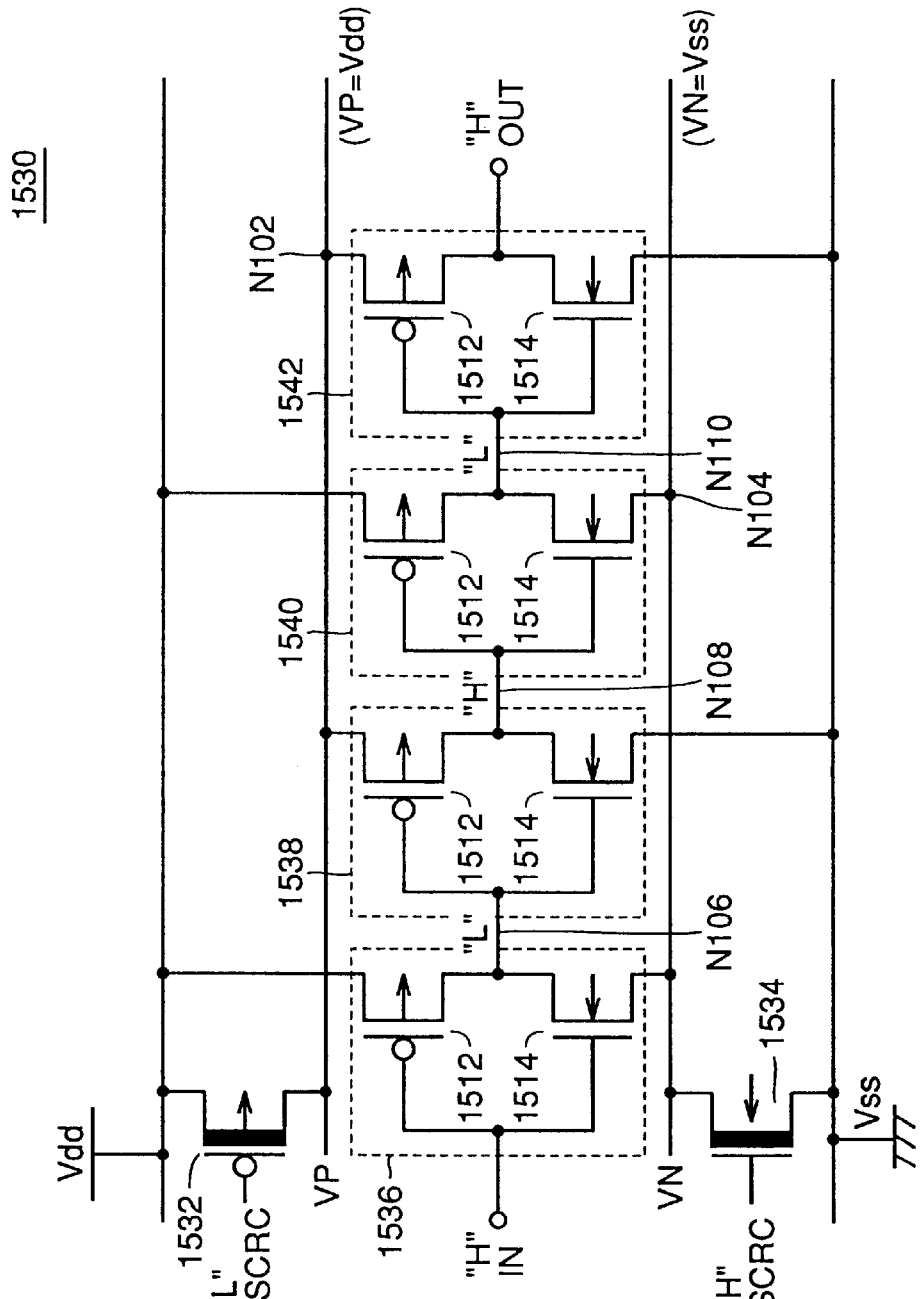
FIG. 51 is a circuit diagram for illustrating the state of each node in an ordinary operation of the circuit 1530.
Figure 52:
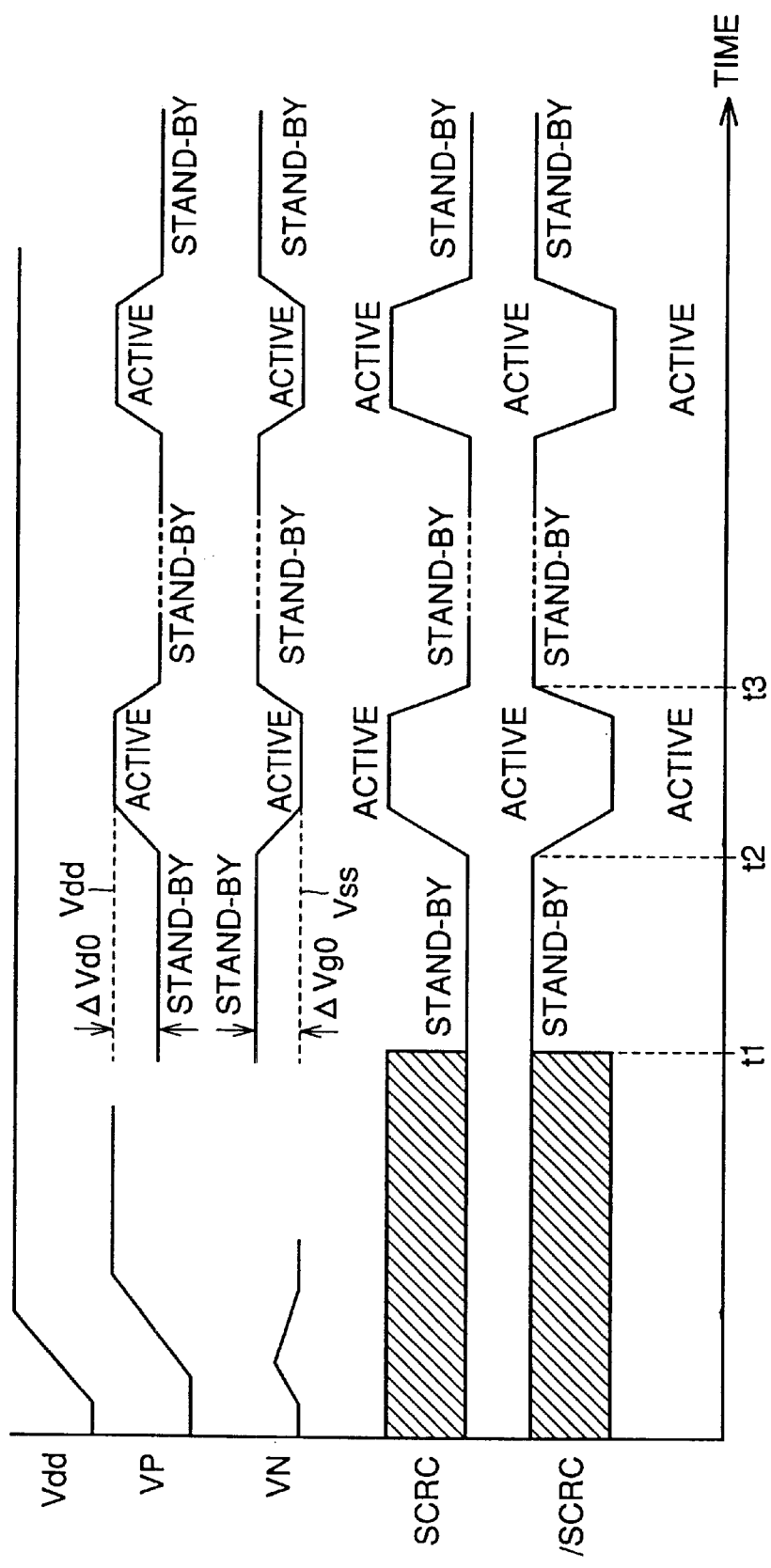
FIG. 52 is a waveform diagram for illustrating a potential VP of a sub power supply line and a potential VN of a sub ground line when the circuit 1530 illustrated in FIGS. 50 and 51 repeats a standby state and an operating state.

FIG. 43 is a circuit diagram showing the structure of a circuit block 820 employed in an embodiment 11 of the present invention.

Referring to FIG. 43, the circuit block 820 includes an adjusting circuit 822 connected between a main power supply line MVL9 and a sub power supply line SVL in place of the P-channel MOS transistor QLP9 and an adjusting circuit 824 connected between a sub ground line SGL9 and a main ground line MGL9 in place of the N-channel MOS transistor QLN9, dissimilarly to the circuit block 800 shown in FIG. 41. The remaining structure is similar to that of the circuit block 800, and hence redundant description is not repeated.

The adjusting circuit 822 includes fuse elements HP#i and P-channel MOS transistors QLP#i serially connected between the main power supply line MVL9 and the sub power supply line SVL9 (i: 1 to n). Gates of the P-channel MOS transistors QLP#i are supplied with a power supply potential Vdd.

The adjusting circuit 824 includes N-channel MOS transistors QLN#i and fuse elements HN#i serially connected between the sub ground line SGL9 and the main ground line MGL9 (i: 1 to n). Gates of the N-channel MOS transistors QLN#i are supplied with a ground potential respectively.

If the gate widths W of the P-channel MOS transistor QLP9 and the N-channel MOS transistor QLN9 for level holding provided in the embodiment 10 are too large, currents in the standby state are excessively increased. The gate widths W, i.e., the sizes of the transistors QLP9 and QLN9, which are remarkably influenced by dispersion of process parameters in fabrication steps, are hard to optimize in advance. In other words, there is a possibility that current consumption, i.e., leakage currents in the standby state or the time required for activating the sub power supply line SVL9 and the sub ground line SGL9 is remarkably influenced by dispersion of the process parameters in the fabrication steps.

In the embodiment 11, the adjusting circuits 822 and 824 are provided and the transistors QLP#i and QLN#i for level holding are connected in parallel through the fuse elements HP#i and HN#i respectively. The number of the transistors QLP#i and QLN#i for level holding can be adjusted by properly cutting the fuse elements HP#i and HN#i in the adjusting circuits 822 and 824. By employing this structure, the potential levels of the sub power supply line SVL9 and the sub ground line SGL9 can be adjusted to optimum values in the standby state. Therefore, a high-speed operation of an internal circuit having a hierarchical power supply structure and reduction of a standby current in a standby state can be attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
    a first main power supply line supplied with a first power supply potential;
    a second main power supply line supplied with a second power supply potential lower than said first power supply potential;
    a first sub power supply line provided in correspondence to said first main power supply line;
    a second sub power supply line provided in correspondence to said second main power supply line;
    a first internal circuit having first and second power supply nodes connected to said first and second sub power supply lines, respectively, for receiving at least one input signal and performing a prescribed operation;
    a first connection circuit connecting said first main power supply line and said first sub power supply line with each other in an operating mode and separating said first main power supply line and said first sub power supply line from each other in a standby mode;
    a second connection circuit connecting said second main power supply line and said second sub power supply line with each other in said operating mode and separating said second main power supply line and said second sub power supply line from each other in said standby mode;
    a power supply noise reduction circuit connected to said first and second main power supply lines and said first and second sub power supply lines, said power supply noise reduction circuit including:
        a first capacitor connected between said first main power supply line and said second sub power supply line, and
        a second capacitor connected between said first sub power supply line and said second main power supply line; and
    a first signal line transmitting a first control signal, wherein said first connection circuit includes:
        a first P-channel MOS transistor connected between said first main power supply line and said first sub power supply line with a gate receiving said first control signal of which a logical level is inverted in response to switching between said operating mode and said standby mode,
        a second P-channel MOS transistor having a source connected to said first main power supply line, and
        a first switching circuit selectively connecting a drain of said second P-channel MOS transistor to either one of said first main power supply line and said first sub power supply line, and a second switching circuit selectively connecting a gate of said second P-channel MOS transistor to either one of said second sub power supply line and said first signal line and said first signal line.

2. A semiconductor device comprising:
    a first main power supply line supplied with a first power supply potential;
    a second main power supply line supplied with a second power supply potential lower than said first power supply potential;
    a first sub power supply line provided in correspondence to said first main power supply line;
    a second sub power supply line provided in correspondence to said second main power supply line;
    a first internal circuit having first and second power supply nodes connected to said first and second sub power supply lines, respectively, for receiving at least one input signal and performing a prescribed operation;
    a first connection circuit connecting said first main power supply line and said first sub power supply line with each other in an operating mode and separating said first main power supply line and said first sub power supply line from each other in a standby mode;
    a second connection circuit connecting said second main power supply line and said second sub power supply line with each other in said operating mode and separating said second main power supply line and said second sub power supply line from each other in said standby mode;
    a power supply noise reduction circuit connected to said first and second main power supply lines and said first and second sub power supply lines, said power supply noise reduction circuit including:
        a first capacitor connected between said first main power supply line and said second sub power supply line, and
        a second capacitor connected between said first sub power supply line and said second main power supply line; and
    a first signal line transmitting a first control signal, wherein said first connection circuit includes:
        a first P-channel MOS transistor connected between said first main power supply line and said first sub power supply line with a gate receiving said first control signal of which a logical level is inverted in response to switching between said operating mode and said standby mode,
        a second P-channel MOS transistor having a drain connected to said first sub power supply line,
        a first switching circuit selectively connecting a source of said second P-channel MOS transistor to either one of said first main power supply line and said first sub power supply line, and
        a second switching circuit selectively connecting a gate of said second P-channel MOS transistor to either one of said second sub power supply line and said first signal line.

3. A semiconductor device comprising:
    a first main power supply line supplied with a first power supply potential;
    a second main power supply line supplied with a second power supply potential lower than said first power supply potential;

a first sub power supply line provided in correspondence to said first main power supply line;

a second sub power supply line provided in correspondence to said second main power supply line;

a first internal circuit having first and second power supply nodes connected to said first and second sub power supply lines, respectively, for receiving at least one input signal and performing a prescribed operation;

a first connection circuit connecting said first main power supply line and said first sub power supply line with each other in an operating mode and separating said first main power supply line and said first sub power supply line from each other in a standby mode;

a second connection circuit connecting said second main power supply line and said second sub power supply line with each other in said operating mode and separating said second main power supply line and said second sub power supply line from each other in said standby mode;

a power supply noise reduction circuit connected to said first and second main power supply lines and said first and second sub power supply lines, said power supply noise reduction circuit including:

a first capacitor connected between said first main power supply line and said second sub power supply line, and a second capacitor connected between said first sub power supply line and said second main power supply line; and a first signal line transmitting a first control signal, wherein said second connection circuit includes:

a first N-channel MOS transistor connected between said second main power supply line and said second sub power supply line with a gate receiving said first control signal of which a logical level is inverted in response to switching between said operating mode and said standby mode, a second N-channel MOS transistor having a source connected to said second main power supply line, a first switching circuit selectively connecting a drain of said second N-channel MOS transistor to either one of said second main power supply line and said second sub power supply line, and a second switching circuit selectively connecting a gate of said second N-channel MOS transistor to either one of said first sub power supply line and said first signal line.

4. A semiconductor device comprising:

a first main power supply line supplied with a first power supply potential;

a second main power supply line supplied with a second power supply potential lower than said first power supply potential;

a first sub power supply line provided in correspondence to said first main power supply line;

a second sub power supply line provided in correspondence to said second main power supply line;

a first internal circuit having first and second power supply nodes connected to said first and second sub power supply lines, respectively, for receiving at least one input signal and performing a prescribed operation;

a first connection circuit connecting said first main power supply line and said first sub power supply line with each other in an operating mode and separating said first main power supply line and said first sub power supply line from each other in a standby mode;

a second connection circuit connecting said second main power supply line and said second sub power supply line with each other in said operating mode and separating said second main power supply line and said second sub power supply line from each other in said standby mode;

a power supply noise reduction circuit connected to said first and second main power supply lines and said first and second sub power supply lines, said power supply noise reduction circuit including:

a first capacitor connected between said first main power supply line and said second sub power supply line, and a second capacitor connected between said first sub power supply line and said second main power supply line; and a first signal line transmitting a first control signal, wherein said second connection circuit includes:

a first N-channel MOS transistor connected between said second main power supply line and said second sub power supply line with a gate receiving said first control signal of which a logical level is inverted in response to switching between said operating mode and said standby mode, a second N-channel MOS transistor having a drain connected to said second sub power supply line, a first switching circuit selectively connecting a source of said second N-channel MOS transistor to either one of said second main power supply line and said second sub power supply line, and a second switching circuit selectively connecting a gate of said second N-channel MOS transistor to either one of said first sub power supply line and said first signal line.

5. A semiconductor device comprising:

a first main power supply line supplied with a first power supply potential;

a second main power supply line supplied with a second power supply potential lower than said first power supply potential;

a first sub power supply line provided in correspondence to said first main power supply line;

a second sub power supply line provided in correspondence to said second main power supply line;

a first internal circuit having first and second power supply nodes connected to said first and second sub power supply lines respectively for receiving at least one input signal and performing a prescribed operation;

a first connection circuit connecting said first main power supply line and said first sub power supply line with each other in an operating mode while separating said first main power supply line and said first sub power supply line from each other in a standby mode;

a second connection circuit connecting said second main power supply line and said second sub power supply line with each other in said operating mode while separating said second main power supply line and said second sub power supply line from each other in said standby mode; and a power supply noise reduction circuit connected to said first and second main power supply lines and said first and second sub power supply lines, said power supply noise reduction circuit including:

a first capacitor connected between said first main power supply line and said second sub power supply line, a second capacitor connected between said first sub power supply line and said second main power supply line, and a third capacitor connected between said first sub power supply line and said second sub power supply line; wherein said semiconductor device is formed on a major surface of a semiconductor substrate, said power supply noise reduction circuit is arranged in a rectangular area on said major surface, said first capacitor includes:
   a first MOS transistor having a gate connected to said second sub power supply line and a source and a drain connected to said first main power supply line, said second capacitor includes:
   a second MOS transistor having a gate connected to said second main power supply line and a source and a drain connected to said first sub power supply line, said third capacitor includes:
   a third MOS transistor having a gate connected to said second sub power supply line and a source and a drain connected to said first sub power supply line, said first main power supply line and said first sub power supply line are arranged along a first side of said rectangular area, and said second main power supply line and said second sub power supply line are arranged along a second side of said rectangular area opposed to said first side.

6. A semiconductor device having a normal mode and a test mode as an operating mode, comprising:

a main power supply line supplied with a power supply potential;

a sub power supply line provided in correspondence to said main power supply line;

an internal circuit connected to said sub power supply line for performing a prescribed operation in response to at least one input signal;

a connection circuit connecting said main power supply line and said sub power supply line with each other in response to an activation signal; and a control circuit generating said activation signal, said control circuit including
   a timing change circuit changing an activation timing of said activation signal according to said operating mode of said semiconductor device, wherein
   said timing change circuit includes
      a variable delay circuit receiving a reference signal generated from an external command signal and a clock signal and delaying the same by a delay quantity responsive to a test signal for generating said activation signal in said test mode.

7. A semiconductor device having a normal mode and a test mode as an operating mode, comprising:

a main power supply line supplied with a power supply potential;

a sub power supply line provided in correspondence to said main power supply line;

an internal circuit connected to said sub power supply line for performing a prescribed operation in response to at least one input signal;

a connection circuit connecting said main power supply line and said sub power supply line with each other in response to an activation signal; and a control circuit generating said activation signal, said control circuit including
   a timing change circuit changing an activation timing of said activation signal according to said operating mode of said semiconductor device, wherein
   said timing change circuit includes
      a selection circuit selecting any one of a plurality of reference signals generated from an external command signal and a clock signal in response to a test signal and outputting the same as said activation signal in said test mode.

8. A semiconductor device comprising:

a first main power supply line supplied with a first power supply potential;

a second main power supply line supplied with a second power supply potential lower than said first power supply potential;

a first sub power supply line provided in correspondence to said first main power supply line;

a second sub power supply line provided in correspondence to said second main power supply line;

a first internal circuit having first and second power supply nodes connected to said first and second sub power supply lines respectively, receiving at least one input signal and performing a prescribed operation;

a first control circuit connecting said first main power supply line and said first sub power supply line with each other in an operating mode while holding the potential difference between said first main power supply line and said first sub power supply line at a prescribed first value in a standby mode; and a second control circuit connecting said second main power supply line and said second sub power supply line with each other in said operating mode while holding the potential difference between said second main power supply line and said second sub power supply line at a prescribed second value in said standby mode; wherein said first internal circuit includes:
   a first N-channel MOS transistor employed for performing said prescribed operation and inactivated in said standby mode with a gate coupled to said second main power supply line and a source coupled to said second sub power supply line, said semiconductor device further comprising:
   a potential control circuit controlling the potential of said second sub power supply line with respect to that of said second main power supply line in said standby mode in response to a test signal, and
   a monitor circuit for monitoring a current corresponding to a leakage current resulting from a subthreshold current generated in said first N-channel MOS transistor in said standby mode in response to said test signal.

9. The semiconductor device according to claim 8, wherein
   said monitor circuit includes:
      a monitoring N-channel MOS transistor having a threshold voltage equal to that of said first N-channel MOS transistor with a gate connected to said second main power supply line,
      a switching circuit connecting a source of said monitoring N-channel MOS transistor to said second sub power supply line in response to said test signal,
      a current compare circuit having a first input node connected to a drain of said monitoring N-channel MOS transistor and comparing a current flowing into said first input node with a current flowing into a second input node,
a first test terminal connected to said second input node, and
a second test terminal receiving an output signal of said current compare circuit.

10. A semiconductor device comprising:
a first main power supply line supplied with a first power supply potential;
a second main power supply line supplied with a second power supply potential lower than said first power supply potential;
a first sub power supply line provided in correspondence to said first main power supply line;
a second sub power supply line provided in correspondence to said second main power supply line;
a first internal circuit having first and second power supply nodes connected to said first and second sub power supply lines respectively, receiving at least one input signal and performing a prescribed operation;
a first control circuit connecting said first main power supply line and said first sub power supply line with each other in an operating mode while holding the potential difference between said first main power supply line and said first sub power supply line at a prescribed first value in a standby mode; and
a second control circuit connecting said second main power supply line and said second sub power supply line with each other in said operating mode while holding the potential difference between said second main power supply line and said second sub power supply line at a prescribed second value in said standby mode; wherein
said first internal circuit includes:
a first P-channel MOS transistor having a gate coupled to said first main power supply line and a source coupled to said first sub power supply line,
a potential control circuit controlling the potential of said first sub power supply line with respect to that of said first main power supply line in said standby mode in response to a test signal, and
a monitor circuit for monitoring a current corresponding to a leakage current resulting from a subthreshold current generated in said first P-channel MOS transistor in said standby mode in response to said test signal.

11. The semiconductor device according to claim 10, wherein
said monitor circuit includes:
a monitoring P-channel MOS transistor having a threshold voltage equal to that of said first P-channel MOS transistor with a gate connected to said first main power supply line,
a switching circuit connecting a source of said monitoring P-channel MOS transistor to said first sub power supply line in response to said test signal,
a current compare circuit having a first input node connected with a drain of said monitoring P-channel MOS transistor and comparing a current flowing into said first input node with a current flowing into a second input node,
a first test terminal connected to said second input node, and
a second test terminal receiving an output signal of said current compare circuit.

12. A semiconductor device comprising:
a first main power supply line supplied with a first power supply potential;
a second main power supply line supplied with a second power supply potential lower than said first power supply potential;
a first sub power supply line provided in correspondence to said first main power supply line;
a second sub power supply line provided in correspondence to said second main power supply line;
a first internal circuit having first and second power supply nodes connected to said first and second sub power supply lines respectively, receiving at least one input signal and performing a prescribed operation;
a first control circuit connecting said first main power supply line and said first sub power supply line with each other in an operating mode while holding the potential difference between said first main power supply line and said first sub power supply line at a prescribed first value in a standby mode; and
a second control circuit connecting said second main power supply line and said second sub power supply line with each other in said operating mode while holding the potential difference between said second main power supply line and said second sub power supply line at a prescribed second value in said standby mode; wherein
said first control circuit includes:
a first P-channel MOS transistor connected between said first main power supply line and said first sub power supply line with a gate receiving a first control signal whose logical level is inverted in response to switching between said operating mode and said standby mode, and
a second P-channel MOS transistor connected between said first main power supply line and said first sub power supply line with a gate set at said first power supply potential at least in said standby mode, and having an absolute value of a threshold voltage and a gate width smaller than those of said first channel MOS transistor,
said second control circuit includes:
a first N-channel MOS transistor connected between said second main power supply line and said second sub power supply line with a gate receiving a second control signal whose logical level is inverted in response to switching between said operating mode and said standby mode, and
a second N-channel MOS transistor connected between said second main power supply line and said second sub power supply line with a gate set at said second power supply potential at least in said standby mode, and having an absolute value of a threshold voltage and a gate width smaller than those of said first N-channel MOS transistor.

13. A semiconductor device comprising:
a first main power supply line supplied with a first power supply potential;
a second main power supply line supplied with a second power supply potential lower than said first power supply potential;
a first sub power supply line provided in correspondence to said first main power supply line;
a second sub power supply line provided in correspondence to said second main power supply line;

a first internal circuit having first and second power supply nodes connected to said first and second sub power supply lines respectively, receiving at least one input signal and performing a prescribed operation;

a first control circuit connecting said first main power supply line and said first sub power supply line with each other in an operating mode while holding the potential difference between said first main power supply line and said first sub power supply line at a prescribed first value in a standby mode; and a second control circuit connecting said second main power supply line and said second sub power supply line with each other in said operating mode while holding the potential difference between said second main power supply line and said second sub power supply line at a prescribed second value in said standby mode; wherein said first control circuit includes:
- a first P-channel MOS transistor connected between said first main power supply line and said first sub power supply line with a gate receiving a first control signal whose logical level is inverted in response to switching between said operating mode and said standby mode, and
- a plurality of first level holding circuits connected in parallel between said first main power supply line and said first sub power supply line, each said first level holding circuit includes:
- a second P-channel MOS transistor having a gate set at said first power supply potential at least in said standby mode with an absolute value of a threshold voltage and a gate width smaller than those of said first P-channel MOS transistor and a first switching circuit serially connected between said first main power supply line and said first sub power supply line, said second control circuit includes:
- a first N-channel MOS transistor connected between said second main power supply line and said second sub power supply line with a gate receiving a second control signal whose logical level is inverted in response to switching between said operating mode and said standby mode, and
- a plurality of second level holding circuits connected in parallel between said second main power supply line and said second sub power supply line, each said second level holding circuit includes:
- a second N-channel MOS transistor having a gate set at said second power supply potential at least in said standby mode with an absolute value of a threshold voltage and a gate width smaller than those of said first N-channel MOS transistor and a second switching circuit serially connected between said second main power supply line and said second sub power supply line.

14. A semiconductor device comprising:

a main power supply line supplied with a first power supply potential;

a first sub power supply line provided in correspondence to said main power supply line;

a first internal circuit having a first power supply node connected to said first sub power supply line and performing a first prescribed operation;

a second sub power supply line provided in correspondence to said main power supply line;

a second internal circuit having a second power supply node connected to said second sub power supply line and performing a second prescribed operation;

a pad for observing the potentials of said first sub power supply line and said second sub power supply line; and a selection circuit selectively connecting either one of said first sub power supply line and said second sub power supply line to said pad.

15. The semiconductor device according to claim 1, wherein said second connection circuit includes
- a first N-channel MOS transistor connected between said second main power supply line and said second sub power supply line with a gate receiving a second control signal complementary to said first control signal.

16. The semiconductor device according to claim 2, wherein said second connection circuit includes
- a first N-channel MOS transistor connected between said second main power supply line and said second sub power supply line with a gate receiving a second control signal complementary to said first control signal.

17. The semiconductor device according to claim 3, wherein said first connection circuit includes
- a first P-channel MOS transistor connected between said first main power supply line and said first sub power supply line with a gate receiving a first control signal complementary to said first control signal.

18. The semiconductor device according to claim 4, wherein said first connection circuit includes
- a first P-channel MOS transistor connected between said first main power supply line and said first sub power supply line with a gate receiving a first control signal complementary to said first control signal.

* * * * *